US008778575B2

(12) United States Patent
Nakashima et al.

(10) Patent No.: US 8,778,575 B2
(45) Date of Patent: Jul. 15, 2014

(54) CURABLE COMPOSITION, COLOR FILTER USING THE SAME AND MANUFACTURING METHOD THEREFOR, AND SOLID IMAGE PICKUP ELEMENT

(75) Inventors: Taeko Nakashima, Kanagawa (JP); Yushi Kaneko, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 1067 days.

(21) Appl. No.: 11/972,042

(22) Filed: Jan. 10, 2008

(65) Prior Publication Data

US 2008/0171272 A1 Jul. 17, 2008

(30) Foreign Application Priority Data

Jan. 15, 2007 (JP) ................................. 2007-006296
Jul. 27, 2007 (JP) ................................. 2007-196579

(51) Int. Cl.
*G03F 1/00* (2012.01)

(52) U.S. Cl.
USPC .......................................... 430/7; 430/270.1

(58) Field of Classification Search
USPC ............................. 430/7, 270.1; 522/96, 149
See application file for complete search history.

(56) References Cited

U.S. PATENT DOCUMENTS

| 2004/0192804 | A1* | 9/2004 | Kura et al. ................... 522/65 |
| 2005/0187310 | A1* | 8/2005 | Jansen et al. ................. 522/96 |
| 2007/0249748 | A1 | 10/2007 | Kura et al. |
| 2007/0259278 | A1 | 11/2007 | Kura et al. |

FOREIGN PATENT DOCUMENTS

| CN | 1532566 A | 9/2004 |
| CN | 1547683 A | 11/2004 |
| JP | 02127602 A | 5/1990 |
| JP | 04-194943 A | 7/1992 |
| JP | 08-297366 A | 11/1996 |
| JP | 10-268515 A | 10/1998 |
| JP | 63-304244 A | 12/1998 |
| JP | 2000321763 A | 11/2000 |
| JP | 2002-323762 A | 11/2002 |
| JP | 2003029018 A | 1/2003 |
| JP | 2003-122002 A | 4/2003 |
| JP | 2003-255532 A | 9/2003 |
| JP | 2004-536352 A | 2/2004 |
| JP | 2004-317659 A | 11/2004 |
| JP | 2006030541 A | 2/2006 |
| JP | 2006-084873 A | 3/2006 |
| JP | 2006-313348 A | 11/2006 |
| JP | 2006-317924 A | 11/2006 |
| JP | 2006-525407 A | 11/2006 |
| JP | 2007-246586 A | 9/2007 |
| JP | 2007-249113 A | 9/2007 |

OTHER PUBLICATIONS

Japanese Office Action dated Nov. 22, 2011, corresponding to JP Application No. 2007-196579.
Office Action dated Jul. 26, 2011 on CN 2008 10003118.4.
Office Action dated Mar. 11, 2013 in Taiwanese Application No. 1022073640.
Office Action dated Aug. 28, 2012 in Japanese Application No. 2007-196579.
Office Action dated Aug. 20, 2013 in Taiwanese Application No. 097101296.
Office Action dated Oct. 31, 2013 in Korean Application No. 10-2008-0003874.
Office Action dated Mar. 19, 2014 in Korean Patent Application 10-2008-0003874.

* cited by examiner

*Primary Examiner* — Stewart Fraser
(74) *Attorney, Agent, or Firm* — Sughrue Mion, PLLC

(57) ABSTRACT

The present invention provides a curable composition containing a resin, a compound containing an ethylenically unsaturated double bond and a photopolymerization initiator, wherein the resin is manufactured by polymerizing at least a monomer having a dipole moment of 2.0 or more as a copolymerization component, a color filter using the same and a manufacturing method therefor, and a solid image pickup element.

14 Claims, No Drawings

CURABLE COMPOSITION, COLOR FILTER USING THE SAME AND MANUFACTURING METHOD THEREFOR, AND SOLID IMAGE PICKUP ELEMENT

CROSS-REFERENCE TO RELATED APPLICATIONS

This application claims priority under 35 USC 119 from Japanese Patent Application Nos. 2007-006296 and 2007-196579, the disclosures of which are incorporated by reference herein.

BACKGROUND OF THE INVENTION

1. Field of the Invention

The present invention relates to a curable composition suitable for producing a color filter to be used for a liquid crystal display element (LCD), a solid image pickup element (such as CCD and CMOS), or the like, a color filter formed with the curable composition, and a manufacturing method therefor.

2. Description of the Related Art

The color filter is an essential constituent part for a liquid crystal display or a solid image pickup element.

Since the liquid crystal display is compact and having the equivalent or superior performance compared with the CRT commonly used as a display apparatus, it is replacing the CRT as the television screen, the personal computer screen, and the other display apparatus. Moreover, recently, as to the trend of the development of the liquid crystal display, it is changing from the conventional monitor application having a screen of a relatively small area to the television application having a large screen and a higher image quality. As to the color filter for the liquid crystal display (LCD), the substrate size is made larger for the production of the large scale television sets. The curable composition for the application of the color filter production using such a large substrate, curability with low energy is required for the improvement of the productivity.

Moreover, compared with those for the monitor application, a higher image quality is required to the liquid crystal display for the television application, that is, improvement of the contrast and the color purity.

For the curable composition for the application of the color filter production, for the purpose of improvement of the contrast, a coloring agent (organic pigment, or the like) to be used of a finer particle size is required (see for example, Japanese Patent Application Laid Open (JP-A) No. 2006-30541).

However, if the pigment absorbing property of the dispersing agent is improved for the purpose of improvement of the dispersion stability at the time of containing a pigment with a small particle size in the curable composition, due to cross-linking in the pigment by the dispersing agent, the pigment aggregation is promoted so that the storage stability such as the dispersion stability is lowered or the developability at the time of forming a pattern using the curable composition tends to be lowered.

Moreover, in the case of using a finer pigment, since the surface area thereof is increased, use of the finer pigment tends to increase the addition amount of the dispersing agent for dispersing the pigment in the curable composition.

Furthermore, if the acid value of the resin to be added at the time of dispersion is improved for ensuring the developability, aggregation of the pigment tends to be promoted by the interaction between the acidic groups such as the hydrogen bond.

If the developability is to be obtained by adding a resin to the curable composition after dispersing the pigment, a large amount of the resin should be added. Moreover, for the purpose of the improvement of the color purity, a higher content ratio of the coloring agent (organic pigment) in the solid component is required in the curable composition used for producing a color filter. However, when the coloring agent is contained in the curable composition at a high concentration, the content ratio of the photopolymerization initiator and the photo polymerizable monomer in the curable composition is reduced, and although the curable composition therefore needs to be curable at low energy, the difficulty of achieving curability in an exposed portion is problematic. On the other hand, as to the curable composition for the application of the production of the color filter for the solid image pickup element, curability with a low energy is called for. Moreover, as to the color filter for the application of the solid image pickup element, development of a thinner film of the colored pattern is promoted, and accompanied thereby, increasing the pigment concentration in the composition.

Furthermore, in the pigment based color filter, accompanied by the trend toward a finer pigment for reducing the color irregularity derived from the fact that the pigment is a relatively coarse particle, the content ratio of the pigment dispersing agent in the curable composition tends to be increased. Similar to the case of the curable composition for the purpose of the production of the LCD, the increase of the content ratio of the pigment dispersing agent in the curable composition tends to lower the storage stability such as the dispersion stability, tends to lower the developability at the time of forming a pattern using the curable composition, and hardly obtains the curability, and thus it is problematic.

Moreover, for coping with the problems such as the color irregularity in the formed colored pattern, a technique of using an organic solvent soluble dye as the coloring agent instead of the pigment has been proposed (see for example, JP-A No. 2-127602). However, as to the dye based color filter, accompanied by the increase of the dye concentration, problems of the storage stability decline such as the polymerization inhibiting effect derived from the dye, and precipitation of the dye have been remarkable.

As mentioned above, according to the curable composition for the application of the color filter production, either in the case of those for the liquid crystal display or in the case of those for the solid image pickup element, since the content amount of the photopolymerization initiator and the photo polymerizable monomer as the essential component for curing the curable composition is limited and furthermore, the coloring agent concentration is high, various problems arises in that the sufficient curability is not obtained due to the low sensitivity, the adhesion to the substrate is insufficient, the developing rate is lowered or the residue is generated in the unexposed part, a desired pattern may be formed extremely hardly, the dispersion stability and the developability are poor in the case the coloring agent is a pigment, the storage stability is low such as the precipitation of the dye in the case the coloring agent is a dye, or the like.

In order to cope with these problems, improvement of the sensitivity has been discussed by providing the polymerizable property to a resin introduced conventionally for providing mainly the film forming property, the developability, or the like (see for example, JP-A Nos. 2000-321763 and 2003-029018). Additionally, the technique is presented in columns 85 to 87 of "Color Filter Latest Technique Trend" (published by Johokiko Co., Ltd.), columns 129 to 150 of "Process Technique and Chemicals for Latest Color Filter" (published by CMC Publishing Co., Ltd.), or the like. However, even in the case of using these resins, satisfactory exposure sensitivity has not been obtained so far. Furthermore, due to the insufficient exposure sensitivity, curing is insufficient in the deep portions in the vicinity of the substrate interface, or the like so that a problem of the poor substrate adhesion property, or the like has also been involved.

An object of the invention is to provide a curable composition to be cured with an extremely high sensitivity, having preferable storage stability.

Moreover, another object of the invention is to provide a color filter formed using the above-mentioned curable composition, having a high sensitivity, little development residue in the uncured portion, the excellent adhesion property of the cured portion with respect to the substrate, and a colored pattern with a high resolution and a desired cross-sectional shape.

Furthermore, still another object of the invention is to provide a manufacturing method for the above-mentioned color filter with the excellent productivity, and a solid image pickup element having the above-mentioned color filter manufactured by the manufacturing method.

According to their elaborate study in view of the above-mentioned circumstances, the inventors have been found out that the above-mentioned problems may be solved so as to complete the invention.

SUMMARY OF THE INVENTION

The present invention has been made in view of the above circumstances and provides a curable composition, a color filter using the same and a manufacturing method therefor, and a solid image pickup element.

A first aspect of the invention provides

<1> a curable composition containing a resin, a compound containing an ethylenically unsaturated double bond and a photopolymerization initiator, wherein the resin is manufactured by polymerizing at least a monomer having a dipole moment of 2.0 or more as a copolymerization component.

A second aspect of the invention provides

<2> a color filter having a colored pattern formed with the curable composition of the first aspect further containing a coloring agent or a sensitizing agent.

A third aspect of the invention provides

<3> a manufacturing method for a color filter comprising: forming a colored layer made of the curable composition by applying the curable composition of the first aspect further containing a coloring agent on a support; exposing the colored layer via a mask, and forming a colored pattern by developing the colored layer after the exposing.

A fourth aspect of the invention provides

<4> a solid image pickup element including a color filter manufactured by the manufacturing method for a color filter according to the third aspect.

DETAILED DESCRIPTION OF THE INVENTION

According to the invention, even in the case of containing a coloring agent with a high concentration, a curable composition having a preferable storage stability such as the dispersion stability, to be cured with a high sensitivity by exposure, having a high adhesion property with respect to the substrate surface in the curing area, and capable of forming a pattern with the excellent removing property of the uncured portion in the uncured area may be provided.

Furthermore, according to the invention, a color filter having a colored pattern with the excellent resolution and adhesion property with respect to a support, formed using a curable composition of the invention, and a manufacturing method for forming the color filter with the high productivity may be provided.

Hereafter, a curable composition of the invention contains a resin, a compound containing an ethylenically unsaturated double bond and a photopolymerization initiator, wherein the resin is one manufactured by polymerizing at least a monomer of 2.0 or more dipole moment as the copolymerization component.

Moreover, it is preferable that the resin has an ethylenically unsaturated double bond in the side chain.

Furthermore, it is preferable that the curable compound of the invention further contains a coloring agent.

Hereafter, each component to be contained in the curable composition of the invention will be explained successively.

<Resin (A)>

A resin of the invention is a resin manufactured by polymerizing at least a monomer of 2.0 or more dipole moment as the copolymerization component. It is preferable that the resin of the invention has an ethylenically unsaturated double bond in the side chain.

It is preferable that the above-mentioned resin is a polymer compound having a group represented by the following formulae (1) to (3) in the side chain as the above-mentioned ethylenically unsaturated double bond.

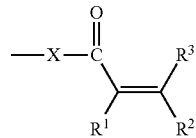

Formula (1)

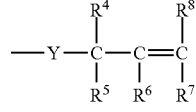

Formula (2)

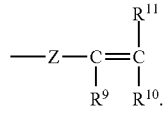

Formula (3)

In the formulae, $R^1$ to $R^{11}$ each independently represent a hydrogen atom or a monovaleic organic group. X, Y each independently represent an oxygen atom, a sulfur atom or —N—$R^{12}$, and Z represents an oxygen atom, a sulfur atom, —N—$R^{12}$ or a phenylene group. $R^{12}$ represents a hydrogen atom, or a monovaleic organic group.

In the above-mentioned formula (1), $R^1$ to $R^3$ each independently represents a monovaleic organic group. As $R^1$, a hydrogen atom or an alkyl group, which may have a substituent, an alkoxyl group, an alkoxy carbonyl group, or the like may be presented. In particular, a hydrogen atom, a methyl group, a methyl alkoxy group, and a methyl ester group are preferable. Moreover, $R^2$, $R^3$ each independently represent a hydrogen atom, a halogen atom, an amino group, a dialkyl amino group, a carboxyl group, an alkoxy carbonyl group, a sulfo group, a nitro group, a cyano group, an alkyl group, which may have a substituent, an aryl group, which may have a substituent, an alkoxy group, which may have a substituent, an aryloxy group, which may have a substituent, an alkyl amino group, which may have a substituent, an aryl amino group, which may have a substituent, an alkyl sulfonyl group, which may have a substituent, an aryl sulfonyl group, which may have a substituent, or the like may be presented. In particular, a hydrogen atom, a carboxyl group, an alkoxy carbonyl group, an alkyl group, which may have a substituent, and an aryl group, which may have a substituent are preferable.

Here, as the substituent to be introduced, a methoxy carbonyl group, an ethoxy carbonyl group, an isopropioxy carbonyl group, a methyl group, en ethyl group, a phenyl group, or the like may be presented.

X represents an oxygen atom, a sulfur atom, or —N—$R^{12}$. Here, as $R^{12}$, an alkyl group, which may have a substituent, or the like may be presented.

In the formula (1), as the alkyl group, a linear or cyclic alkyl group having 1 to 30 carbons may be presented. An alkyl group having 1 to 20 carbon atom is preferable, and an alkyl group having 1 to 10 carbon atoms is particularly preferable.

In the formula (1), as the aryl group, one having 6 to 30 carbon atoms may be presented. One having 6 to 20 carbon atoms is preferable, and one having 6 to 10 carbon atoms is particularly preferable.

In the above-mentioned formula (2), $R^4$ to $R^8$ each independently represents a monovaleic organic group. As $R^4$ to $R^8$, for example, a hydrogen atom, a halogen atom, an amino group, a dialkyl amino group, a carboxyl group, an alkoxy carbonyl group, a sulfo group, a nitro group, a cyano group, an alkyl group, which may have a substituent, an aryl group, which may have a substituent, an alkoxy group, which may have a substituent, an aryloxy group, which may have a substituent, an alkyl amino group, which may have a substituent, an aryl amino group, which may have a substituent, an alkyl sulfonyl group, which may have a substituent, an aryl sulfonyl group, which may have a substituent, or the like may be presented. In particular, a hydrogen atom, a carboxyl group, an alkoxy carbonyl group, an alkyl group, which may have a substituent, and an aryl group, which may have a substituent are preferable. As the substituent to be introduced, those presented for the formula (1) may be presented. Y represents an oxygen atom, a sulfur atom, or —N—$R^{12}$. As $R^{12}$, those presented for the formula (1) may be presented. In the formula (2), as the alkyl group and the aryl group, those presented for the formula (1) may be presented, and the same preferable examples may also be applied.

In the above-mentioned formula (3), $R^9$ to $R^{11}$ each independently represents a monovaleic organic group. As the organic group, specifically, for example, a hydrogen atom, a halogen atom, an amino group, a dialkyl amino group, a carboxyl group, an alkoxy carbonyl group, a sulfo group, a nitro group, a cyano group, an alkyl group, which may have a substituent, an aryl group, which may have a substituent, an alkoxy group, which may have a substituent, an aryloxy group, which may have a substituent, an alkyl amino group, which may have a substituent, an aryl amino group, which may have a substituent, an alkyl sulfonyl group, which may have a substituent, an aryl sulfonyl group, which may have a substituent, or the like may be presented. In particular, a hydrogen atom, a carboxyl group, an alkoxy carbonyl group, an alkyl group, which may have a substituent, and an aryl group, which may have a substituent are preferable.

As the substituent to be introduced, those presented for the formula (1) may be presented in the same manner.

Z represents an oxygen atom, a sulfur atom, —N—$R^{12}$, or a phenylene group. As $R^{12}$, those presented for the formula (1) may be presented.

In the formula (3), as the alkyl group and the aryl group, those presented for the formula (1) may be presented, and the same preferable examples may also be applied. Among the resins in the invention, a polymer compound having a group represented by the formula (1) may be manufactured by at least one of the following synthesizing methods 1), 2).

Synthesizing Method 1)

A method of obtaining a desired polymer compound by synthesizing a polymer compound by copolymerizing one or more kinds of the radically polymerizable compounds represented by the following formula (12) and a specific monomer to be described later, and taking out a proton using a base for leaving Z.

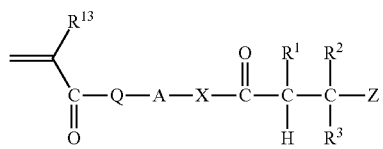

Formula (12)

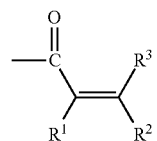

Formula (13)

In the formula (12), $R^1$ to $R^3$ and X are same as those in the formula (1), and the same preferable examples may also be applied.

In the formula (12), Z represents an anionically leaving group. Q represents an oxygen atom, —NH— or —$NR^{14}$— (here, $R^{14}$ represents an alkyl group, which may have a substituent). As $R^{13}$, a hydrogen atom, an alkyl group, which may have a substituent, or the like may be presented. In particular, a hydrogen atom, a methyl group, a methyl alkoxy group and a methyl ester group are preferable. A represents a divaleic organic linking group. As the divaleic organic linking group as A is not particularly limited, and an alkylene group having 1 to 30 total carbons (for example, methylene, ethylene, cyclohexylene), and an arylene group having 6 to 30 total carbons (for example, phenylene, trilene, naphthalylene) may be presented. In particular, an alkylene having 1 to 10 total carbons and an arylene group having 6 to 15 total carbons are preferable.

In the formula (13), $R^1$ to $R^3$ are same as those in the formula (1), and the same preferable examples may also be applied.

Synthesis method 2)

A method of obtaining a desired polymer compound by synthesizing a stem polymer compound (polymer compound comprising the principal chain) by copolymerizing one or more kinds of the radically polymerizable compounds having a functional group and a specific monomer to be described later, and reacting the side chain functional group of the above-mentioned stem polymer compound and a compound having the structure represented by the formula (13).

As the radically polymerizable compound represented by the formula (12), the following compounds may be presented as examples, however, it is not limited thereto.

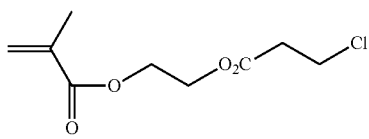

(M-1)

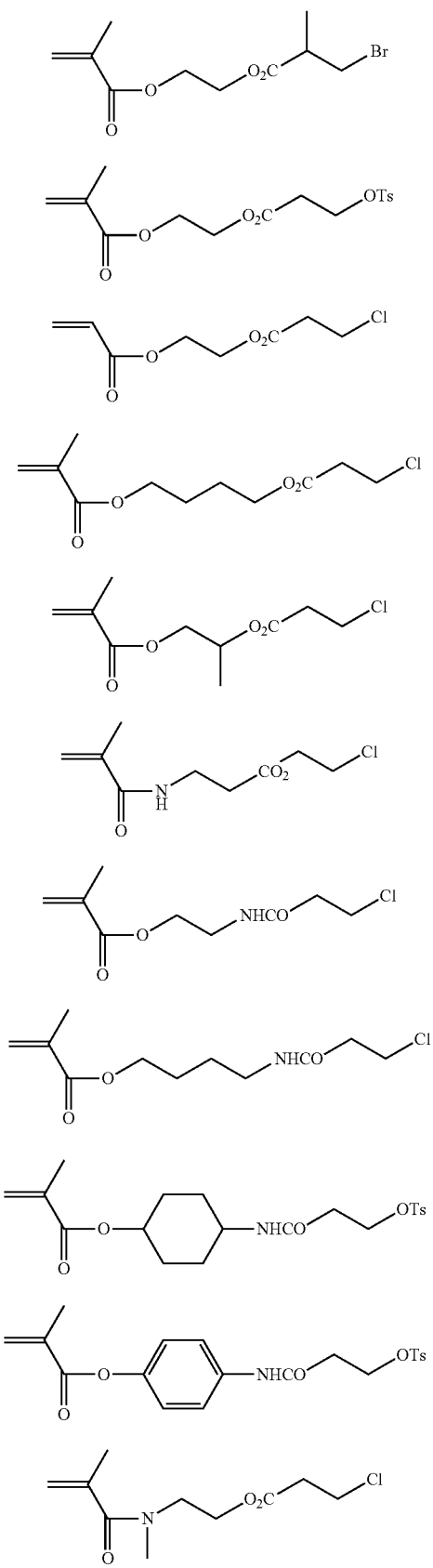

The radically polymerizable compounds represented by the formula (12) are easily accessible as a commercially available product or by the synthesizing method shown in the synthesis examples to be described later.

The group represented by the formula (1) may be introduced by polymerizing one or more kinds of these radically polymerizable compounds and a specific monomer to be described later, and if necessary another radically polymerizable compound by an ordinary radical polymerization method for synthesizing a polymer compound, dropping a desired amount of a base into the polymer solution under the cooing or heating condition for carrying out the reaction, and if necessary carrying out a neutralizing process with an acid. For the production of the polymer compound, a commonly known suspension polymerization method or solution polymerization method, or the like may be employed.

As the base, either an inorganic compound or an organic compound may be used. As a preferable inorganic base, sodium hydroxide, potassium hydroxide, sodium carbonate, sodium hydrogen carbonate, potassium carbonate, potassium hydrogen carbonate, or the like may be presented. As an organic base, metal alkoxides such as a sodium methoxide, sodium ethoxide, and potassium t-butoxide, organic amine compounds such as triethyl amine, pyridine, and diisopropyl ethyl amine, or the like may be presented.

In the synthesizing method 2), as an example of the functional group of the radically polymerizable compound having a functional group to be used for the synthesis of the stem polymer compound, a hydroxy group, a carboxyl group, a halide carboxylate group, carboxylic anhydride group, an amino group, an alkyl halide group, an isocyanate group, an epoxy group, or the like may be presented. As a radically polymerizable compound having such a functional group, 2-hydroxyl ethyl acrylate, 2-hydroxyl ethyl methacrylate, 4-hydroxy butyl acrylate, 4-hydroxy butyl methacrylate, acrylic acid, methacrylic acid, chloride acrylate, chloride methacrylate, methacrylic anhydride, N,N-dimethyl-2-amino ethyl methacrylate, 2-chloroethyl methacrylate, 2-ethyl isocyanate methacrylate, glydicyl acrylate, glycidyl methacrylate, or the like may be presented.

A desired polymer compound may be obtained by polymerizing one or more kinds of these radically polymerizable compounds and a specific monomer to be described later, and if necessary copolymerizing with another radically polymerizable compound for synthesizing a stem polymer compound, and reacting with a compound having the group represented by the formula (13).

Here, as an example of the compound having a group represented by the formula (13), the compounds presented as the examples of the above-mentioned radically polymerizable compounds having a functional group may be presented.

The above-mentioned polymer compounds having a group represented by the formula (2) in the invention may be manufactured by at least one of the synthesizing methods 3) and 4) shown below.

Synthesizing method 3)

A method of obtaining a polymer compound by polymerizing one or more kinds of the radically polymerizable compounds having an unsaturated group represented by the formula (2), and an ethylenically unsaturated group having a high addition polymerizing property than that of the unsaturated group, a specific monomer to be described later, and if necessary another radically polymerizable compound. This method utilizes a compound having a plurality of ethylenically unsaturated groups having different addition polymerization properties in a molecule, such as allyl methacrylate.

Synthesizing method 4)

A method of introducing a group represented by the formula (2) by copolymerizing one or more kinds of the radically polymerizable compounds having a functional group and a specific monomer to be described later for synthesizing a polymer compound, and reacting a side chain functional group and a compound having the structure represented by the following formula (14).

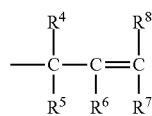

Formula (14)

In the formula (14), $R^4$ to $R^8$ are same as those in the formula (2), and the same preferable examples are also applied.

As a radically polymerizable compound having an unsaturated group represented by the formula (2), and an ethylenically unsaturated group having a high addition polymerizing property than that of the unsaturated group, allyl acrylate, allyl methacrylate, 2-allyloxy ethyl acrylate, 2-alloyloxy ethyl methacrylate, propargyl acrylate, propargyl methacrylate, allyl acrylate, allyl methacrylate, diallyl acrylate, diallyl methacrylate, N-allyl acrylic amide, N-allyl methacrylic amide, or the like may be presented as examples.

Moreover, as the examples of the polymer compound to be obtained by polymerizing one or more kinds of the radically polymerizable compounds having a functional group, the examples shown in the above-mentioned synthesizing method 2) may be presented. Examples of the compound having the structure represented by formula (14) include allyl alcohol, allyl amine, diallyl amine, 2-allyloxy ethyl alcohol, 2-chloro-1-butene and allyl isocyanate.

The above-mentioned polymer compound having a group represented by the formula (3) according to the invention may be manufactured by at least one of the synthesizing methods 5) and 6) shown below.

Synthesizing method 5)

A method of obtaining a polymer compound by copolymerizing one or more kinds of the radically polymerizable compounds having an unsaturated group represented by the formula (3), and an ethylenically unsaturated group having a high addition polymerizing property than that of the unsaturated group, and a specific monomer to be described later, and if necessary copolymerizing with another radically polymerizable compound.

Synthesizing method 6)

A method of reacting and introducing a compound having the structure represented by the formula (15) with the side chain functional group after synthesizing a polymer compound by copolymerizing one or more kinds of the radically polymerizable compounds having a functional group and a specific monomer to be described later.

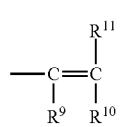

Formula (15)

As the radically polymerizable compound having an unsaturated group represented by the formula (3) and an ethylenically unsaturated group having a high addition polymerizing property than that of the unsaturated group, vinyl acrylate, vinyl methacrylate, 2-phenyl vinyl acrylate, 2-phenyl vinyl methacrylate, 1-propenyl acrylate, 1-propenyl methacrylate, vinyl acrylic amide, vinyl methacrylic amide, or the like may be presented as the examples.

As the polymer compound to be obtained by the copolymerization, those presented as the examples in the above-mentioned synthesizing method 2) may be obtained.

In the formula (15), $R^9$ to $R^{11}$ are same as those in the formula (3), and the same preferable examples are also applied.

As the compounds having the structure represented by the formula (15), 2-hydroxy ethyl monovinyl ether, 4-hydroxy butyl monovinyl ether, diethylene glycol monovinyl ether, 4-chloromethyl styrene, or the like may be presented as the examples.

A synthesizing method using at least one kind of the following formulae (4) and (5) in the above-mentioned synthesizing method 1) instead of the formula (12) to be used in the above-mentioned synthesizing method 1) is also preferable.

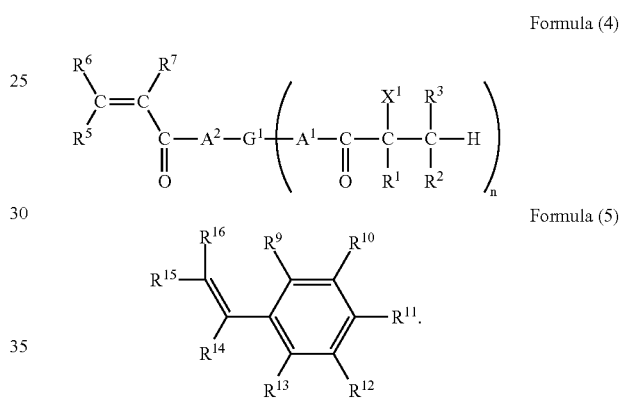

Formula (4)

Formula (5)

In the formula (4) or (5), $R^5$, $R^6$, $R^7$ represent hydrogen or a monovaleic organic group, $A^2$ represents an oxygen atom, a sulfur atom or $—NR^8—$, $G^1$ represents an organic linking group, $R^8$ represents hydrogen or a monovaleic organic group, and n represents an integer from 1 to 10. $R^1$ to $R^3$ are same as those in the formula (12), $A^1$ is same as X in the formula (1), and $X^1$ is same as Z in the formula (12).

$R^9$ to $R^{13}$ represent hydrogen or a monovaleic organic group, at least one of which is a group represented by the following formula (6). $R^{14}$ to $R^{16}$ represent hydrogen or a monovaleic organic group.

In the formula (4) or (5), the monovaleic organic group is same as the monovaleic organic group in the formula (1), and the same preferable examples are also applied.

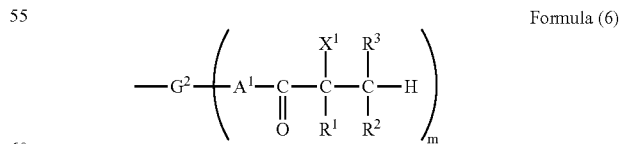

Formula (6)

In the formula (6), $G^2$ represents an organic linking group, and m represents an integer from 1 to 10. $R^1$ to $R^3$, $A^1$, $X^1$ are same as those in the formula (4).

As the preferable specific examples of the compound represented by the above-mentioned formula (4) or (5), the following ones may be presented (i-1 to i-60).

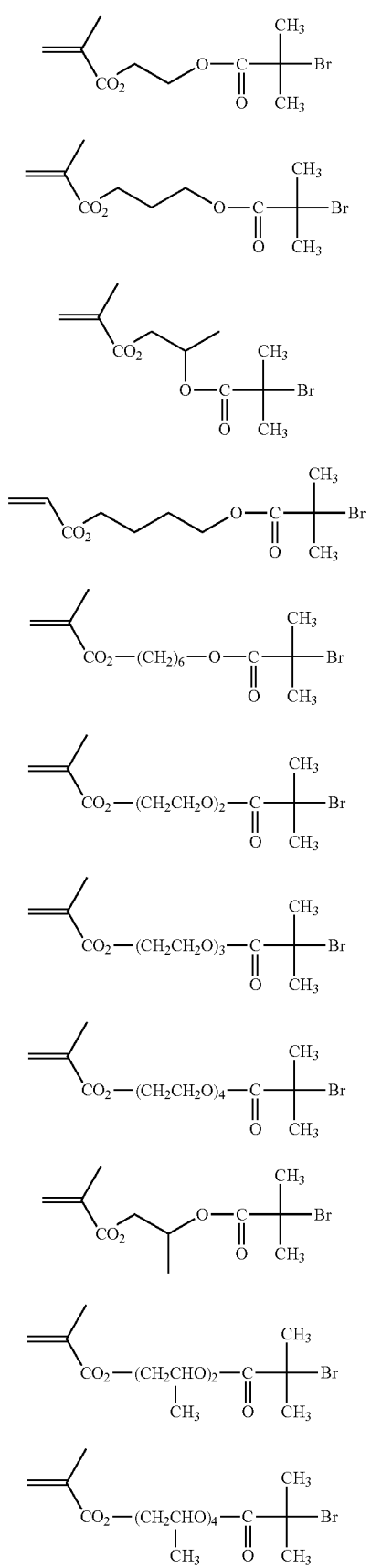
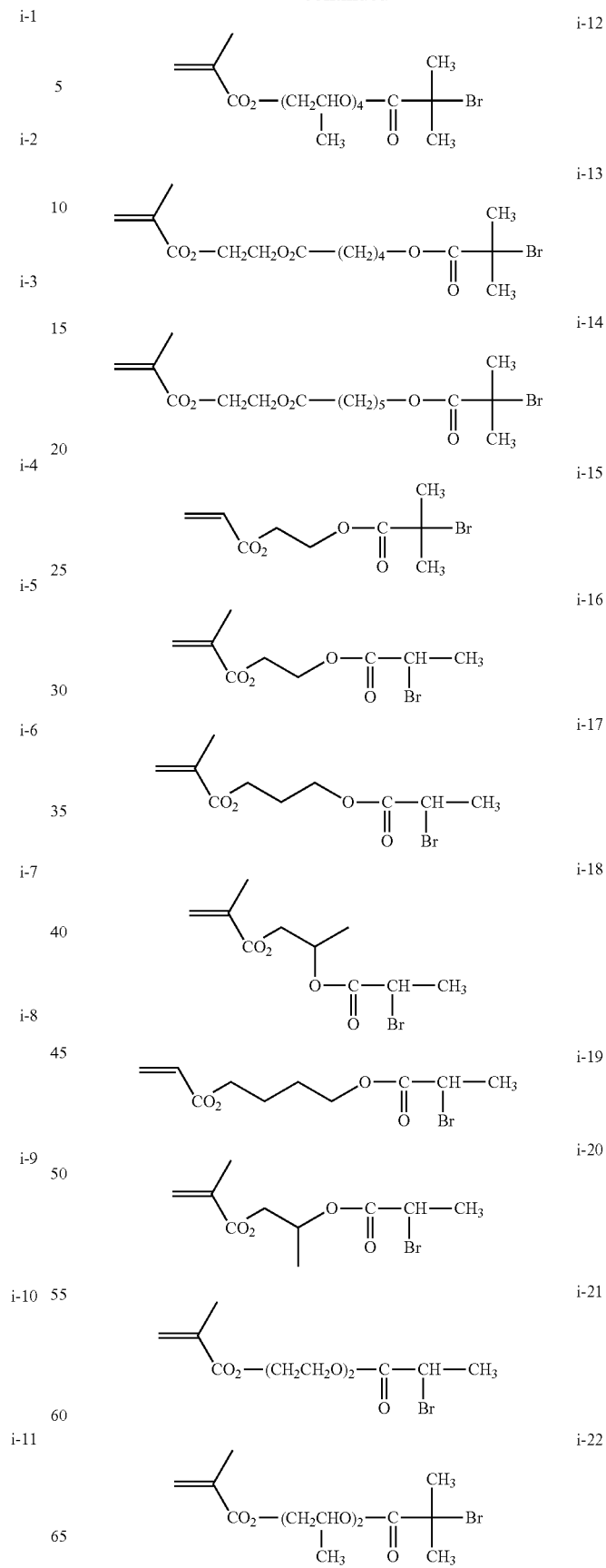

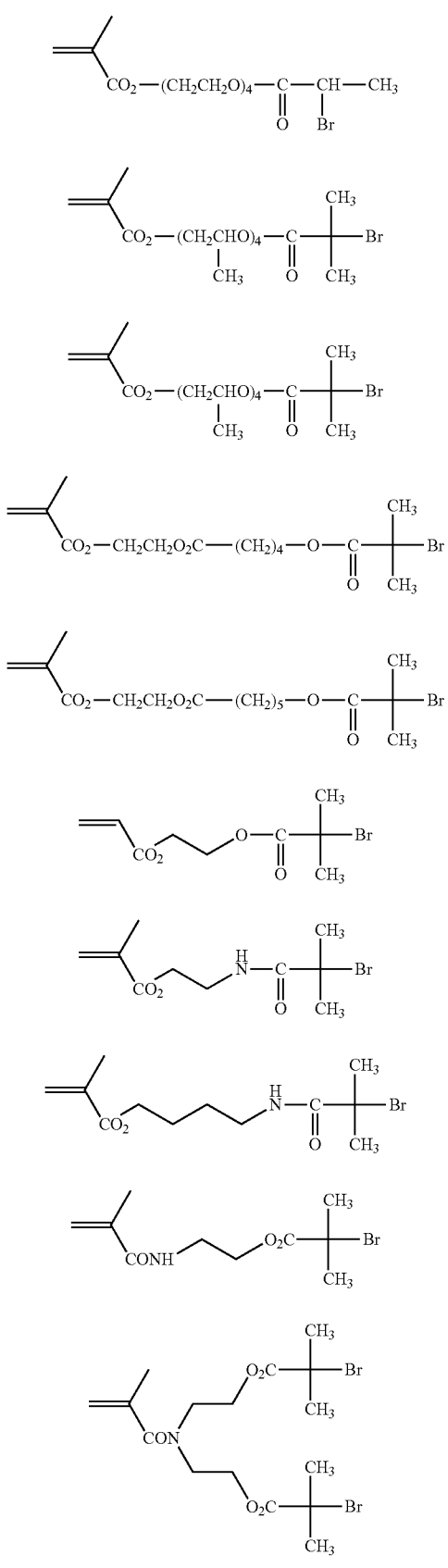
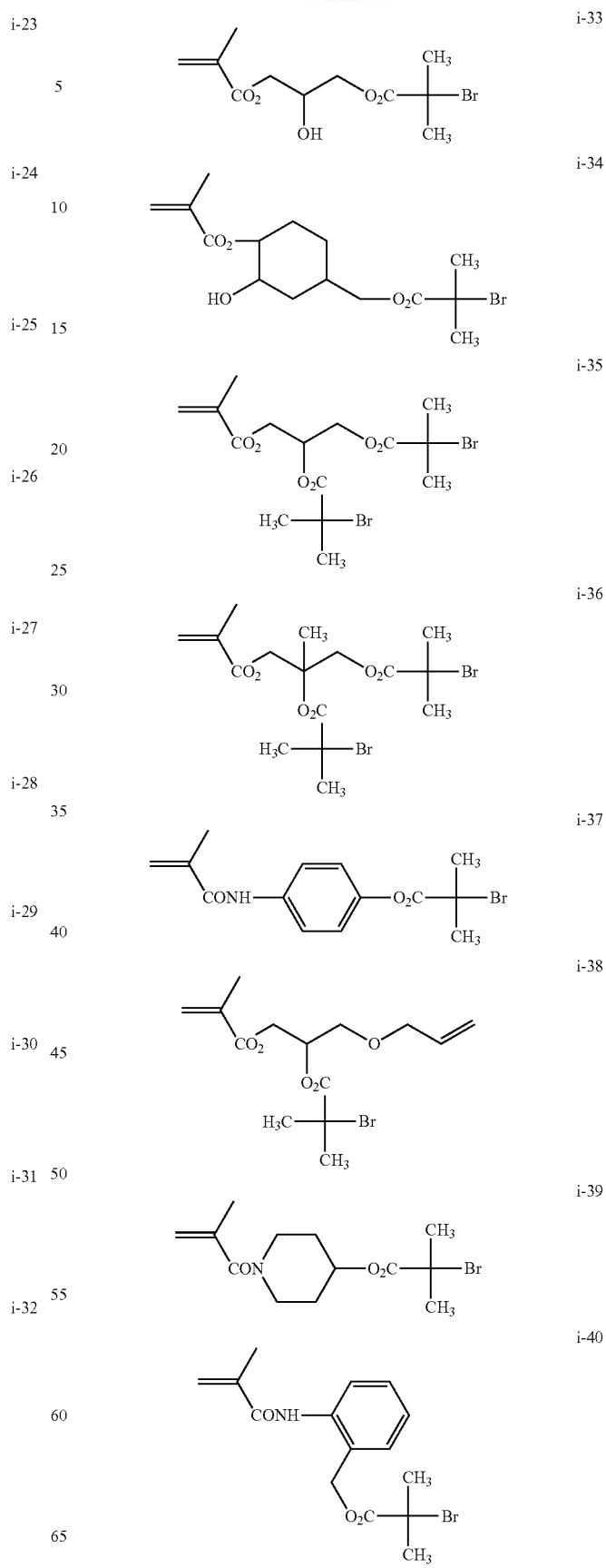

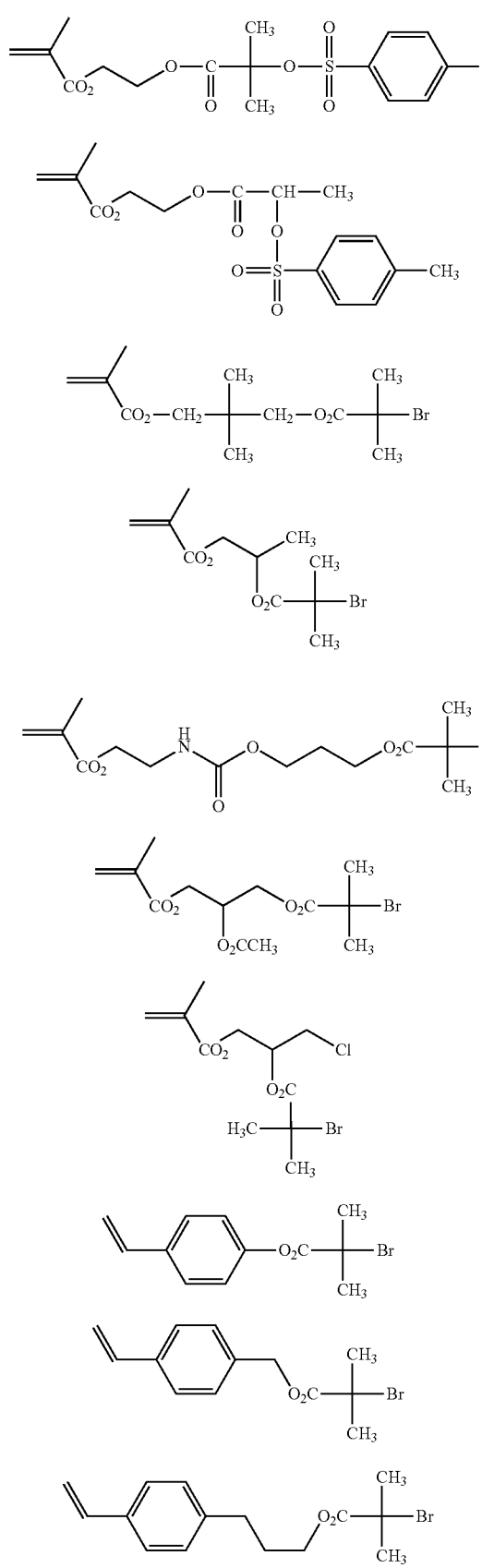
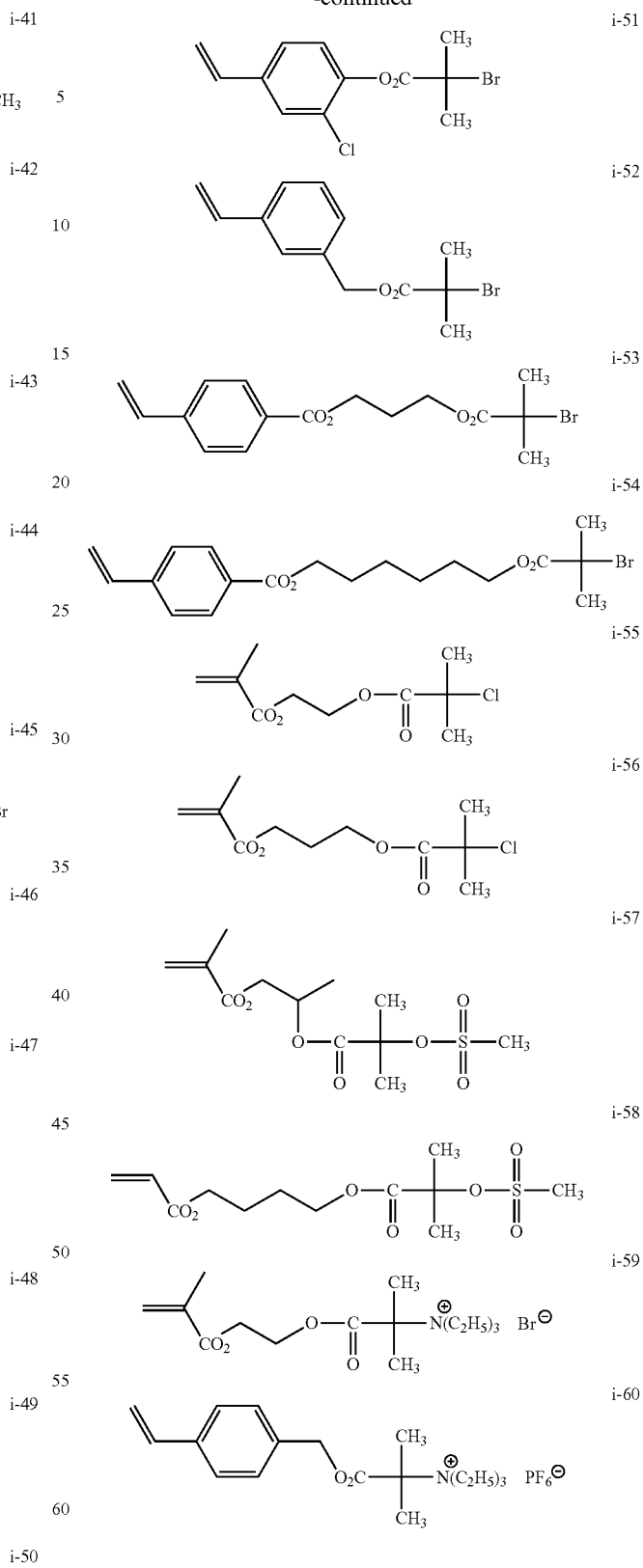
In the synthesis of the compound having a group represented by the formula (1) obtained using the above-mentioned formula (4) or (5) (hereafter, it is referred to also as the "polyvinyl-based polymer compound"), further copolymerization of another general radically polymerizable compound with a compound having a double bond by the elimination reaction as mentioned above is also one embodiment of the invention.

In the above-mentioned synthesizing methods 1) to 6), as mentioned above, another general radically polymerizable compound may be copolymerized if necessary. In the invention, as a general radically polymerizable compound to be copolymerized, for example, a radically polymerizable compound selected from acrylates, methacrylates, N,N-disubstituted acrylic amides, N,N-disubstituted methacrylic amides, styrenes, acrylonitriles, methacrylonitriles, or the like may be presented.

Specific examples include acrylates such as alkyl acrylate (the number of carbon atoms of the alkyl group is preferably 1 to 20), (specifically, for example, methyl acrylate, ethyl acrylate, propyl acrylate, butyl acrylate, amyl acrylate, ethyl hexyl acrylate, octyl acrylate, t-octyl acrylate, chloroethyl acrylate, 2,2-dimethyl hydroxyl propyl acrylate, 5-hydroxy pentyl acrylate, trimethylol propane monoacrylate, pentaerythritol monoacrylate, glycidyl acrylate, benzyl acrylate, methoxy benzyl acrylate, furfuryl acrylate, tetrahydro furfuryl acrylate, or the like), aryl acrylate (for example, phenyl acrylate, or the like), Methacrylates such as alkyl methacrylate (the number of carbon atoms of the alkyl group is preferably 1 to 20), (specifically, for example, methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxy butyl methacrylate, 5-hydroxy pentyl methacrylate, 2,2-dimethyl-3-hydroxy propyl methacrylate, trimethylol propane monomethacrylate, pentaerythritol monomethacrylate, glycidyl methacrylate, furfuryl methacrylate, tetrahydro furfuryl methacrylate, or the like), aryl methacrylate (for example, phenyl methacrylate, cresyl methacrylate, naphthyl methacrylate, or the like), Styrenes such as styrene and alkyl styrene (such as methyl styrene, dimethyl styrene, trimethyl styrene, ethyl styrene, diethyl styrene, isopropyl styrene, butyl styrene, hexyl styrene, cyclohexyl styrene, decyl styrene, benzyl styrene, chloromethyl styrene, trifluoromethyl styrene, ethoxy methyl styrene, and acetoxy methyl styrene), alkoxy styrene (such as methoxy styrene, 4-methoxy-3-methyl styrene, and dimethoxy styrene), halogen styrene (such as chloro styrene, dichloro styrene, trichloro styrene, tetrachloro styrene, pentachloro styrene, brome styrene, dibrome styrene, iodostyrene, fluorostyrene, trifluorostyrene, 2-brome-4-trifluoromethyl styrene, and 4-fluoro-3-trifluoromethyl styrene), acrylonitrile, methacrylonitrile, or the like may be presented.

As the radically polymerizable compound containing carboxylic acid, for example, acrylic acid, methacrylic acid, itaconic acid, crotonic acid, isocrotonic acid, maleic acid, p-carboxyl styrene, or the like may be presented.

Moreover, as the solvent to be used at the time of synthesizing the above-mentioned polyvinyl-based polymer compound, for example, ethylene dichloride, cyclohexanone, methyl ethyl ketone, acetone, methanol, ethanol, propanol, butanol, ethylene glycol monomethyl ether, ethylene glycol monoethyl ether, 2-methoxy ethyl acetate, 1-methoxy-2-propanol, 1-methoxy-2-propyl acetate, N,N-dimethyl formamide, N,N-dimethyl acetoamide, dimethyl sulfoxide, toluene, ethyl acetate, methyl lactate, ethyl lactate, 1-methyl-2-pyrolidone, or the like may be presented.

These solvents may be used alone or as a mixture of two or more kinds. The resin in the invention as a copolymer as mentioned above is a resin manufactured by polymerizing at least a monomer having 2.0 or more dipole moment (hereafter, it is referred to also as the "specific monomer") as a copolymerization component. The "specific monomer" herein is a monomer other than the monomer containing an alkaline soluble group to be described later.

As the above-mentioned dipole moment, the numerical value obtained by calculation by the following calculation method was used.

That is, the dipole moment is calculated by the optimum structure after optimizing the structure of the above-mentioned specific monomer obtained by the calculation method AMI using CAChe6.1 (manufactured by Fujitsu Corp.).

According to the specific monomer as the copolymerization component of the resin in the invention, although the structure is not limited as long as the dipole moment calculated by the above-mentioned calculation method is 2.0 or more. In particular, in terms of the sensitivity and the storage stability, the value of the dipole moment is preferably 2.5 or more, it is more preferably 2.5 or more and 15 or less, it is further preferably 3.0 or more and 10 or less, it is particularly preferably 3.5 or more and 9.0 or less, and it is most preferably 3.5 or more and 8.0 or less.

Since the dipole moment of the above-mentioned specific monomer is in a range of 2.5 or more and 15 or less, it is preferable in terms of the convenience of the resin synthesis, the sensitivity, the developing property and the storage stability of the curable composition including the resin.

Among the above-mentioned examples, the specific monomer particularly preferably has at least one group selected form the group consisting of an ether group, a cyano group, a phosphate group, a lactone group, a urethane group, a carbonate group and an acetal group.

The ether group contained in the specific monomer is preferably a linear, branched or cyclic ether group having 2 to 30 carbon atoms, and it is particularly preferably a linear, branched or cyclic ether group having 2 to 15 carbon atoms. As the examples of the ether group, 2-methoxy ethyl, 2-ethoxy ethyl, MeOCH$_2$CH$_2$OCH$_2$CH$_2$—, MeO(CH$_2$CH$_2$O)$_2$CH$_2$CH$_2$—, oxetane-2-yl, oxetane-3-yl, tetrahydrofuran-2-yl, tetrahydrofuran-3-yl, tetrahydro-2H-pyrrane-2-yl, octahydro-1H-isochlomene-3-yl, oxylane-2-yl, or the like may be presented.

The lactone group contained in the specific monomer is preferably a lactone group having 3 to 30 carbon atoms, and it is more preferably a lactone group having 5 to 20 carbon atoms. As the examples of the lactone group, the following structure may be presented. In the following structure, R represents a hydrogen atom, an alkyl group, a cycloalkyl group, or an aryl group, wherein the alkyl group, the cycloalkyl group or the aryl group each independently has 1 to 20 carbon atoms.

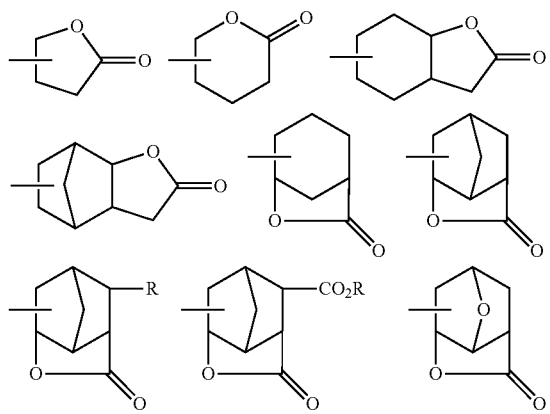

-continued

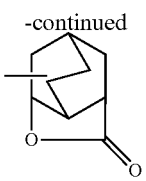

The urethane group contained in the specific monomer is preferably a linear or cyclic urethane group having 1 to 30 carbon atoms, and it is preferably a linear or cyclic urethane group having 1 to 20 carbon atoms.

As the examples of the urethane group, the following structure may be presented, however, it is not limited thereto. In the following structure, R represents a hydrogen atom, an alkyl group, a cycloalkyl group, or an aryl group, wherein the alkyl group, the cycloalkyl group or the aryl group each independently has 1 to 20 carbon atoms.

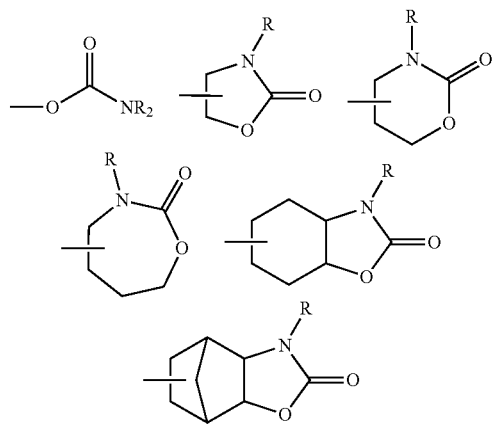

The carbonate group contained in the specific monomer is preferably a linear or cyclic carbonate group having 1 to 30 carbon atoms, and it is preferably a linear or cyclic carbonate group having 1 to 20 carbon atoms.

As the examples of the carbonic acid ester group, the following structure may be presented, however, it is not limited thereto.

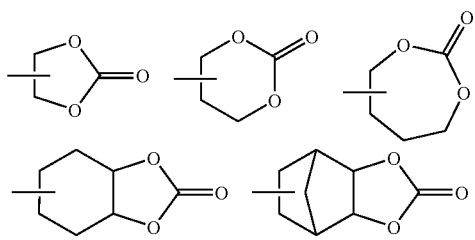

The acetal group contained in the specific monomer is preferably a linear or cyclic acetal group having 1 to 30 carbon atoms, and it is preferably a linear or cyclic acetal group having 1 to 20 carbon atoms. As the examples of the acetal group, the following structure may be presented, however, it is not limited thereto. In the following structure, R represents a hydrogen atom, an alkyl group, a cycloalkyl group, or an aryl group, wherein the alkyl group, the cycloalkyl group or the aryl group each independently has 1 to 20 carbon atoms.

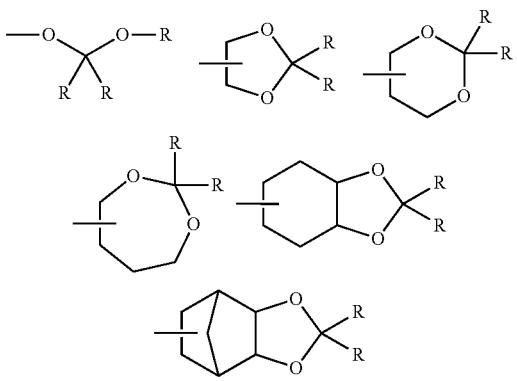

The phosphate group contained by the specific monomer is preferably a linear or cyclic phosphate group having 1 to 30 carbon atoms, and it is more preferably a linear or cyclic phosphate group having 1 to 20 carbon atoms. As the examples of the phosphate group, the following structure may be presented, however, it is not limited thereto.

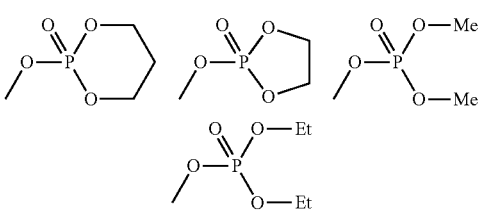

As the specific examples of the above-mentioned monomer, the following compounds may be used preferably, however, it is not limited thereto.

TABLE 1

| Compound number | Structure | Dipole moment (Debye) |
|---|---|---|
| M-1A | | 2.99 |
| M-2A | | 2.79 |
| M-3A | | 2.85 |
| M-4A | | 2.82 |
| M-5A | | 2.96 |

TABLE 1-continued
| Compound number | Structure | Dipole moment (Debye) |
|---|---|---|
| M-6A | 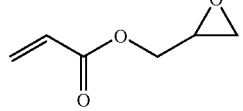 | 3.29 |
| M-7A | 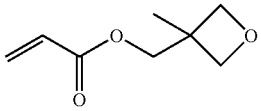 | 2.83 |
| M-8A | 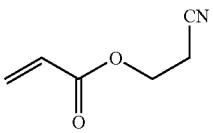 | 4.27 |
| M-9A | 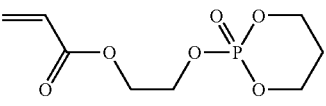 | 5.14 |
| M-10A | 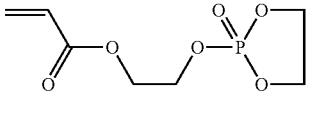 | 3.32 |
| M-11A | 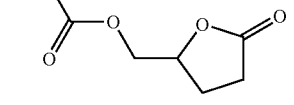 | 6.03 |
| M-12A | 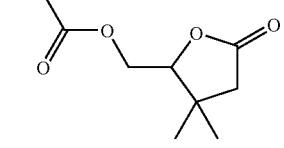 | 3.94 |
| M-13A | 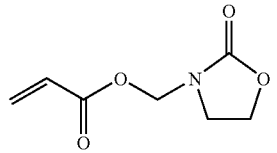 | 6.17 |
| M-14A | 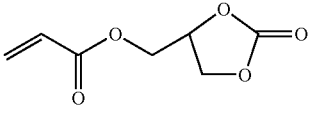 | 6.61 |
| M-15A | 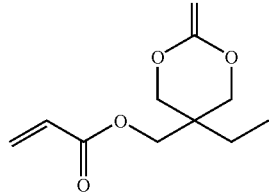 | 4.35 |
TABLE 1-continued
| Compound number | Structure | Dipole moment (Debye) |
|---|---|---|
| M-1MA | 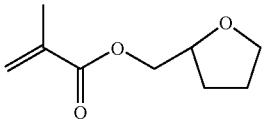 | 3.39 |
| M-2MA | 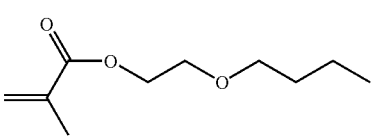 | 3.28 |
| M-3MA | 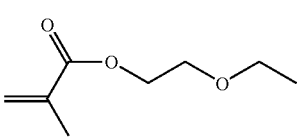 | 3.31 |
| M-4MA | 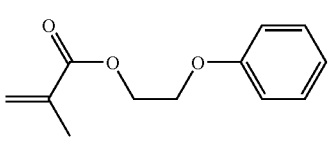 | 3.14 |
| M-5MA | 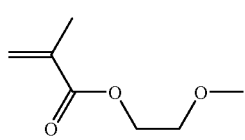 | 3.42 |
| M-6MA | 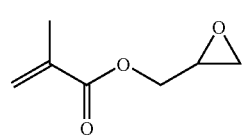 | 3.48 |
| M-7MA | 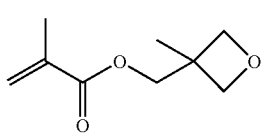 | 2.95 |
| M-8MA | 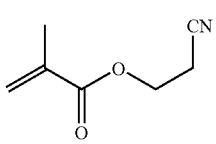 | 4.32 |
| M-9MA | 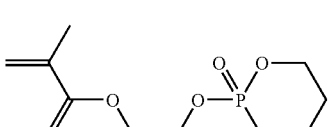 | 4.58 |
| M-10MA | 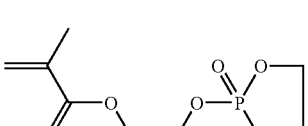 | 3.48 |

TABLE 1-continued

| Compound number | Structure | Dipole moment (Debye) |
|---|---|---|
| M-11MA | | 6.13 |
| M-12MA | | 3.70 |
| M-13MA | | 6.49 |
| M-14MA | | 6.50 |
| M-15MA | | 4.23 |
| M-16MA | | 2.53 |

The resin in the invention is a resin manufactured by polymerizing the above-mentioned specific monomer as a copolymerization component, and it is preferably a resin manufactured by polymerizing a component having a partial structure to be or capable of being an ethylenically unsaturated double bond of a side chain of the resin (hereafter, it is also referred to as a "copolymerization component to provide a double bond of the resin") and the above-mentioned specific monomer.

As the combinations of the copolymerization component for providing a resin in the invention, that is, as the combinations of the "specific monomer" and the "copolymerization component to provide a double bond of the resin", a combination of any of M-1, M-8, i-1, i-7, i-8, i-10, i-16 and i-49 and any of M-9A, M-11A, M-12A, M-13A, M-14A, M-15A, M-9MA, M-11MA, M-12MA, M-13MA, M-14MA, M-15MA and M-16MA is preferable, a combination of any of M-1, i-1, i-10, i-16 and i-49 and any of M-11A, M-13A, M-14A, M-11MA, M-13MA and M-14MA is more preferable, and a combination of the example compound i-1 and the example compound M-14MA, a combination of the example compound i-1 and the example compound M-11MA, a combination of the example compound i-1 and the example compound M-13MA, a combination of the example compound M-1 and the example compound M-14MA, a combination of the example compound M1 and the example compound M-11MA and a combination of the example compound M-1 and the example compound M-13MA are particularly preferable.

The above-mentioned combinations are preferable in terms of the resin synthesis easiness, the sensitivity and the developability of the curable composition containing the resin and the storage stability.

The configuration of the resin in the invention as a copolymer may either be a block copolymer, a random copolymer, a graft copolymer, or the like. In particular, a block copolymer is preferable in terms of the resin synthesis easiness.

The content amount of the copolymer component to provide a double bond of the above-mentioned resin in the invention is preferably 0.1 mole % to 95 mole %, it is more preferably 1 mole % to 85 mole %, and it is particularly preferably 5 mole % to 75 mole %.

Here, the above-mentioned "content amount of the copolymerization component to provide a double bond of the resin" specifically denotes the following.

That is, in the above-mentioned synthesizing method 1), it denotes the "content amount in the copolymer of the radically polymerizable compound represented by the formula (12)", in the above-mentioned synthesizing methods 2), 4) and 6), it denotes the "content amount in the copolymer as a copolymerization component after reaction of the functional group with any of the formulae (13), (14) and (15) after copolymerization of a radically polymerizable compound having a functional group", and in the synthesizing method 3) or 5), it denotes the "content amount in the copolymer of a radically polymerizable compound having an unsaturated group represented by the formula (2) or (3), and an ethylenically unsaturated group having a high addition polymerizing property than that of the unsaturated group".

Since the content amount of the copolymerization component to provide a double bond of the above-mentioned resin is in the above-mentioned range, the sensitivity is improved and the adhesion property with respect to the substrate is preferable, and thus it is preferable.

In the resin in the invention, the content amount of the above-mentioned specific monomer as the copolymerization component is preferably 1 mole % to 90 mole %, it is more preferably 3 mole % to 70 mole %, and it is particularly preferably 5 mole % to 50 mole %.

Since the content amount of the above-mentioned specific monomer is in the above-mentioned range, the sensitivity is improved and the adhesion property with respect to the substrate is preferable, and thus it is preferable.

In the above-mentioned resin, the mole ratio (constituent component ratio) of the "above-mentioned content amount of the specific monomer" and the above-mentioned content amount of the copolymerization component to provide a double bond of the resin" in the above-mentioned resin is preferably 100:1 to 1:100, it is more preferably 50:1 to 1:50, and it is particularly preferably 10:1 to 1:10.

Since the constituent component ratio of the above-mentioned specific monomer and the above-mentioned copolymerization component to provide a double bond of the resin is in the above-mentioned range, the sensitivity is improved and the adhesion property with respect to the substrate is preferable, and thus it is preferable.

The resin in the invention may be a resin manufactured by polymerization with a monomer containing an alkaline soluble group as a copolymerization component. The "alkaline soluble group" here denotes a functional group to be dissociated by a developing solution used at the time of forming a pattern so as to improve the solubility to the developing solution (alkaline aqueous solution). The alkaline soluble group is preferably a functional group having 11 or less pKa in water of 25° C. As the functional group, for example, a carboxyl group, a sulfo group, a sulfone amide group, a phosphoric acid group, a phenol type hydroxyl group, or the like may be presented. In particular, a carboxyl group is most preferable.

The content amount as the copolymerization component of the above-mentioned monomer containing an alkaline soluble group is preferably 1 mole % to 90 mole %, it is more preferably 3 mole % to 70 mole %, and it is particularly preferably 5 mole % to 50 mole %.

Since the content amount as the copolymerization component of a monomer containing the above-mentioned alkaline soluble group is in the above-mentioned range, the sensitivity is improved and the adhesion property with respect to the substrate is preferable, and thus it is preferable.

The weight average molecular weight (polystyrene equivalent value in the GPC measurement method) is preferably 500 to 100,000, it is further preferably 1,000 to 50,000, it is particularly preferably 1,000 to 30,000. The molecular weight distribution (ratio of the weight average molecular weight and the numerical average molecular weight) of the resin is preferably 3.0 or less, and it is most preferably 2.0 or less.

The specific examples of the resin in the invention will be presented below together with their weight average molecular weights, however, the invention is not limited thereto.

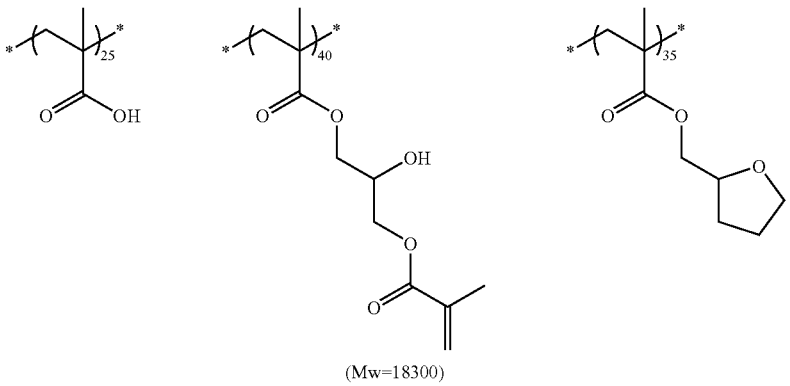

B-1

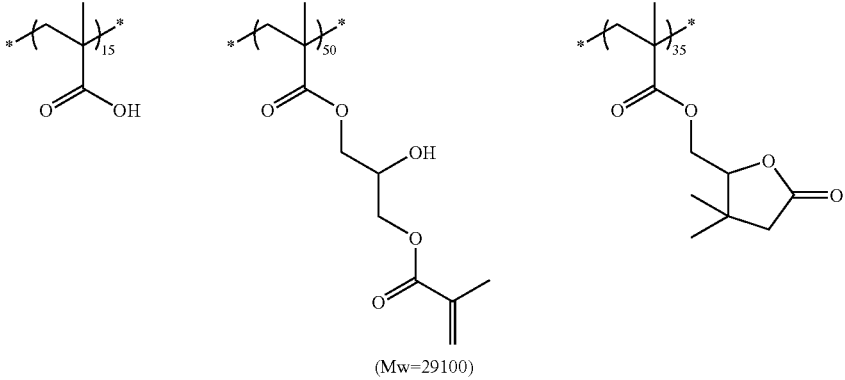

B-2

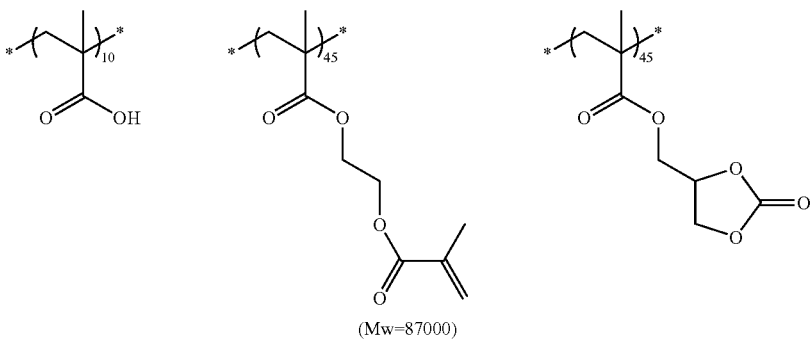

B-3

B-4
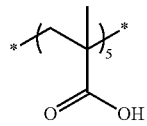 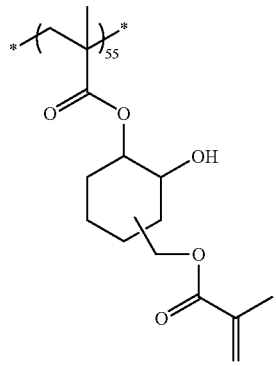 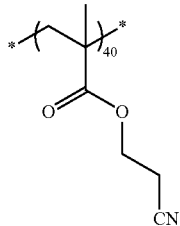
(Mw=5200)
B-5
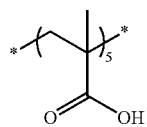 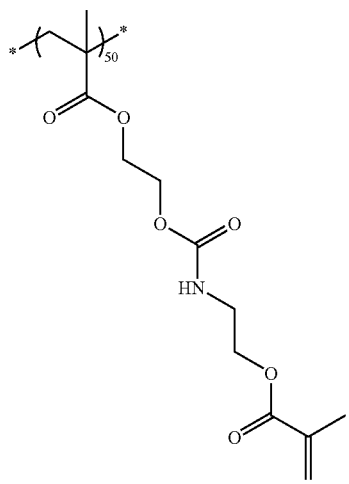 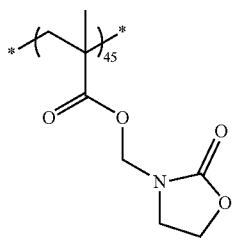
(Mw=34000)
B-6
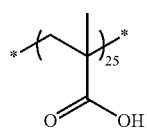 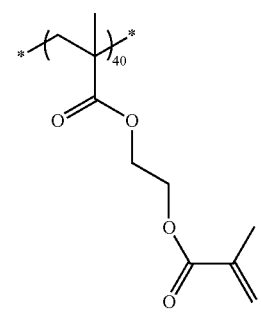 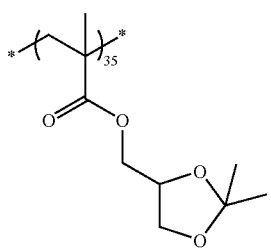
(Mw=33000)

B-7
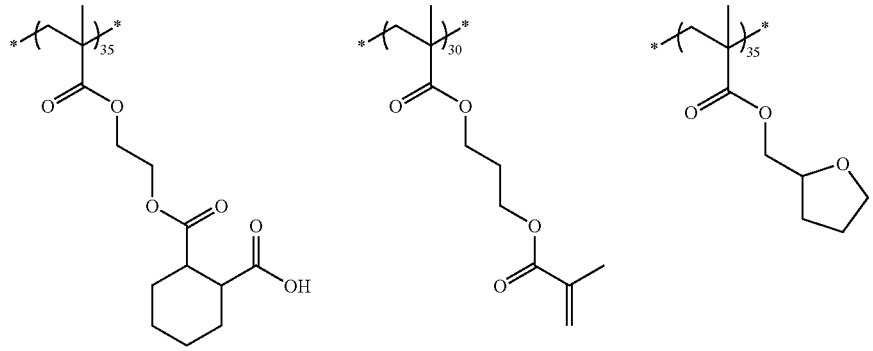
(Mw=8500)
B-8
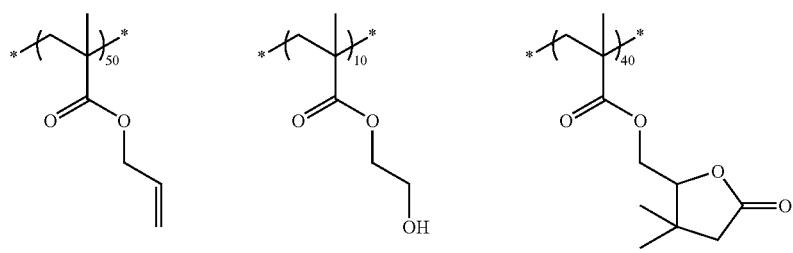
(Mw=21000)
B-9
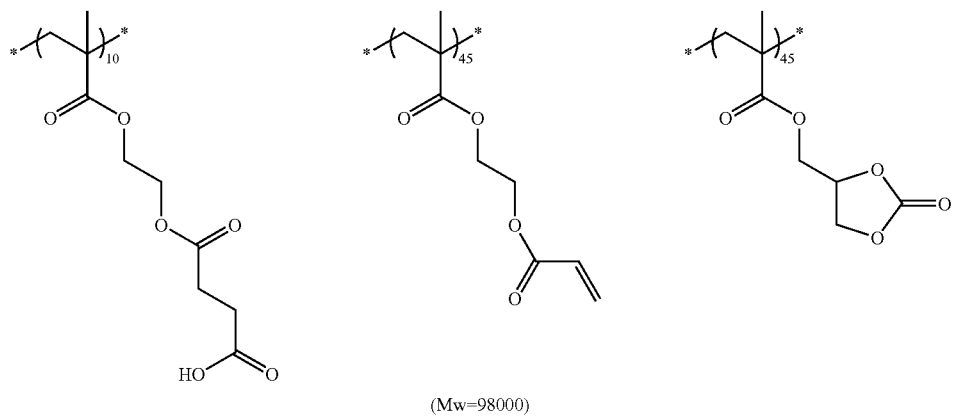
(Mw=98000)
B-10
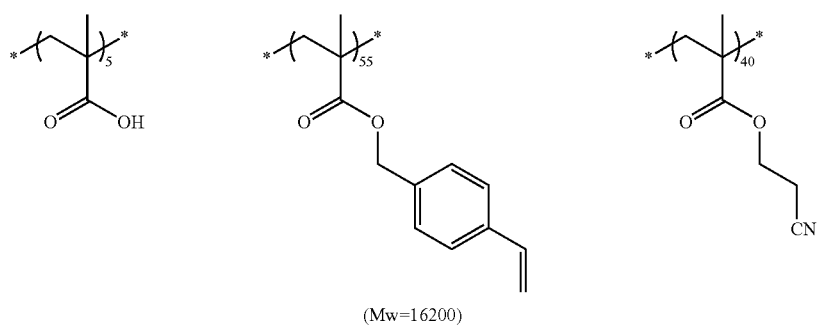
(Mw=16200)

-continued
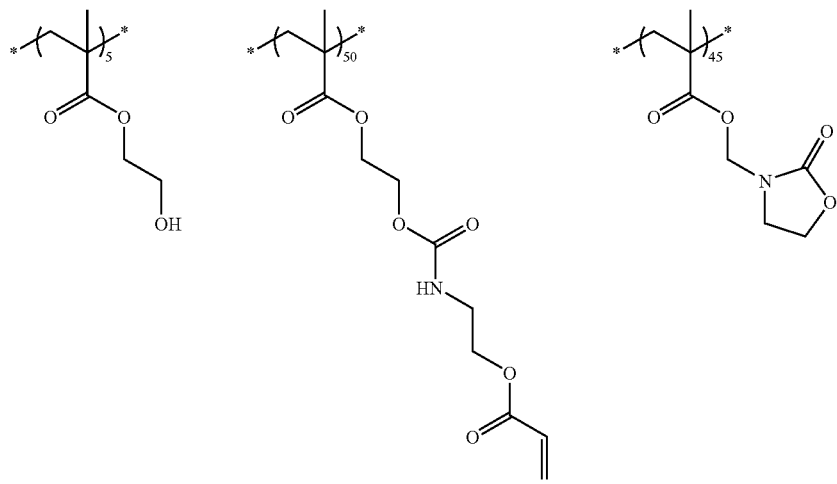
B-11
(Mw=19600)
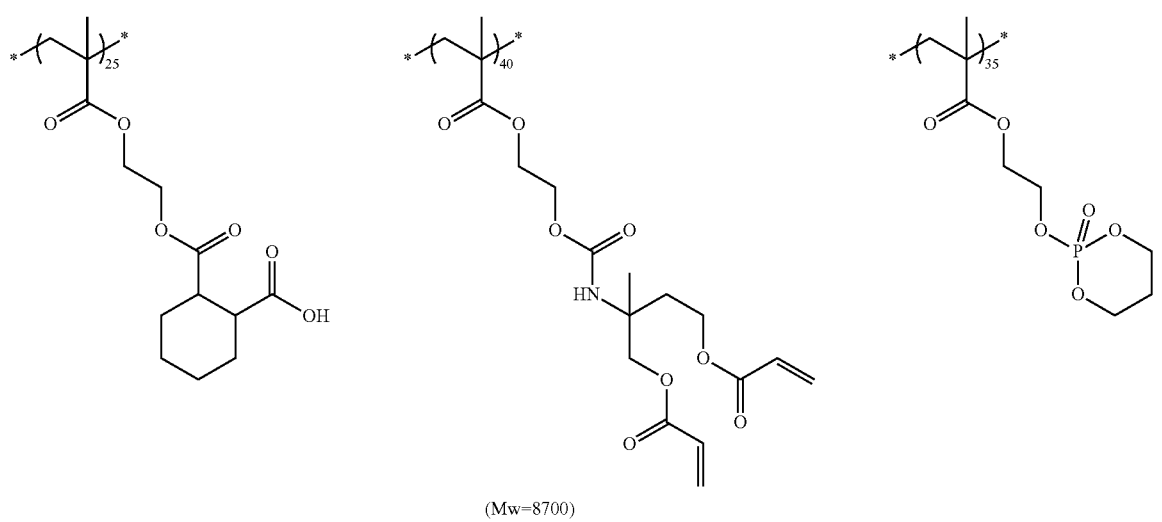
B-12
(Mw=8700)
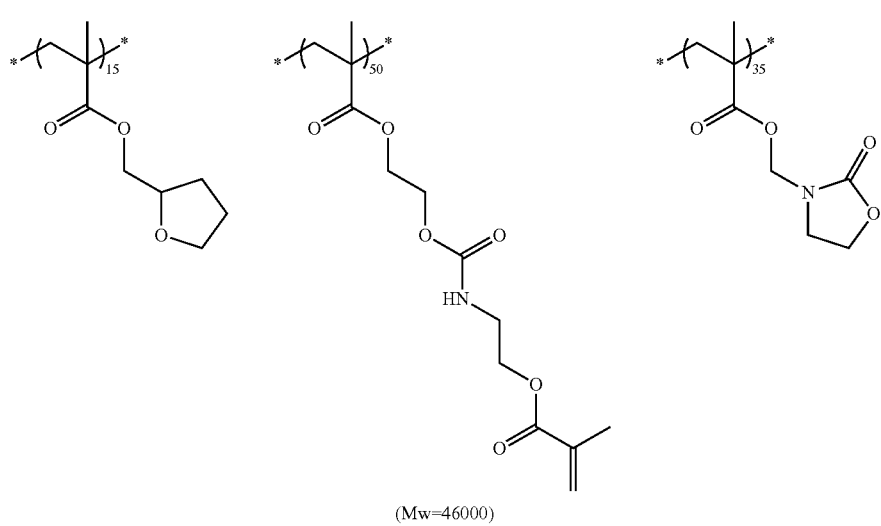
B-13
(Mw=46000)

-continued
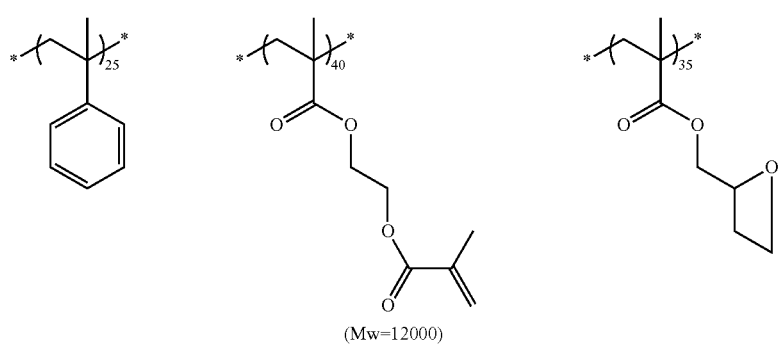
B-14
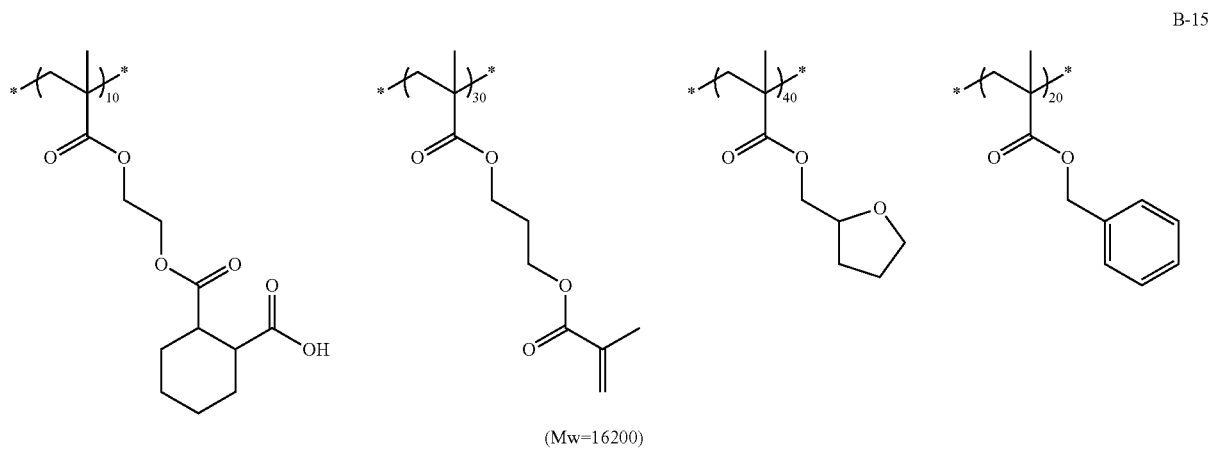
B-15
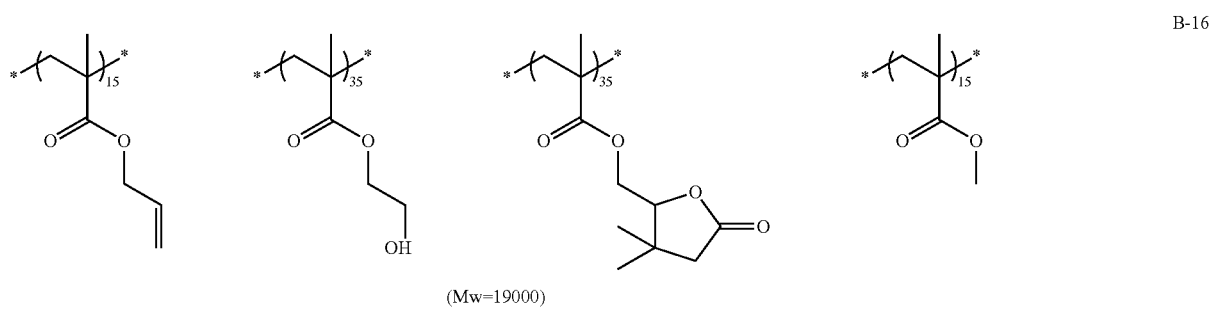
B-16
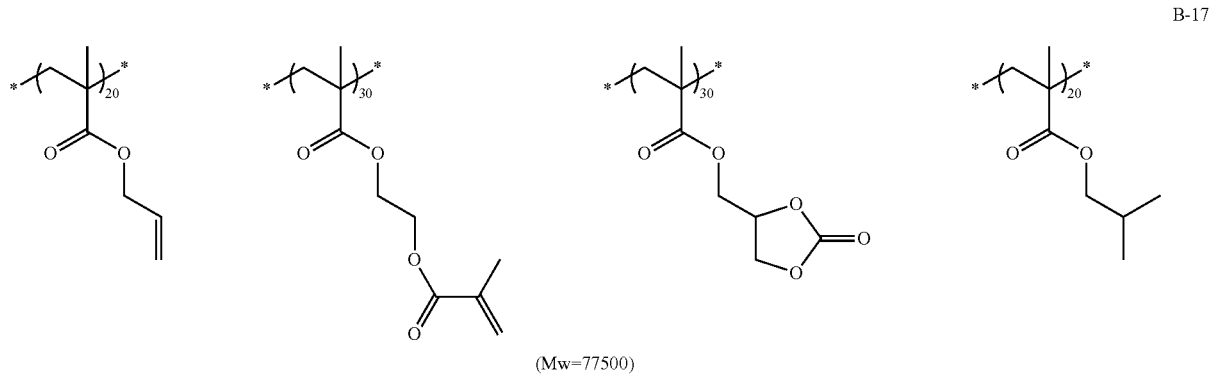
B-17

-continued
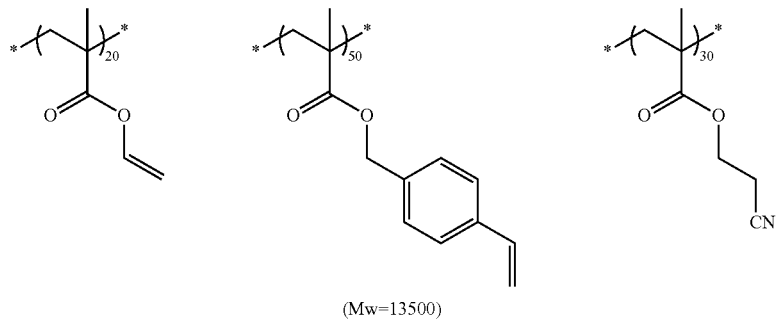
(Mw=13500)
B-18
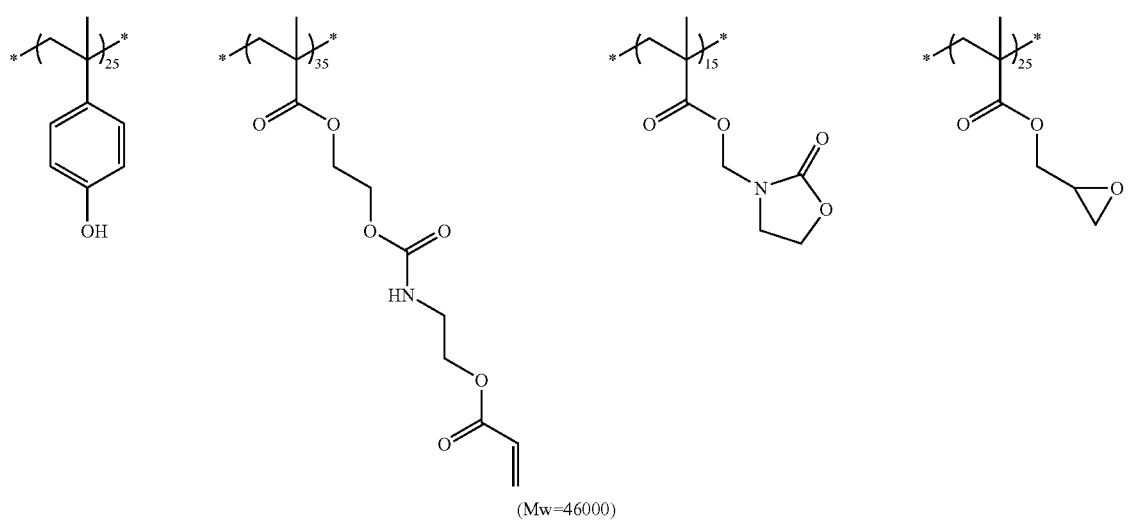
(Mw=46000)
B-19
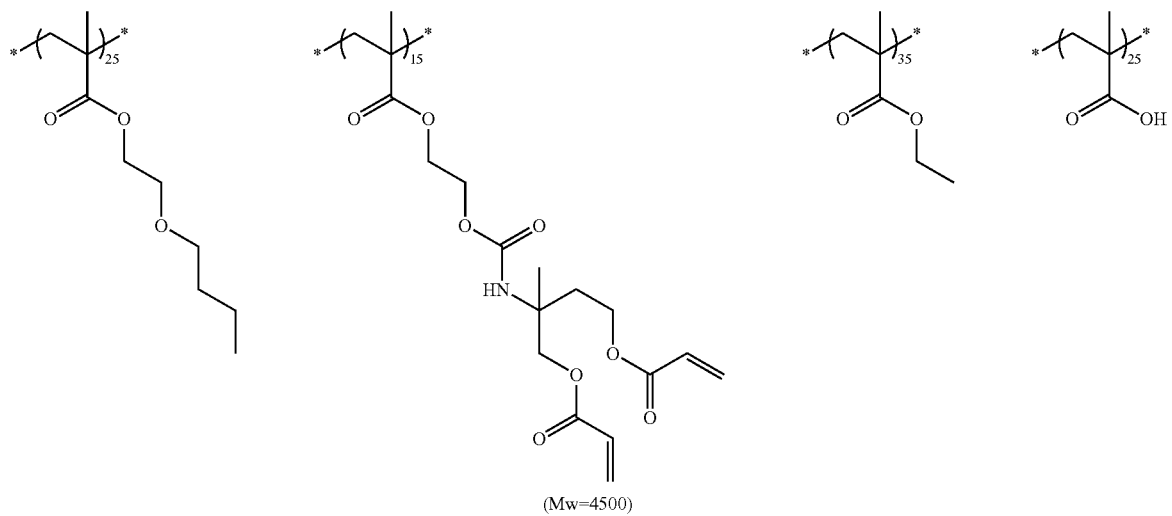
(Mw=4500)
B-20

-continued
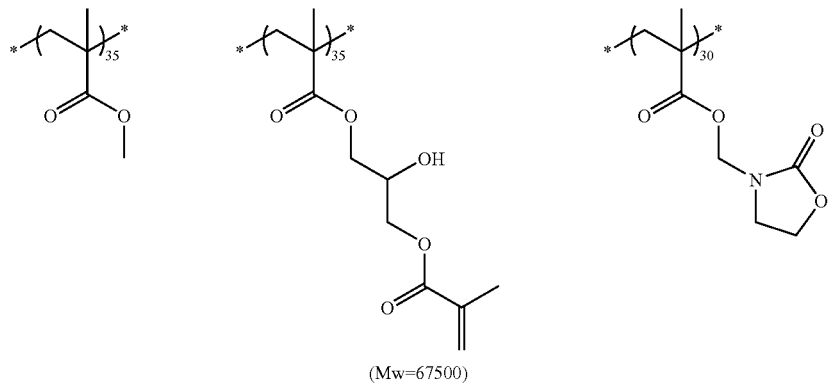
B-21
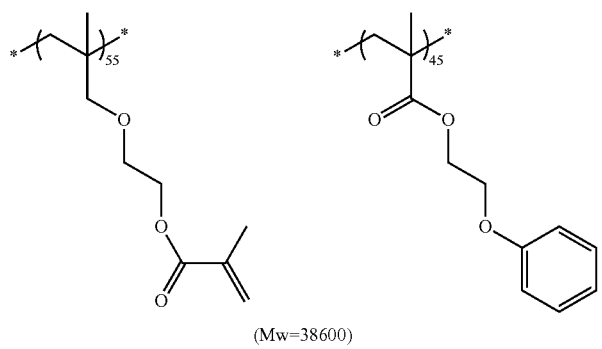
B-22
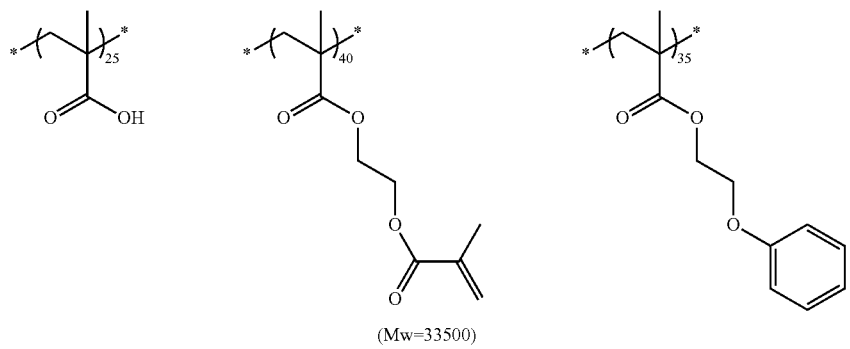
B-23
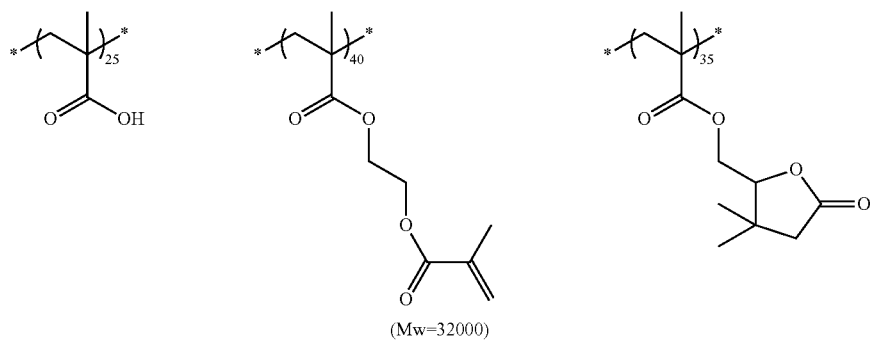
B-24

B-25
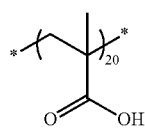 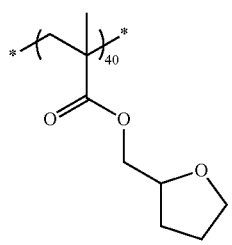 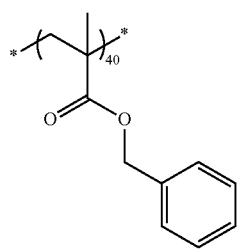
(Mw 25000)
B-26
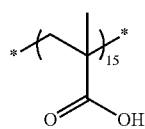 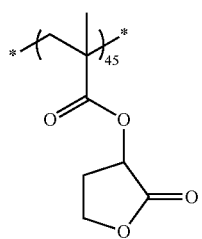 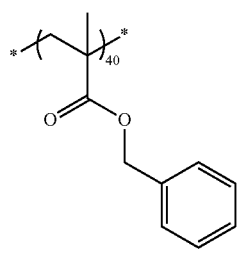
(Mw 21000)
B-27
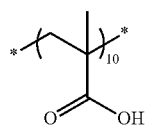 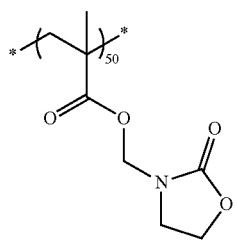 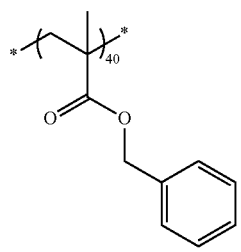
(Mw 19000)
B-28
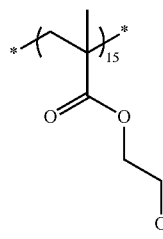 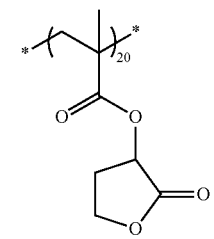 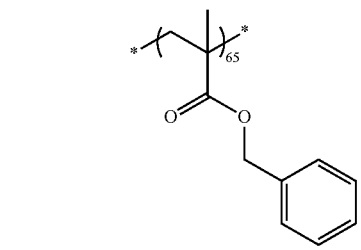
(Mw 17000)

-continued
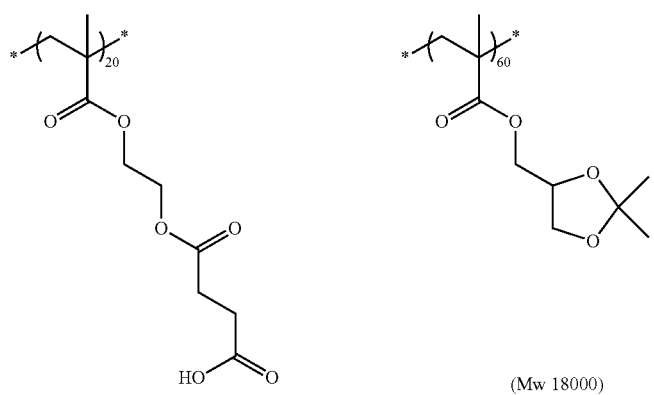
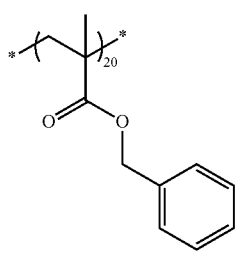 B-29
(Mw 18000)
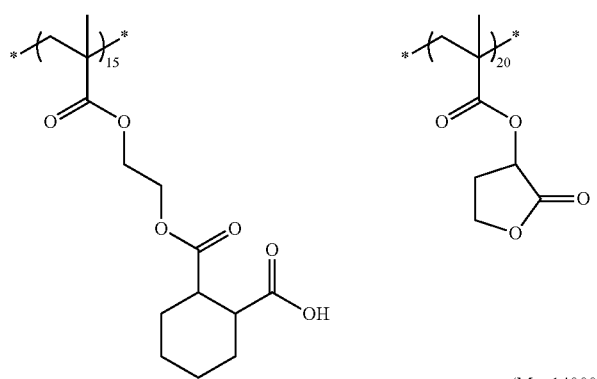
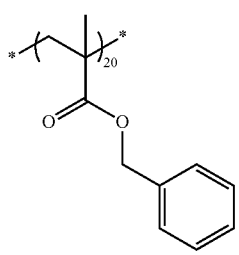 B-30
(Mw 14000)
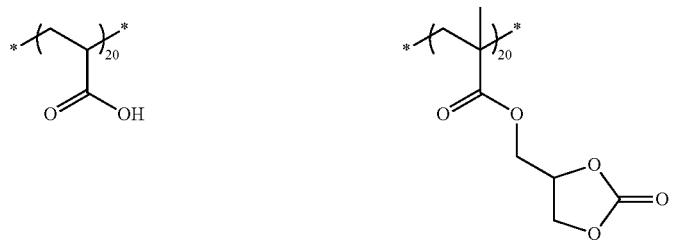
B-31
(Mw 12000)
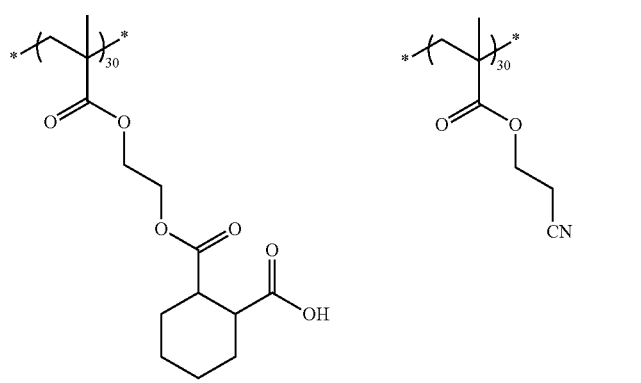
B-32
(Mw 10500)

According to the resin in the invention, the total content amount (mole %) of the specific monomer and the copolymerization component to provide a double bond of the above-mentioned resin is preferably 2 mole % to 98 mole %, it is more preferably 5 mole % to 90 mole %, and it is particularly preferably 10 mole % to 80 mole %.

Since the above-mentioned total content amount is in the above-mentioned range, the sensitivity is improved and the adhesion property with respect to the substrate is preferable, and thus it is preferable.

The content amount of the above-mentioned resin with respect to the total solid component of the curable composition of the invention is preferably 0.1 % by mass to 75% by mass, it is more preferably 1% by mass to 50% by mass, and it is particularly preferably 2% by mass to 40% by mass. According to the range, preferable sensitivity and pattern forming property may be obtained.

<Photo Polymerization Initiator>

The curable composition of the invention contains a photopolymerization initiator (B) for improving the sensitivity and the pattern forming property.

The photopolymerization initiator in the invention is a compound to be decomposed by light, for initiating and promoting the polymerization of a polymerizable component in the invention, preferably having absorption in the region of 300 to 500 nm wavelength. Moreover, the photopolymerization initiator may be used either alone or as a combination of two or more kinds.

As the photopolymerization initiator, for example, an organic halide compound, an oxydiazol compound, a carbonyl compound, a ketal compound, a benzoin compound, an acridine compound, an organic peroxide compound, an azo compound, a coumarin compound, an azide compound, a metallocen compound, a hexaaryl biimidazol compound, an organic boracic acid compound, disulfonic acid compound, an oxime ester compound, an onium salt compound, an acyl phosphine (oxide) compound, an alkyl amino compound, or the like may be presented.

Hereafter, each compound will be described in detail.

As the organic halide compound, specifically, compounds disclosed in "Bull Chem. Soc Japan" 42, 2924 (1969) by Wakabayashi et al., the specification of U.S. Pat. No. 3,905, 815, Japanese Patent Application Publication (JP-B) No. 46-4605, JP-A Nos. 48-36281, 55-32070, 60-239736, 61-169835, 61-169837, 62-58241, 62-212401, 63-70243, 63-298339, "Journal of Heterocyclic Chemistry" 1 (No 3), 1970)" by M. P. Hutt, or the like may be presented. In particular, an oxazol compound with a trihalomethyl group substituted and s-triazine compound may be presented.

As the s-triazine compound, more preferably, a s-triazine derivative with at least one mono-, di- or trihalogen substituted methyl group bonded with a s-triazine ring, more specifically, for example, 2,4,6-tris(monochloro methyl)-s-triazine, 2,4,6-tris(dichloro methyl)-s-triazine, 2,4,6-tris(trichloro methyl)-s-triazine, 2-methyl-4,6-bis(trichloro methyl)-s-triazine, 2-n-propyl-4,6-bis(trichloro methyl)-s-triazine, 2-(α,α,β-trichloro ethyl)-4,6-bis(trichloro methyl)-s-triazine, 2-phenyl-4,6-bis(trichloro methyl)-s-triazine, 2-(p-methoxy phenyl)4,6-bis(trichloro methyl)-s-triazine, 2-(3,4-epoxy phenyl)-4,6-bis(trichloro methyl)-s-triazine, 2-(p-chloro phenyl)-4,6-bis(trichloro methyl)-s-triazine, 2-[1-(p-methoxy phenyl)-2,4-butadienyl]-4,6-bis(trichloro methyl)-s-triazine, 2-styryl-4,6-bis(trichloro methyl)-s-triazine, 2-(p-methoxy styryl)-4,6-bis(trichloro methyl)-s-triazine, 2-(p-i-propyloxy styryl)-4,6-bis(trichloro methyl)-s-triazine, 2-(p-tolyl)-4,6-bis(trichloro methyl)-s-triazine, 2-(4-nathoxy naphtyl)-4,6-bis(trichloro methyl)-s-triazine, 2-phenyl thio-4,6-bis(trichloro methyl)-s-triazine, 2-benzyl thio-4,6-bis (trichloro methyl)-s-triazine, 2,4,6-tris(dibromo methyl)-s-triazine, 2,4,6-tris(tribromo methyl)-s-triazine, 2-methyl-4, 6-bis(tribromo methyl)-s-triazine, 2-methoxy-4,6-bis (tribromo methyl)-s-triazie, or the like may be presented.

As the oxydiazol compound, 2-trichloro methyl-5-styryl-1,3,4-oxodiazol, 2-trichloro methyl-5-(cyano styryl)-1,3,4-oxodiazol, 2-trichloro methyl-5-(naphto-1-yl)-1,3,4-oxodiazol, 2-trichloro methyl-5-(4-styryl)styryl-1,3,4-oxodiazol, or the like may be presented.

As the carbonyl compound, benzophenone derivatives such as benzophenone, Michler's ketone, 2-methyl benzophenone, 3-methyl benzophenone, 4-methyl benzophenone, 2-chloro benzophenone, 4-bromo benzophenone and 2-carboxy benzophenone, acetophenone derivatives such as 2,2-dimethoxy-2-phenyl acetophenone, 2,2-diethoxy acetophenone, 1-hydroxy cyclohexyl phenyl ketone, α-hydrotoxy-2-methyl phenyl propanone, 1-hydroxy-1-methyl ethyl-(p-isopropyl phenyl) ketone, 1-hydroxy-1-(p-dodecyl phenyl) ketone, 2-methyl-(4'-(methyl thio) phenyl)-2-morpholino-1-propanone, 1,1,1-trichyloro methyl-(p-butyl phenyl)ketone and 2-benzyl-2-dimethyl amino-4-morpholino butylophenone, thioxantone derivatives such as thioxanthone, 2-ethyl thioxantone, 2-isopropyl thioxantone, 2-chloro thioxantone, 2,4-dimethyl thioxantone, 2,4-diethyl thioxantone and 2,4-dilsopropyl thioxantone, benzoate derivatives such as p-dimethyl amino ethyl benzoate and p-diethyl amino ethyl benzoate, or the like may be presented.

As the ketal compound, benzyl methyl ketal, benzyl-β-methoxy ethyl ethyl acetal, or the like may be presented.

As the benzoin compound, m benzoin isopropyl ether, benzoin isobutyl ether, benzoin methyl ether, methyl o-benzoyl benzoate, or the like may be presented.

As the acridine compound, 9-phenyl acridine, 1,7-bis(9-acridinyl) heptanes, or the like may be presented.

As the organic peroxide compound, for example, trimethyl cyclohexanone peroxide, acetyl acetone peroxide, 1,1-bis (tert-butyl peroxy)-3,3,5-trimethyl cyclohexane, 1,1-bis(tert-butyl peroxy) cyclohexane, 2,2-bis(tert-butyl peroxy) butane, tert-butyl hydroperoxide, cumene hydroperoxide, diisopropyl benzene hydroperoxide, 2,5-dimethyl hexane-2,5-dihydroperoxide, 1,1,3,3-tetramethyl butyl hydroperoxide, tert-butyl cumyl peroxide, dicumyl peroxide, 2,5-dimethyl-2,5-di(tert-butyl peroxy) hexane, 2,5-oxanoyl peroxide, succinic peroxide, benzoyl peroxide, 2,4-dichloro benzoyl peroxide, diisopropyl peroxy dicarbonate, di-2-ethyl hexyl peroxy dicarbonate, di-2-ethoxy ethyl peroxy dicarbonate, dimethoxy isopropyl peroxy carbonate, di(3-methyl-3-methoxy butyl) peroxy dicarbonate, tert-butyl peroxy acetate, tert-butyl peroxy pivalate, tert-butyl peroxy neodecanoate, tert-butyl peroxy octanoate, tert-butyl peroxy laurate, tercyl carbonate, 3,3',4,4'-tetra-(t-butyl peroxy carbonyl) benzophenone, 3,3',4,4^tetra-(t-hexyl peroxy carbonyl) benzophenone, 3,3',4,4'-tetra-(p-isopropyl cumyl peroxy carbonyl) benzophenone, carbonyl di(t-butyl peroxy diphthalate dihydrogen), carbonyl di-(t-hexyl peroxy diphthalate dihydrogen), or the like may be presented.

As the azo compound, for example, the azo compounds described in JP-A No. 8-108621, or the like may be presented.

As the coumarin compound, for example, 3-methyl-5-amino-((s-triazine-2-yl) amino)-3-phenyl coumarin, 3-chloro-5-diethyl amino-((s-triazine-2-yl) amino)-3-phenyl coumarin, 3-butyl-5-dimethyl amino-((s-triazine-2-yl) amino)-3-phenyl coumarin, or the like may be presented.

As the azide compound, the organic azide compounds described in U.S. Pat. Nos. 2,848,328, 2,852,379 and 2,940, 853, 2,6-bis(4-azide benzylidene)-4-ethyl cyclohexanone (BAC-E), or the like may be presented.

As the metallocen compound, various titanocene compounds described in JP-A Nos. 59-152396, 61-151197, 63-41484, 2-249, 2-4705 and 5-83588, such as di-cyclopentadienyl-Ti-bis phenyl, di-cyclopentadienyl-Ti-bis-2,6-difluoropheny-1-yl, di-cyclopentadienyl-Ti-bis-2,4-difluoropheny-1-yl, di-cyclopentadienyl-Ti-bis-2,4,6-trifluoropheny-1-yl, di-cyclopentadienyl-Ti-bis-2,3,5,6-tetrafluoropheny-1-yl, di-cyclopentadienyl-Ti-bis-2,3,4,5,6-pentafluopheny-1-yl, di-methyl cyclopentadienyl-Ti-bis-2,6-difluoropheny-1-yl, di-methyl cyclopentadienyl-Ti-bis-2,4,6-trifluoropheny-1-yl, di-methyl cyclopentadienyl-Ti-bis-2,3,5,6-tetrafluoropheny-1-yl, di-methyl cyclopentadienyl-Ti-bis-2,3,4,5,6-pentafluoropheny-1-yl, iron-arene complexes described in JP-A Nos. 1-304453 and 1-152109, or the like may be presented.

As the hexaaryl biimidazol compound, for example, various compounds described in JP-B No. 6-29285, U.S. Pat. Nos. 3,479,185, 4,311,783, 4,622,286, or the like, specifically, 2,2'-bis (o-chlorophenyl)-4,4', 5,5'-tetraphenyl biimidazol, 2,2'-bis(o-bromo phenyl) 4,4', 5,5'-tetraphenyl biimidazol, 2,2'-bis(o,p-dichlorophenyl)-4,4', 5,5'-tetraphenyl biimidazol, 2,2'-bis(o-chlorophenyl)-4,4', 5,5'-tetra (m-methoxy phenyl) biimidazol, 2,2'-bis (o,o'-dichlorophenyl)-4,4', 5,5'-tetraphenyl biimidazol, 2,2'-bis (o-nitrophenyl)-4,4', 5,5'-tetraphenyl biimidazol, 2,2'-bis(o-methyl phenyl)-4,4'-5, 5'-tetraphenyl bimidazol, 2,2'-bis(o-trifluoro phenyl)-4,4', 5,5'-tetraphenyl biimidazol, or the like may be presented.

As the organic borate compound, for example, the organic borates described in JP-A Nos. 62-143044, 62-150242, 9-188685, 9-188686, 9-188710, 2000-131837 and 2002-107916, Japanese Patent No. 2,764,769, JP-A No.2002-116539, or the like, and "Rad Tech '98. Proceeding Apr. 19-22, 1998, Chicago" by Kunz, Martin, or the like, the organic sulfonium borate complexes or the organic oxosulfonium borate complexes described in JP-A Nos. 6-157623, 6-175564 and 6-175561, the organic iodonium borate complexes disclosed in JP-A Nos. 6-175554 and 6-175553, the organic phosphonium borate complexes disclosed in JP-A No. 9-188710, the organic boron transition metal coordinate complexes of JP-A Nos. 6-348011, 7-128785, 7-140589, 7-306527 and 7-292014, or the like may be presented as the specific examples.

As the disulfonic acid compound, the compounds described in JP-A No. 61-166544, the specification of JP-A No. 2002-328465, or the like may be presented.

As the oxime ester compound, the compounds described in J. C. S. Perkin II (1979) 1653-1660), J. C. S. Perkin II (1979) 156-162, Journal of Photopolymer Science and Technology (1995) 202-232, and JP-A No. 2000-66385, the compounds described in JP-A No. 2000-80068 and Japanese Patent Application National Phase Publication No. 2004-534797, or the like may be presented.

As the onium salt compound, for example, the diazonium salts disclosed in S. I. Schlesinger, Photogr. Sci. Eng., 18,387 (1974), and T. S. Bal et al, Polymer, 21,423 (1980), the ammonium salts disclosed in the specification of U.S. Pat. No. 4,069,055 and JP-A No. 4-365049, the phosphonium salts disclosed in U.S. Pat. Nos. 4,069,055 and 4,069,056, the iodonium salts described in European Patent No. 104,143, U.S. Pat. Nos. 339,049 and 410,201, and JP-A Nos. 2-150848 and 2-296514, or the like may be presented.

The iodonium salt to be used preferably in the invention is diaryl iodonium salt. From the viewpoint of the stability, it is preferably substituted by two or more by an electron donating group such as an alkyl group, an alkoxy group and an aryloxy group.

As the sulfonium salt to be used preferably in the invention, the sulfonium salts disclosed in the European Patent Nos. 370,693, 390,214, 233,567, 297,443 and 297,442, U.S. Pat. Nos. 4,933,377, 161,811, 410,201, 339,049, 4,760,013, 4,734,444 and 2,833,827, and the German Patent Nos. 2,904, 626, 3,604,580 and 3,604,581 may be presented. From the viewpoint of the stability, it is preferably substituted by an electron attracting group. It is preferable that the electron attracting group has a Hammett value of more than 0. As the preferable electron attracting group, a halogen atom, a carboxylic acid, or the like may be presented.

Moreover, as another preferable sulfonium salts, a sulfonium salt having the absorption at 300 nm or more, with one of the substituents of a triaryl sulfonium salt having a coumarin, anthraquinone structure may be presented. As another preferable sulfonium salt, a sulfonium salt having the absorption at 300 nm or more, with a triaryl sulfonium salt having an allyloxy group, an arylthio group as a substituent may be presented.

Moreover, as the onium salt compound, the onium salts such as the selenonium salts described in J. V. Crivello et al, Macromolecules, 10 (6), 1307 (1977, J. V. Crivello et al, J. Polymer Sci., Polymer Chem. Ed., 17, 1047 (1979), and the arsonium salts described in C. S. Wen et al, Tech, Proc. Conf. Rad. Curing ASIA, p478 Tokyo, Oct (1988), or the like may be presented. As the acyl phosphine (oxide) compound, IRUGACURE 819, DAROCURE 4265, DAROCURE TPO manufactured by Chiba Specialty Chemicals Corp., or the like may be presented.

As the alkyl amino compound, for example, the compounds having an a dialkyl amino phenyl group or the alkyl amine compounds disclosed in the paragraph No. [0047] in JP-A No. 9-281698, JP-A Nos. 6-19240 and 6-19249, or the like may be presented. Specifically, as the compounds having a dialkyl amino phenyl group, compounds such as p-dimethyl amino benzoate, and dialkyl amino phenyl carbaldehydes such as p-diethyl amino benzcarbaldehyde and 9-julolydyl carbaldehyde may be presented, and as the alkyl amine compound, triethanol amine, diethanol amine, triethyl amine, or the like may be presented.

<Photo Polymerization Initiator (B)>

From the viewpoint of the exposure sensitivity, the photopolymerization initiator (B) to be used in the invention is preferably a compound selected from the group consisting of a triazine-based compound, an alkyl amino compound, a benzyl dimethyl ketal compound, an α-hydroxy ketone compound, an α-amino ketone compound, an acyl phosphine-based compound, a phosphine oxide-based compound, a metallocen compound, an oxime-based compound, a biimidazol-based compound, an onium-based compound, a benzothiazol-based compound, a benzophenone-based compound, an acetophenone-based compound and a derivative thereof, a cyclopentadiene-benzene-iron complex and a salt thereof, a halomethyl oxadiazol compound, and a 3-aryl substituted coumarin compound.

It is more preferably a triazine-based compound, an alkyl amino compound, an α-amino ketone compound, an acyl phosphine-based compound, a phosphine oxide-based compound, an oxime-based compound, a biimidazol-based compound, an onium-based compound, a benzophenone-based compound, or an acetophenone-based compound. It is further preferably a compound as at least one selected from the group consisting of a triazine-based compound, an alkyl amino compound, an oxime based-compound and a biimidazol-based compound. The content amount of the photopolymerization initiator (B) with respect to the total solid component of the curable composition of the invention is preferably 0.1% by mass to 50% by mass, it is more preferably 0.5% by mass to 30% by mass, and it is particularly preferably 1% by mass to 20% by mass. According to the range, preferable sensitivity and pattern forming property may be obtained.

<Compound Containing an Ethylenically Unsaturated Double Bond (C)>

The curable composition of the invention may contain a compound containing an ethylenically unsaturated double bond other than the above-mentioned resin (hereafter, it may be referred to simply as a "compound containing an ethylenically unsaturated double bond"). The compound containing an ethylenically unsaturated double bond to be used in the invention may be selected from the addition-polymerization compounds having at least one ethylenically unsaturated double bond, other than the above-mentioned resin, having at least one end ethylenically unsaturated bond, preferably two or more of them. Such a compound group is widely known in this industrial field, and thus it may be used in the invention without any limitation. They have the chemical embodiments of for example, the monomer, the prepolymer, that is, the oligomer having a dimer or a trimer, a mixture thereof and a copolymer thereof. As the examples of the monomer and the copolymer thereof, unsaturated carboxylic acids (such as acrylic acid, methacrylic acid, itaconic acid, crotonic acid, isocrotonic acid, and maleic acid), esters thereof, and amides thereof may be presented. Preferably, esters of an unsaturated carboxylic acid and an aliphatic polyhydric alcohol compound, and amides of an unsaturated carboxylic acid and an aliphatic polyvaleic amine compound may be used. Moreover, an addition reaction product of unsaturated carboxylic acid esters or amides having a nucleophilic substitute such as a hydroxyl group, an amino group and a mercapto group, and monofunctional or polyfunctional isocianates or epoxys, or dehydration condensation reaction products with a monofunctional or polyfunctional carboxylic acid, or the like may also be used preferably. Moreover, addition reaction products of unsaturated carboxylic acid esters or amides having an electrophilic substituent such as an isocyanate group and an epoxy group, and monofunctional or polyfunctional alcohols, amines or thiols, and furthermore, substitution reaction products of unsaturated carboxylic acid esters or amides having an eliminating substituent such as a halogen group and a tocyloxy group, and monofunctional or polyfunctional alcohols, amines or thiols are also preferable. Moreover, as another example, a compound group with the above-mentioned unsaturated carboxylic acids replaced by an unsaturated phosphonic acid, styrene, vinyl ether, or the like may also be used.

As a specific example of a monomer of an ester of an aliphatic polyhydric alcohol compound and unsaturated carboxylic acid, there are acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, and isocyanuric acid EO-modified triacrylate.

There are methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis-[p-(methacryloxyethoxy)phenyl]dimethylmethane.

There are itaconic acid esters such as ethylene glycol diitaconate, propylene glycol diitaconate, 1,3-butane diol diitaconate, 1,4-butane diol diitaconate, tetramethylene glycol diitaconate, pentaerythritol diitaconate, and sorbitol tetraitaconate. There are crotonic acid esters such as ethylene glycol dicrotonate, tetramethylene glycol dicrotonate, and pentaerythritol dicrotonate. There are isocrotonic acid esters such as ethylene glycol diisocrotonate, pentaerythritol diisocrotonate, and sorbitol tetraisocrotonate. There are maleic acid esters such as ethylene glycol dimaleate, triethylene glycol dimaleate, pentaerythritol dimaleate, and sorbitol tetramaleate.

As an example of other ester, for example, aliphatic alcohol-based esters described in JP-B No. 51-47334, and JP-A No. 57-196231, esters having an aromatic skeleton described in JP-A No. 59-5240, JP-A No. 59-5241, and JP-A No. 2-226149, and esters containing an amino group described in JP-A No. 1-165613 are also preferably used. Further, the aforementioned ester monomers may be also used as a mixture.

In addition, as a specific example of a monomer of amide of an aliphatic polyhydric amine compound and unsaturated carboxylic acid, there are methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, and xylylenebismethacrylamide. Examples of other preferable amide-based monomer include monomers having a cyclohexylene structure described in JP-B No. 54-21726.

Moreover, a urethane-based addition-polymerization compound produced using the addition reaction of isocyanate and a hydroxyl group is also preferable. As a specific example thereof, for example, the vinyl urethane compounds containing two or more polymerizable vinyl groups in a molecule with a vinyl monomer containing a hydroxyl group in a compound represented by the following formula (A) added to a polyisocyanate compound having two or more isocyanate groups in a molecule described in JP-B No. 48-41708, or the like may be presented.

$$CH_2=C(R^{10})COOCH_2CH(R^{11})OH \qquad \text{formula (A)}$$

(wherein $R^{10}$ and $R^{11}$ represent H or $CH_3$.)

In addition, urethane acrylates described in JP-A No. 51-37193, JP-B No. 2-32293, and JP-B No. 2-16765, and urethane compounds having an ethylene oxide-based skeleton described in JP-B No. 58-49860, JP-B No. 56-17654, JP-B No. 62-39417, and JP-B No. 62-39418 are also preferable. Furthermore, by using addition-polymerization compounds having an amino structure or a sulfide structure in a molecule, described in JP-A No. 63-277653, JP-A No. 63-260909, and JP-A No. 1-105238, a photopolymerizable composition, which is very excellent in a photosensitive speed, can be obtained.

Other examples include polyfunctional acrylates and methacrylates such as polyester acrylates, and epoxy acrylates obtained by reaction of an epoxy resin and (meth)acrylic acid, described in each gazette of JP-A No. 48-64183, JP-B No. 49-43191, and JP-B No. 52-30490. In addition, examples include specified unsaturated compounds described in JP-B No. 46-43946, JP-B No. 1-40337, and JP-B No. 1-40336, and vinylphosphonic acid-based compounds described in JP-A No. 2-25493. In some cases, a structure containing a perfluoroalkyl group described in JP-A No. 61-22048 is preferably used. Furthermore, compounds which are introduced as a photocurable monomer and oligomer in Journal of Adhesion Society of Japan, vol.20, No. 7, p. 300-308 (1984) can be also used.

Details of the structure, use alone or in combination, the addition amount, or the like, of these addition-polymerization compounds may be optionally set according to the performance design of the curable composition. For example, they may be selected from the following viewpoints.

In terms of the sensitivity, a structure with a large amount of the unsaturated group content per molecule is preferable. In many cases, those of bifunctional or more are preferable. Moreover, for improving the strength of the image part, that is, the cured film, those of trifunctional or more are preferable. Furthermore, the method of adjusting both the sensitivity and the strength by using in combination those of different number of functional groups and different polymerizable groups (such as acrylic acid ester, methacrylic acid ester, styrene-based compound, vinyl ether-based compound) is also effective. From the viewpoint of the curing sensitivity, it is preferable to use a compound containing two or more (meth)acrylic acid ester structures, it is more preferable to use a compound containing three or more of them, and it is most preferable to use a compound containing four or more of them. Moreover, from the viewpoint of the curing sensitivity and the developability of the unexposed part, it is preferable to contain an EO-modified substance. Moreover, from the viewpoint of the curing sensitivity and the exposed part strength, it is preferable to contain a urethane bond.

Moreover, also with respect to the compatibility and the dispersion property with the other components (such as a resin, a photopolymerization initiator and a pigment) in the curable composition, selection and usage of the addition polymerization compound is an important factor. For example, use of a low purity compound or use of two or more kinds in combination may improve the compatibility. Moreover, for the purpose of improvement of the adhesion property with the substrate, or the like, a specific structure may be selected. From the above-mentioned viewpoints, bisphenol A diacrylate, bisphenol A diacrylate EO-modified substance, trimethylol propane triacrylate, trimethylol propane tri(acryloyloxy propyl) ether, trimethylol ethane triacrylate, tetraethylene glycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxy ethyl) isocyanurate, pentaerythritol tetraacrylate EO-modified substance, dipentaerythritol hexaacrylate EO-modified substance, or the like may be presented as preferable examples. Moreover, as to the commercially available products, urethane oligomer UAS-10, UAB-140 (manufactured by Sanyo Kokusaku Pulp Corp.), DPHA-40H (manufactured by Nippon Kayaku Co., Ltd.), UA-306H, UA-306T, UA-306I, AH-600, T-600, AI-600 (manufactured by Kyoeisha Chemical CO., Ltd.), and UA-7200 (manufactured by Shin-Nakamura Chemical. Co., Ltd.) are preferable. Among these, EO-modified bisphenol A diacrylate, pentaerythritol triacrylate, pentaerythritol tetraacrylate, dipentaerythritol pentaacrylate, dipentaerythritol hexaacrylate, tri(acryloyloxyethyl) isocyanurate, EO-modified pentaerythritol tetraacrylate, and EO-modified dipentaerythritol hexaacrylate are more preferable. As a commercially available product, DPHA-40H (manufactured by Nippon Kayaku Co., Ltd.), UA-306H, UA-306T, UA-306I, AH-600, T-600, and AI-600 (manufactured by Kyoeisha Chemical CO., LTd.) are more preferable.

The content amount of the compound containing the ethylenically unsaturated double bond other than the resin (C) in the invention; the above-mentioned resin (A) in the solid component in the curable composition of the invention is preferably from 1% by mass to 90% by mass, it is more preferably from 5% by mass to 80% by mass, and it is further preferably from 10% by mass to 70% by mass.

In particular, in the case of using the curable composition of the invention for formation of a colored pattern of a color filter, the content amount of the compound containing the ethylenically unsaturated double bond other than (C) resin is preferably from 5% by mass to 50% by mass, it is more preferably from 7% by mass to 40% by mass, and it is further preferably from 10% by mass to 35% by mass in the above-mentioned range. Moreover, from the viewpoint of the sensitivity and the eliminating property (developability) of the unexposed part, the content ratio (mass ratio) of the above-mentioned resins (A) and (C); the compound containing the ethylenically unsaturated double bond other than the resin (A) is preferably (A)/(C) of from 0.001 to 100, it is more preferably from 0.005 to 50, and it is further preferably from 0.01 to 10.

<Coloring Agent (D)>

It is preferable that the curable composition of the invention contains a coloring agent (D).

The coloring agent to be contained in the curable composition of the invention is not particularly limited, and various conventionally known dyes and pigments may be used by one kind or as a mixture of two or more kinds. From the viewpoint of the endurance such as the heat resistance and the light resistance, the coloring agent is preferably a pigment.

As the pigment to be contained in the curable composition of the invention, various conventionally known inorganic pigments or organic pigments may be used, and those with a high transmittance are preferable.

As the inorganic pigment, metal compounds shown as a metal oxide, a metal complex salt, or the like may be presented. Specifically, metal oxides of iron, cobalt, aluminum, cadmium, lead, copper, titanium, magnesium, chromium, zinc, antimony, or the like, and composite oxides of the above-mentioned metals may be presented.

As the organic pigments, for example:

C. I. Pigment yellow 11, 24, 31, 53, 83, 93, 99, 108, 109, 110, 138, 139, 147, 150, 151, 154, 155, 167, 180, 185, 199;

C. I. Pigment Orange 36, 38, 43, 71;

C. I. Pigment Red 81, 105, 122, 149, 150, 155, 171, 175, 176, 177, 209, 220, 224, 242, 254, 255, 264, 270;

C. I. Pigment Violet 19, 23, 32, 39;

C. I. Pigment Blue 1, 2, 15, 15:1, 15:3, 15:6, 16, 22, 60, 66;

C. I. Pigment Green 7, 36, 37:

C. I. Pigment Brown 25, 28;

C. I. Pigment Black 1, 7;

Carbon black, or the like may be presented.

In the invention, those having a basic N atom in the structural formula of the pigment may be used particularly preferably. Pigments having a basic N atom exhibit a favorable dispersion property in the composition of the invention. Although the reason there for this is not sufficiently understood, it is presumed that the good affinity of the photosensitive polymerization component and the pigment exerts an influence.

As the pigments to be used preferably in the invention, the following may be presented. However, the invention is not limited thereto:

C. I. Pigment yellow 11, 24, 108, 109, 110, 138, 139, 150, 151, 154, 167, 180, 185;

C. I. Pigment Orange 36, 71;

C. I. Pigment Red 122, 150, 171, 175, 177, 209, 224, 242, 254, 255, 264;

C. I. Pigment Violet 19, 23, 32;

C. I. Pigment Blue 15:1, 15:3, 15:6, 16, 22, 60, 66;

C. I. Pigment Black 1.

These organic pigments can be used alone, or by variously combining them in order to enhance a color purity. Examples of the combination are shown below. For example, an anthraquinone-based pigment, a perylene-based pigment, or a diketopyrrolopyrrole-based pigment alone as a red pigment, or a mixture of at least one kind of them, and a disazo-based yellow pigment, an isoindoline-based yellow pigment, a quinophthalone-based yellow pigment or a perylene-based red pigment can be used. For example, the anthraquinone-based pigment includes C.I. Pigment Red 177, the perylene-based pigment includes C.I. Pigment Red 155, and C.I. Pigment Red 224, and the diketopyrrolopyrrole-based pigment includes C.I. Pigment Red 254. From a color reproductivity, a mixture with C.I. Pigment Yellow 139 is preferable. A mass ratio between the red pigment and the yellow pigment is preferably 100:5 to 100:50. When the ratio is 100:4 or less, it is difficult to suppress light transmittance of 400 nm to 500 nm, and a color purity cannot be enhanced in some cases. In addition, when the ratio is 100:51 or more, a main wavelength becomes towards a short wavelength, and a deviation from a NTSC goal hue becomes great in some cases. Particularly, the mass ratio is optimally in a range of 100:10 to 100:30. In the case of a combination of red pigments, the ratio can be adjusted in conformity with a chromaticity.

Moreover, as a green pigment, a halide phthalocyanine-based pigment alone, or a mixture thereof with a disazo-based yellow pigment, quinophthalone-based yellow pigment, an azomethine-based yellow pigment, or an isoindoline-based yellow pigment may be used. For example, as the examples thereof, a mixture of the C. I. Pigment Green 7, 36, 37 and C. I. Pigment Yellow 83, C. I. Pigment Yellow 138, C. I. Pigment Yellow 139, C. I. Pigment Yellow 150, C. I. Pigment Yellow 180 or C. I. Pigment Yellow 185 is preferable. The mass ratio of the green pigment and the yellow pigment is preferably 100:5 to 100:150. The above-mentioned mass ratio is particularly preferably in a range of 100:30 to 100:120.

As the blue pigment, a phthalocyanine-based pigment can be used alone, or a mixture of this with a dioxazine-based purple pigment can be used. For example, a mixture of C.I. Pigment Blue 15:6 and C.I. Pigment Violet 23 is preferable. A mass ratio of the blue pigment and the purple pigment is preferably 100:0 to 100:30, more preferably 100:10 or less.

In addition, as a pigment for a black matrix, carbon, titanium carbon, iron oxide, and titanium oxide are used alone, or a mixture thereof is used. A combination of carbon and titanium carbon is preferable. A mass ratio of carbon and titanium carbon is preferably in a range of 100:0 to 100:60.

The average particle size of the pigment in the case of using the same for a color filter is preferably 100 nm or less from the viewpoint of the color irregularity and the contrast, and furthermore, it is preferably 5 nm or more from the viewpoint of the dispersion stability. The average particle size of the pigment is more preferably 5 to 75 nm, it is further preferably 5 to 55 nm, and it is particularly preferably 5 to 35 nm.

The average particle size of the pigment may be measured by a known method such as an electron microscope.

In particular, the pigment is preferably a pigment selected from the group consisting of an anthraquinone series, an azomethine series, a benzylidene series, a cyanine series, a diketopyrolopyrol series, and a phthalocyanine series.

Moreover, in the case of using the composition of the invention for a color filter, from the viewpoint of the color irregularity and the contrast, it is preferable to use a dye to be dissolved homogeneously in the composition.

The dye to be used as a coloring agent contained in the curable composition of the invention is not particularly limited, and the dyes for a color filter, conventionally known may be used. For example, the pigments disclosed in JP-A Nos. 64-90403, 64-91102, 1-94301 and 6-11614, Japanese Patent Registration No. 2,592,207, the specification of U.S. Pat. Nos. 4,808,501, 5,667,920 and 5,059,500, JP-A No. 5-333207, 6-35183, 6-51115, 6-194828, 8-211599, 4-249549, 10-123316, 11-302283, 7-286107, 2001-4823, 8-15522, 8-29771, 8-146215, 11-343437, 8-62416, 2002-14220, 2002-14221, 2002-14222, 2002-14223, 8-302224, 8-73758, 8-179120 and 8-151531, or the like may be used.

As a chemical structure, dyes of a pyrazoleazo series, an anilinoazo series, a triphenylmethane series, an anthraquinone series, an anthrapyridone series, a benzylidene series, an oxonol series, a pyrazolotriazol series, a pyridoneazo series, a cyanine series, a phenothiazine series, a pyrrolopyrazoleazomethine series, a xanthene series, a phthalocyanine series, a benzopyran series, and an indigo series can be used.

In addition, when after pattern light exposure of the curable composition and curing of an exposed part, an unexposed part is removed with water or alkali development to form a pattern, for example, when a colored pattern of a resist or a color filter is formed, an acid dye and/or a derivative thereof can be suitably used in some cases, from a viewpoint of that a binder and a dye at a light-unirradiated part resulting from development are completely removed.

In addition, a direct dye, a basic dye, a mordant dye, an acid mordant dye, an azoic dye, a disperse dye, an oil soluble dye, a food dye and/or a derivative thereof can be also used usefully.

The acidic dye is not particularly limited as long as it has an acidic group such as a sulfonic acid and a carboxylic acid, and it may be selected in consideration of the required performances such as the dissolving property to an organic solvent or a developing solution, the salt forming property with a basic compound, the light absorption degree, the interaction with the other components in the composition, the light and the heat resistance totally.

The following are examples of the acid dye, however the invention is not restricted to them. Examples include:

acid alizarin violet N;

acid black 1, 2, 24, 48;

acid blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, 340;

acid chrome violet K;

acid Fuchsin;

acid green 1, 3, 5, 9, 16, 25, 27, 50, 58, 63, 65, 80, 104, 105, 106, 109;

acid orange 6, 7, 8, 10, 12, 26, 50, 51, 52, 56, 62, 63, 64, 74, 75, 94, 95, 107, 108, 169, 173;

acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422, 426;

acid violet 6B, 7, 9, 17, 19;

acid yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, 251;

Direct Yellow 2, 33, 34, 35, 38, 39, 43, 47, 50, 54, 58, 68, 69, 70, 71, 86, 93, 94, 95, 98, 102, 108, 109, 129, 136, 138, 141;

Direct Orange 34, 39, 41, 46, 50, 52, 56, 57, 61, 64, 65, 68, 70, 96, 97, 106, 107;

Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, 250;

Direct Violet 47, 52, 54, 59, 60, 65, 66, 79, 80, 81, 82, 84, 89, 90, 93, 95, 96, 103, 104;

Direct Blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275, 293;

Direct Green 25, 27, 31, 32, 34, 37, 63, 65, 66, 67, 68, 69, 72, 77, 79, 82;

Mordant Yellow 5, 8, 10, 16, 20, 26, 30, 31, 33, 42, 43, 45, 56, 50, 61, 62, 65;

Mordant Orange 3, 4, 5, 8, 12, 13, 14, 20, 21, 23, 24, 28, 29, 32, 34, 35, 36, 37, 42, 43, 47, 48;

Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94, 95;

Mordant Violet 2, 4, 5, 7, 14, 22, 24, 30, 31, 32, 37, 40, 41, 44, 45, 47, 48, 53, 58;

Mordant Blue 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, 84;

Mordant Green 1, 3, 4, 5, 10, 15, 19, 26, 29, 33, 34, 35, 41, 43, 53;

Food Yellow 3;

and derivatives of these dyes.

Among the above acid dyes, dyes such as acid black 24; acid blue 23, 25, 29, 62, 80, 86, 87, 92, 138, 158, 182, 243, 324:1;

acid orange 8, 51, 56, 74, 63;

acid red 1, 4, 8, 34, 37, 42, 52, 57, 80, 97, 114, 143, 145, 151, 183, 217, 249;

acid violet 7;

acid yellow 17, 25, 29, 34, 42, 72, 76, 99, 111, 112, 114, 116, 134, 155, 169, 172, 184, 220, 228, 230, 232, 243;

Acid Green 25 and derivatives of these dyes are preferable.

In addition to the above dyes, acid dyes of an azo series, a xanthene series, and a phthalocyanine series are also preferable, and acid dyes such as C.I. Solvent Blue 44, 38; C.I. Solvent Orange 45; Rhodamine B, and Rhodamine 110, and derivatives of these dyes are also preferably used.

Among these, the coloring agent (D) is preferably a coloring agent selected from a triallylmethane series, an anthraquinone series, an azomethine series, a benzylidene series, an oxonol series, a cyanine series, a phenothiazine series, a pyrrolopyrazoleazomethine series, a xanthene series, a phthalocyanine series, a benzopyran series, an indigo series, a pyrazoloazo series, an anilinoazo series, a pyrazolotriazolazo series, a pyridoneazo series, and an anthrapyridone series.

The content amount of the coloring agent in the curable composition of the invention including the case of the use for the colored pattern formation of the color filter is preferably from 30% by mass or more to 85% by mass or less, it is more preferably from 40% by mass or more to 80% by mass or less, and it is most preferably from 50% by mass or more to 75% by mass or less.

<Binder Polymer (E)>

The curable composition of the invention may contain a binder polymer (E) within a range not to deteriorate the effect of the invention for the purpose of improvement of the coating film, or the like.

It is preferable to use a linear organic polymer as the binder polymer. As such a "linear organic polymer", those conventionally known may optionally be used. Preferably, for enabling water development or weak alkaline water development, a linear organic polymer soluble or swellable in water or weak alkaline water is selected. The linear organic polymer is selected and used according to the application not only as a coating film forming agent but also as water, weak alkaline water or organic solvent developing agent. For example, use of a water soluble organic polymer enables the water development. As such a linear organic polymer, a radical polymerization product having a carboxylic acid group in the side chain, such as a resin obtained by polymerizing or copolymerizing a monomer having a carboxylic group, a resin obtained by hydrolysis, half-esterification or half-amidation of an acid anhydride unit manufactured by polymerization or copolymerization of a monomer having an acid hydride, an epoxy acrylate obtained by modifying an epoxy resin with an unsaturated monocarboxylic acid and an acid hydride, or the like, described in for example JP-A No. 59-44615, JP-B Nos. 54-34327, 58-12577 and 54-25957, JP-A Nos. 54-92723, 59-53836 an 59-71048 may be presented. As a monomer having a carboxylic acid group, acrylic acid, methacrylic acid, itaconic acid, crotonic acid, maleic acid, fiunaric acid, 4-carboxyl styrene, or the like may be presented. As a monomer having an acid anhydride, a melaic anhydride, or the like may be presented.

Moreover, similarly, there is an acid cellulose derivative having a carboxylic acid group in the side chain. Additionally, those having a cyclic acid anhydride added to a polymer having a hydroxyl group are also useful.

In the case of using the above-mentioned binder polymer as an alkaline soluble copolymer, as a compound to be copolymerized, monomers other than the above-mentioned may also be used. Examples of the other monomers include the following compounds (1) to (12):

(1) Acrylic acid esters, and methacrylic acid esters having an aliphatic hydroxyl group, such as 2-hydroxyethyl acrylate, 2-hydroxypropyl acrylate, 3-hydroxypropyl acrylate, 4-hydroxybutylacrylate, 2-hydroxyethyl methacrylate, 2-hydroxypropyl methacrylate, 3-hydroxypropyl methacrylate, and 4-hydroxybutyl methacrylate.

(2) Alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate, and propargyl acrylate.

(3) Alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate, and propargyl mathacrylate.

(4) Acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, vinylacrylamide, vinylmethacrylamide, N,N-diallylacrylamide, N,N-diallylmethacrylamide, allylacrylamide, and allylmethacrylamide.

(5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(6) Vinyl esters such as vinyl acetate, vinyl chloroacetate, vinyl butyrate, and vinyl benzoate.

(7) Styrenes such as styrene, α-methylstyrene, methylstyrene, chloromethylstyrene, and p-acetoxystyrene.

(8) Vinyl ketones such as methyl vinyl ketone, ethyl vinyl ketone, propyl vinyl ketone, and phenyl vinyl ketone.

(9) Olefins such as ethylene, propylene, isobutylene, butadiene, and isoprene.

(10) N-vinyl pyrolidone, acrylonitrile, methacrylonitrile, or the like;

(11) Unsaturated imides such as maleimide, N-acryloyl acrylic amide, N-acetyl methacrylic amide, N-propionyl methacrylic amide, and N-(p-chloro benzoyl) methacrylic amide;

(12) Methacrylic acid-based monomer with a hetero atom bonded to the α-position, such as the compounds described in JP-A Nos. 2002-309057 and 2002-311569.

Among these examples, the (meth)acrylic resins having an allyl group or a vinyl ester group and a carboxylic group in the side chain, the alkaline soluble resin having a double bond in the side chain described in JP-A Nos. 2000-187322 and 2002-62698, and the alkaline soluble resin having an amide group in the side chain described in JP-A No. 2001-242612 are preferable for these excellent balance of the film strength, the sensitivity and the developability.

In addition, urethane-based binder polymers having an acid group described in JP-B No. 7-12004, JP-B No. 7-120041, JP-B No. 7-120042, JP-B No. 8-12424, JP-A No. 63-287944, JP-A No.63-287947, JP-A No. 1-271741, and Japanese Patent Application No.10-116232, and urethane-based binder polymers having an acid group and a double bond on a side chain described in JP-A No. 2002-107918 are very excellent in a strength and, therefore, are advantageous in low light exposure suitability.

Acetal-modified polyvinyl alcohol-based binder polymers having an acid group described in EP No. 993966, EP No. 1204000, and JP-A No. 2001-318463 are excellent in a balance between a film strength and developability, being suitable.

Furthermore, as a water-soluble linear organic polymer, polyvinylpyrrolidone and polyethylene oxide are useful. In addition, in order to enhance a strength of a cured film, alcohol-soluble nylon, and polyether of 2,2-bis-(4-hydroxyphenyl)-propane and epichlorohydrin are also useful.

The weight average molecular weight of the binder polymer (E) is preferably 3,000 or more, it is further preferably in a range of 5,000 to 300,000. The numerical average molecular weight is preferably 1,000 or more, and it is further preferably in a range of 2,000 to 250,000. The polydispersion degree (weight average molecular weight/numerical average molecular weight) is preferably 1 or more, and it is further preferably in a range of 1.1 to 10.

These binder polymers may either be a random polymer, a block polymer, a graft polymer, or the like.

The binder polymer (E) may be synthesized by the conventionally known methods. As a solvent to be used at the time of the synthesis, for example, tetrahydrofuran, ethylene dichloride, cyclohexanone, methyl ethyl ketone, acetone, methanol, ethanol, ethylene glycol monomethyl ether, ethylene glycol monoethyl ether, 2-methoxy ethyl acetate, diethylene glycol dimethyl ether, 1-methoxy-2-propanol, 1-methoxy-2-propyl acetate, N,N-dimethyl formamide, N,N-dimethyl acetoamide, toluene, ethyl acetate, methyl lactate, ethyl lactate, dimethyl sulfoxide, water, or the like may be presented. These solvents may be used alone or as a mixture of two or more kinds.

As a radical polymerization initiator to be used at the time of synthesizing a binder polymer used in the invention, known compounds such as an azo-based initiator and a peroxide initiator may be presented.

In view of the balance of the pigment dispersion stability and developability over the passage of time, the content amount of the binder polymer (E) when using the curable composition of the invention for the colored pattern formation of a color filter is preferably from 5% by mass to 60% by mass with respect to the total solid component of the curable composition of the invention, more preferably from 7% by mass to 50% by mass, and most preferably from 10% by mass to 40% by mass.

The curable composition of the invention may if necessary further contain the following components to be described in detail.

<(F) Dispersing Agent>

In the case the curable composition of the invention contains a pigment as the coloring agent (D), from the viewpoint of improving the dispersion property of the pigment, it is preferable to add a (F) dispersing agent.

As the dispersing agent (pigment dispersing agent) to be used in the invention, a polymer dispersing agent [such as polyamide amine and a salt thereof, polycarboxylic acid and a salt thereof, high molecular weight unsaturated acid ester, modified polyurethane, modified polyester, modified poly (meth)acrylate, (meth)acrylic-based copolymer, and naphthalene sulfonic acid formalin condensed product], and polyoxy ethylene alkyl phosphoric acid ester, polyoxy ethylene alkyl amine, alkanol amine, pigment derivative, or the like may be presented.

The polymer dispersing agent may be classified further into a linear polymer, an end modified type polymer, a graft type polymer and a block type polymer in terms of the structure.

The polymer dispersing agent adsorbs onto the surface of the pigment so as to function for preventing the re-aggregation. Therefore, an end modified type polymer having an anchor portion to the pigment surface, a graft type polymer and a block type polymer may be presented as the preferable structures. On the other hand, the pigment derivative provides the effect of promoting the adsorption of the polymer dispersing agent by improving the pigments surface.

Specific examples of the pigment dispersing agent to be used in the invention includes "Disperbyk-101 (polyamide amine phosphate), 107 (carboxylic acid ester), 110 (copolymer including an acid base), 130 (polyamide), 161, 162, 163, 164, 165, 166, 170 (polymer copolymerized product)", "BYK-P104, P105 (high molecular weight unsaturated polycarboxylic acid)" manufactured by BYK Chemie Corp., "EFKA4047, 4050, 4010, 4165 (polyurethane-based), EFKA4330, 4340 (block copolymer), 4400, 4402 (modified polyacrylate), 5010 (polyester amide), 5765 (high molecular weight polycarboxylic acid salt), 6220 (fatty acid polyester), 6745 (phthalocyanine derivative), 6750 (azo pigment derivative)" manufactured by EFKA Corp., "AJISPER PB821, PB822" manufactured by Ajinomoto Fan Techno Corp., "FROREN TG-710 (urethane oligomer)", "POLYFLOW No. 50E, No. 300 (acrylic-based copolymer)" manufactured by Kyoeisha Chemical Co., Ltd., "DISPERON KS-860, 873SN, 874, #2150 (aliphatic polyvaleic carboxylic acid), #7004 (polyether ester), DA-703-50, DA-705, DA-725" manufactured by Kusumoto Kasei Corp., "DEMOL RN, N (naphthalene sulfonic acid formalin polycondensation product), MS, C, SN-B (aromatic sulfonic acid formalin polycondensation product)", "HOMOGENOL L-18 (high molecule polycarboxylic acid), "EMARGEN 920, 930, 935, 985 (polyoxy ethylene nonyl phenyl ether)", "ACETAMINE 86 (stearyl amine acetate)" manufactured by Kao Corp., "SOLSPACE 5000 (phthalocyanine derivative), 22000 (azo pigment derivative), 13240 (polyester amine), 3000, 17000, 27000 (polymer having a functional part at the end part), 24000, 28000, 32000, 38500 (graft type polymer)" manufactured by RUBERESOL Corp., "NIKKOL T106 (polyoxy ethylene sorbitan monooleate), MYS-IEX (polyoxy ethylene monostearate)" manufactured by NIKKO CHEMICAL Corp., or the like.

These dispersing agents may be used either alone or as a combination of two or more kinds. In the invention, it is particularly preferable to use a pigment derivative and a polymer derivative in combination.

The content amount of the dispersing agent in the invention with respect to the pigment is preferably from 1% by mass to 100% by mass, it is more preferably from 3% by mass to 100% by mass, and it is further preferably from 5% by mass to 80% by mass.

Specifically, in the case of using a polymer dispersing agent, the use amount thereof with respect to the pigment is preferably in a range of 5% by mass to 100% by mass, and it is more preferably in a range of 10% by mass to 80% by mass. Moreover, in the case of using a pigment derivative, the use amount thereof with respect to the pigment is preferably in a range of 1% by mass to 30% by mass, it is more preferably in a range of 3% by mass to 20% by mass, and it is particularly preferably in a range of 5% by mass to 15% by mass.

In the invention, in the case of using a pigment and a dispersing agent, from the viewpoint of the curing sensitivity and the color density, the total sum of the content amount of the pigment and the dispersing agent with respect to the total solid component of the curable composition is preferably from 35% by mass to 90% by mass, it is more preferably from 45% by mass to 85% by mass, and it is further preferably from 50% by mass to 80% by mass.

<(G) Sensitizing Agent>

It is preferable that the curable composition of the invention contains a (G) sensitizing agent for the purpose of the improvement of the radical generating efficiency of the polymerization initiator and achievement of a long wavelength of the sensitizing wavelength. As the sensitizing agent to be used in the invention, those capable of sensitizing the above-mentioned photopolymerization initiators by the electron transfer mechanism or the energy transfer mechanism are preferable.

As the sensitizing agent to be used in the invention, those belonging to the compounds listed below, and having the absorption wavelength in the 300 nm to 450 nm wavelength range may be presented.

As the preferable sensitizing agent, those belonging to the compounds, and having the absorption wavelength in the 330 nm to 450 nm wavelength range may be presented.

For example, polynucleic aromatic groups (such as phenanthrene, anthracene, pyrene, perylene, triphenylene, and 9,10-dialkoxy anthracene), xantenes (such as fluorescein, eosin, erythrosine, rhodamine B, and rose bengal), thioxantones (isopropyl thioxantone, diethylthioxanthone, chlorothioxantone), cyanines (such as thiacarbocyanine, and oxacarbocyanine), merocyanines (such as merocyanine, carbomerocyanine), phthalocyanines, thiazines (such as thionine, methylene blue, and toluidine blue), acrydines (such as acrydine orange, chloroflavin, and acryflavin), anthraquinones (such as anthraquinone), squariums (such as squarium), acrydine orange, coumarines (such as 7-diethyl amino-4-methyl coumarin), ketocoumarin, phenothiadines, phenadines, styryl benzenes, azo compounds, diphenyl methane, triphenyl methane, distyryl benzenes, carbazols, porphilin, spiro compounds, quinacridones, indigo, styryl, pyrylium compounds, pyromethene compounds, pyrazorotriazol compounds, benzothiazol compounds, barbital acid derivative, thiobarbital acid derivative, acetophenone, benzophenone, thioxantone, aromatic ketone compounds such as Michler's ketone, hetero cyclic compounds such as N-aryl oxazolidinone, or the like may be presented. Furthermore, the compounds described in European Patent No. 568,993, U.S. Pat. Nos. 4,508,811 and 5,227,227, JP-A Nos. 2001-125255 and 11-271969, or the like may be presented.

As the examples of the further preferable sensitizing agents, the following compounds represented by the formulae (i) to (iv) may be presented.

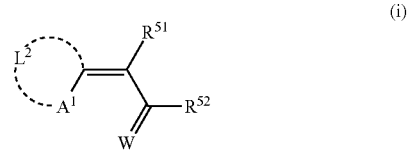

(i)

In the formula (i), $A^1$ is a sulfur atom or $NR^{50}$, $R^{50}$ is an alkyl group or an aryl group, $L^2$ is a non metal atomic group for forming a basic nucleus of the pigment in association with adjacent $A^1$ and an adjacent carbon atom, and $R^{51}$, $R^{52}$ are each independently a hydrogen atom or a monovaleic non metal atomic group, which may couple with each other for forming an acidic nucleus of the pigment. W is an oxygen atom or a sulfur atom. As the alkyl group of $R^{50}$ mentioned above, an alkyl group having 1 to 30 carbon atoms may be presented, however, an alkyl group having 1 to 20 carbon atoms is preferable, and an alkyl group having 1 to 10 carbon atoms is most preferable. As the aryl group of $R^{50}$ mentioned above, an aryl group having 6 to 30 carbon atoms may be presented, however, an aryl group having 6 to 20 carbon atoms is preferable, and an aryl group having 6 to 10 carbon atoms is most preferable.

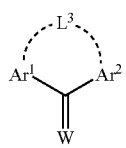
(ii)

In the formula (ii), $Ar^1$ and $Ar^2$ are each independently an aryl group, which are linked via a bond by -$L^3$-. Here, $L^3$ is —O— or —S—. Moreover, W is same as that shown in the formula (i). As the aryl group of $A^1$ mentioned above, an aryl group having 6 to 30 carbon atoms may be presented, however, an aryl group having 6 to 20 carbon atoms is preferable, and an aryl group having 6 to 10 carbon atoms is most preferable. As the aryl group of $A^2$ mentioned above, an aryl group having 6 to 30 carbon atoms may be presented, however, an aryl group having 6 to 20 carbon atoms is preferable, and an aryl group having 6 to 10 carbon atoms is most preferable.

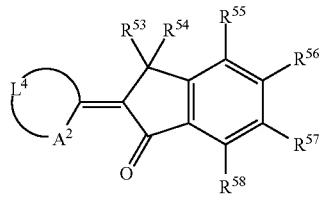
(iii)

In the formula (iii), $A^2$ is a sulfur atom or NR59, $L^4$ is a non metal atomic group for forming a basic nucleus of the dye in association with adjacent $A^2$ and an adjacent carbon atom, and $R^{53}$, $R^{54}$, $R^{55}$, $R^{56}$, $R^7$ and $R^{58}$ are each independently a monovaleic non metal atomic group, and $R^{59}$ is an alkyl group or an aryl group. As the alkyl group of $K^{59}$, an alkyl group having 1 to 30 carbon atoms may be presented, however, an alkyl group having 1 to 20 carbon atoms is preferable, and an alkyl group having 1 to 10 carbon atoms is most preferable. As the aryl group of $R^{59}$, an aryl group having 6 to 30 carbon atoms may be presented, however, an aryl group having 6 to 20 carbon atoms is preferable, and an aryl group having 6 to 10 carbon atoms is most preferable.

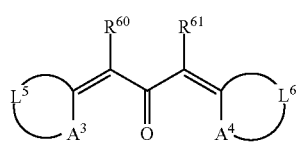
(iv)

In the formula (iv), $A^3$ and $A^4$ are each independently —S—, —$NR^{62}$— or —$NR^{63}$—. $R^{62}$, $R^{63}$ are each independently a substituted or unsubstituted alkyl group, or a substituted or unsubstituted aryl group, $L^5$, $L^6$ are each independently a non metal atomic group for forming a basic nucleus of the pigment in association with adjacent $A^3$, $A^4$ or an adjacent carbon atom, $R^{60}$, $R^{61}$ are each independently a monovaleic non metal atomic group, or may couple with each other for forming an aliphatic or aromatic ring. As the alkyl group of $R^{62}$, $R^{63}$, an alkyl group having 1 to 30 carbon atoms may be presented, however, an alkyl group having 1 to 20 carbon atoms is preferable, and an alkyl group having 1 to 10 carbon atoms is most preferable. As the aryl group of $R^{62}$, $R^{63}$, an aryl group having 6 to 30 carbon atoms may be presented, however, an aryl group having 6 to 20 carbon atoms is preferable, and an aryl group having 6 to 10 carbon atoms is most preferable. As the substituent in the case of substitution, an alkyl group, a halogen atom (a fluorine atom, a chlorine atom, a bromine atom, an iodine atom), an alkoxyl group, an alkoxy carbonyl group, an acyl group, a hydroxyl group and an amino group are preferable. The number of carbon atoms of these substituents is preferably 1 to 30, it is more preferably 1 to 20, and it is most preferably 1 to 10.

Moreover, as the preferable sensitizing agent to be contained in the curable composition of the invention, in addition to those mentioned above, at least one kind of selected from the group consisting of the compounds represented by the following formulae (VI) to (VI) may be presented. These may be used alone by one kind or in combination with two or more kinds.

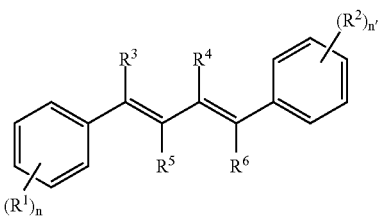
(IV)

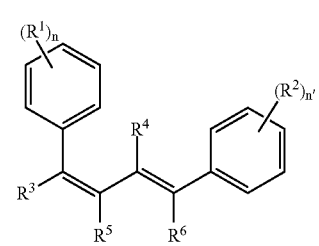
(V)

In the formula (IV) or (V), $R^1$ and $R^2$ are each independently a monovaleic substituent, and $R^3$, $R^4$, $R^5$ and $R^6$ are each independently a hydrogen atom or a monovaleic substituent. n is an integer from 0 to 5, and n' is an integer from 0 to 5, wherein n and n' are not 0 at the same time. In the case n is 2 or more, $R^1$ present in plurality may either be same or different. In the case n' is 2 or more, $R^2$ present in plurality may either be same or different. As the monovaleic substituent mentioned above, an alkyl group, a halogen atom (a fluorine atom, a chlorine atom, a bromine atom, an iodine atom), an alkoxyl group, an alkoxy carbonyl group, an acyl group, a hydroxyl group and an amino group are preferable. The number of carbon atoms of these substituents is preferably 1 to 30, it is more preferably 1 to 20, and it is most preferably 1 to 10.

The compounds represented by the formula (IV) are preferably a compound represented by the following formula (IV-1) from the viewpoint of the coloring property and the sensitivity in the case of containing a coloring agent.

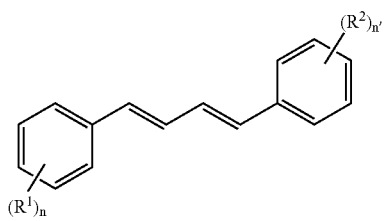

(IV-1)

In the formula (IV-1), $R^1$ and $R^2$ are each independently a monovaleic substituent. n is an integer from 0 to 5, and n' is an integer from 1 to 5. In the case n is 2 or more, $R^1$ present in plurality may either be same or different. In the case n' is 2 or more, $R^1$ present in plurality may either be same or different.

In the formula (IV-1), the monovaleic substituent represented by $R^1$ and $R^2$ is same as the monovaleic substituent represented by $R^1$ and $R^2$ in the above-mentioned formula (IV), and the same preferable range is also applied.

As the compound represented by the formula (IV) or (V), those having the molar absorbance coefficient F at the 365 nm wavelength of 500 mol$^{-1}$·L·cm$^{-1}$ or more are preferable, those having $\epsilon$ at the 365 nm wavelength of 3,000 mol$^{-1}$·L·cm$^{-1}$ or more are more preferable, and those having $\epsilon$ at the 365 nm wavelength of 20,000 mol$^{-1}$·L·cm$^{-1}$ or more are most preferable. Since the value of the mole light absorption coefficient $\epsilon$ at each wavelength is in the above-mentioned range, the sensitivity improving effect is high, it is preferable from the viewpoint of the light absorption efficiency.

Here, the molar absorbance coefficient s may be obtained by calculating the absorbance from the UV-visible absorption spectrum of the specimen by measuring the transmission spectrum of the specimen at 365 nm using a specimen of a dye solution adjusted to the 0.01 g/l concentration in a 1-methoxy-2-propanol solution. As the measurement apparatus, UV-Vis-MR Spectrophotometer Cary5G type spectrophotometer manufactured by Varian Corp. was used.

The preferable specific examples of the compounds represented by the formula (IV) or (V) will be shown below, however, the invention is not limited thereto.

Formulae herein may be shown by a simple structure formula, wherein a solid line, or the like without description of an element or a substituent represents a hydrocarbon group. Moreover, in the following specific examples, Me represents a methyl group, Et represents an ethyl group, Bu represents a butyl group, n-Bu represents a n-butyl group, and Ph represents a phenyl group.

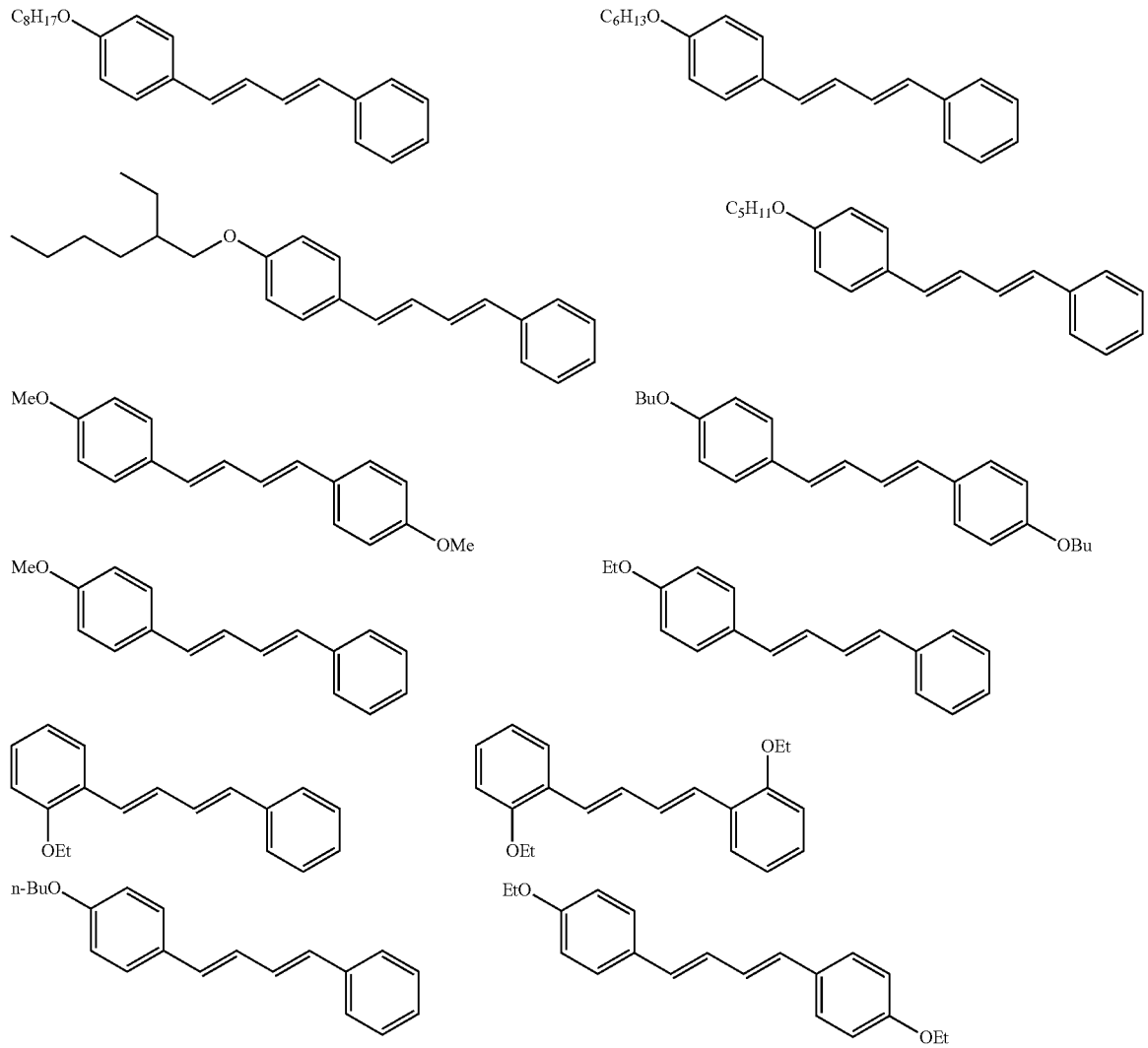

-continued
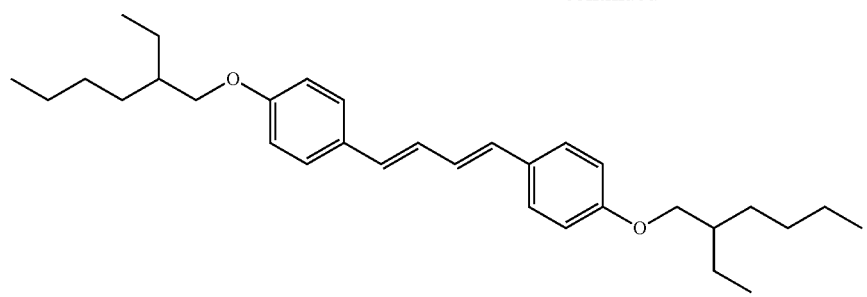
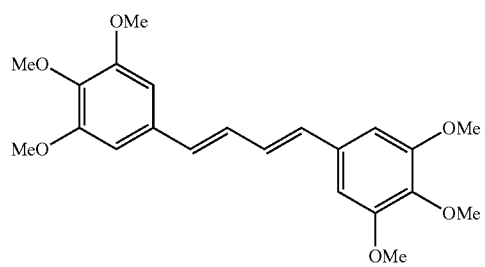
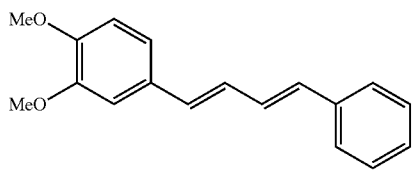
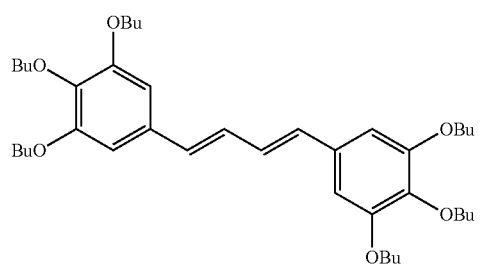
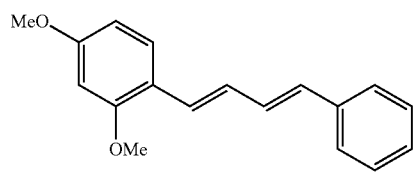
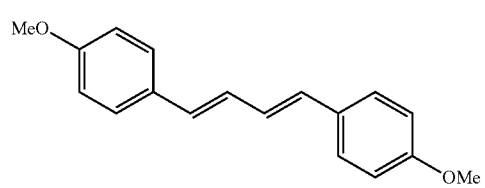
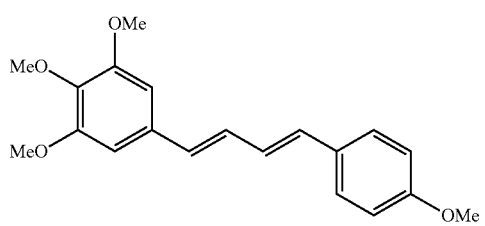
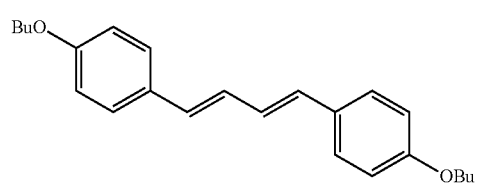
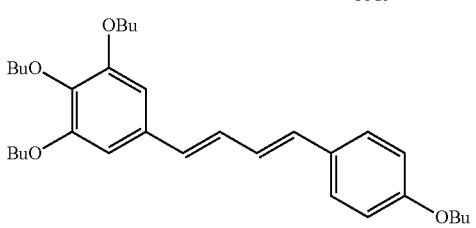
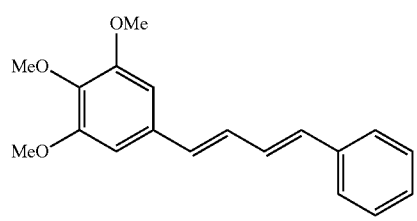
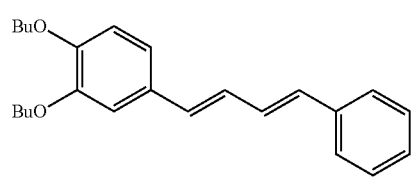
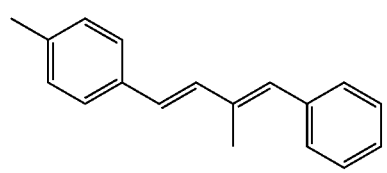
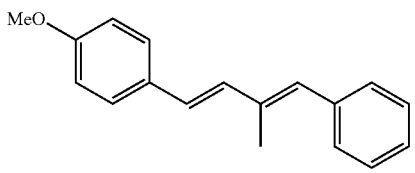

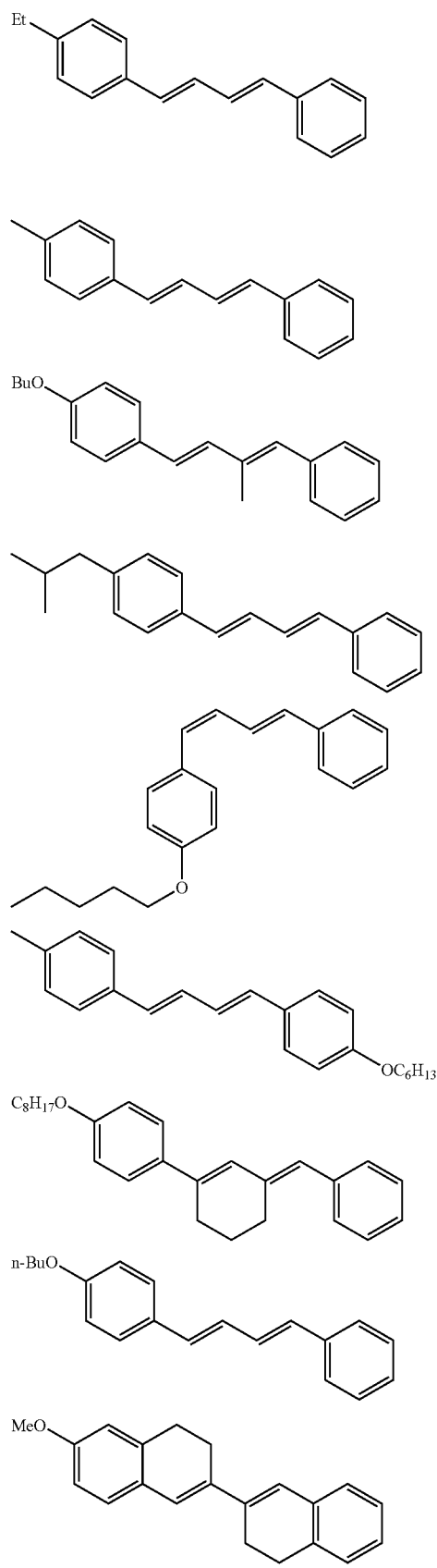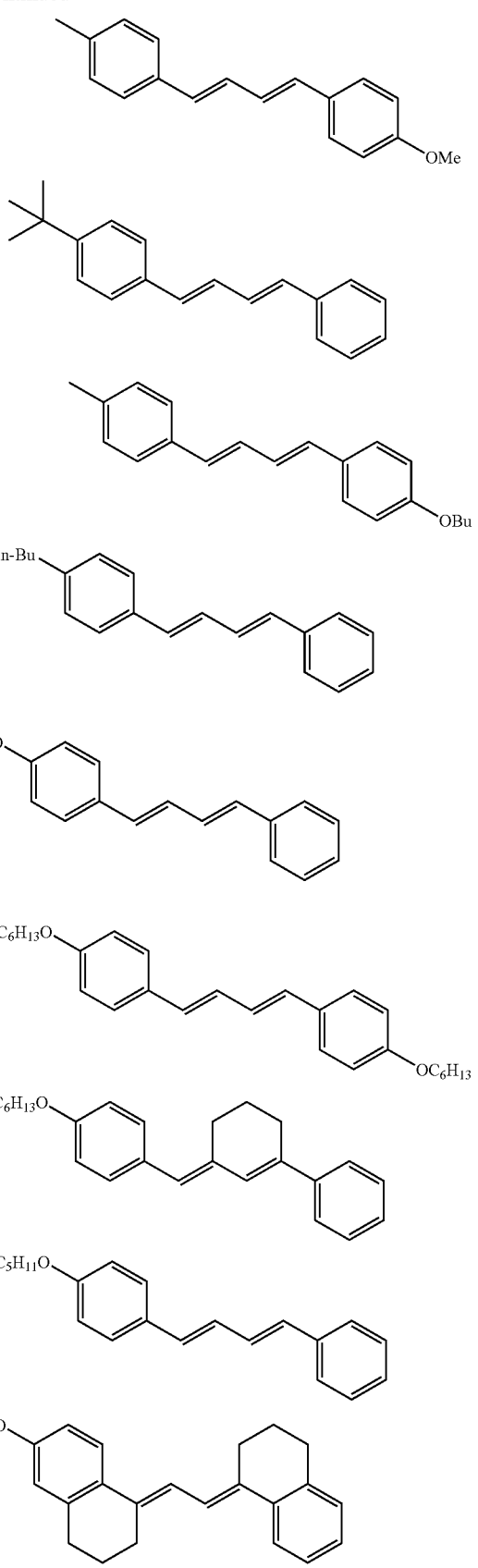

-continued
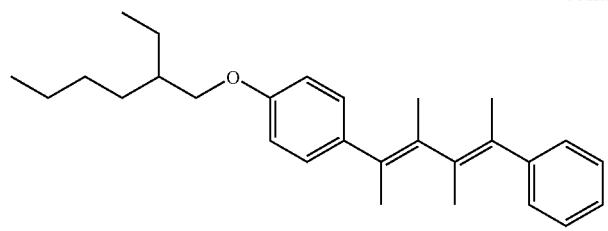
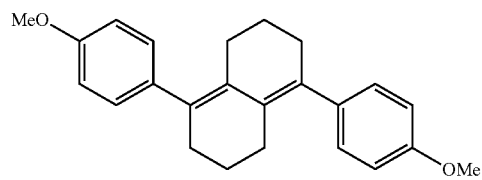
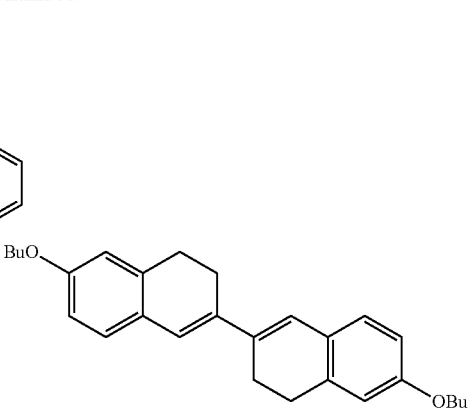
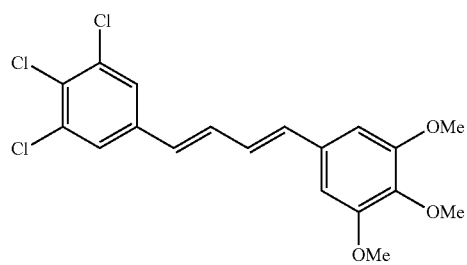
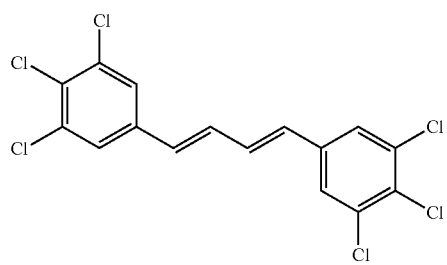
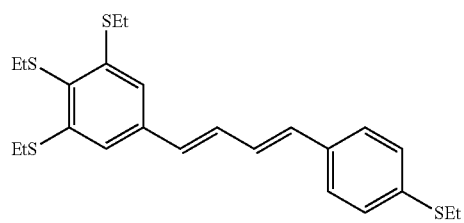
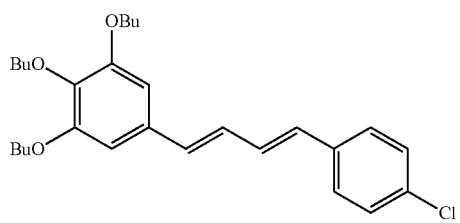
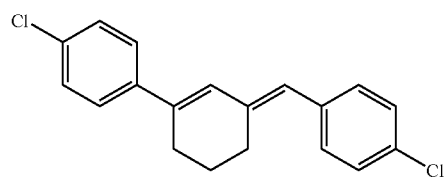
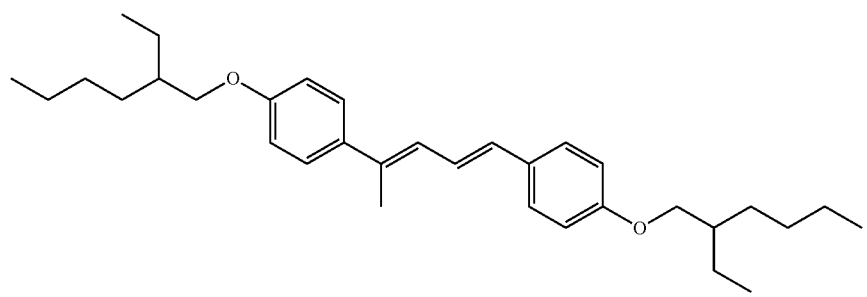
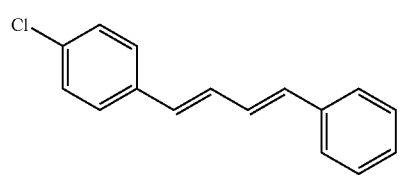
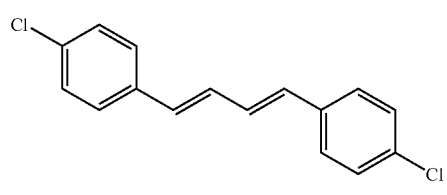
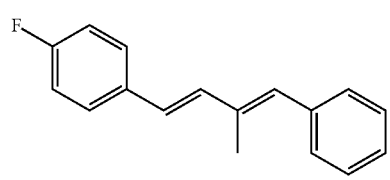
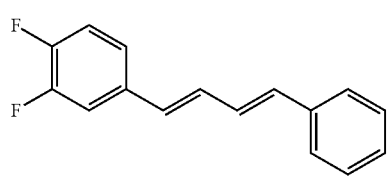

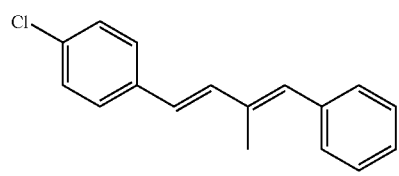
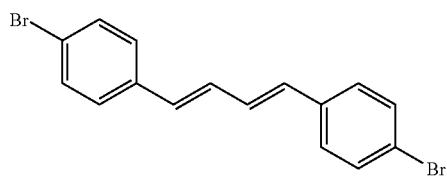
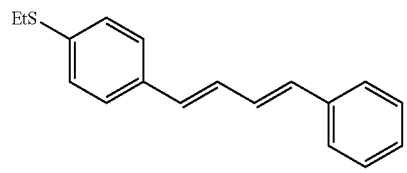
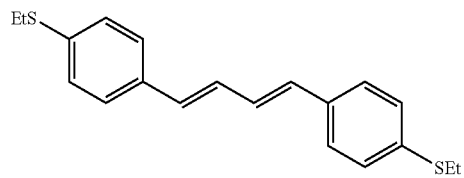
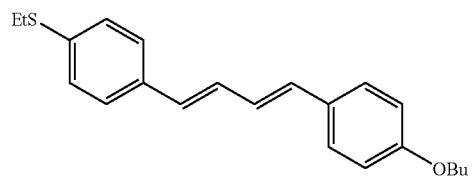
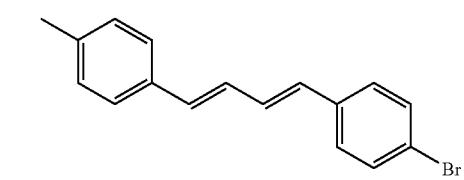
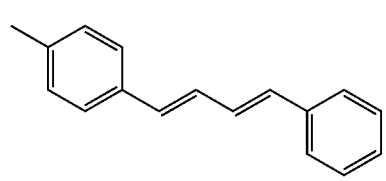
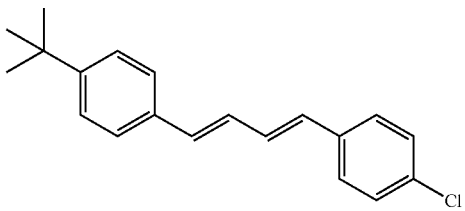
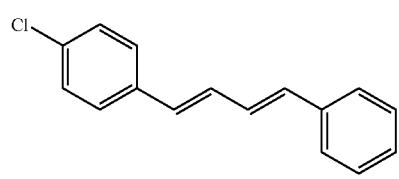
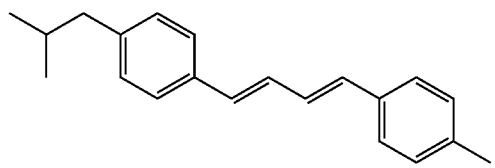
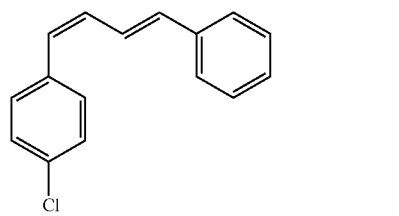
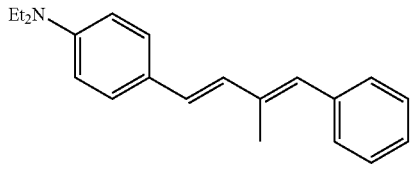
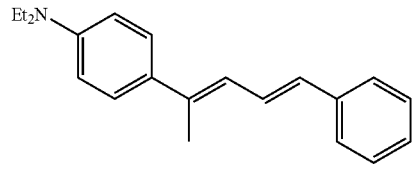
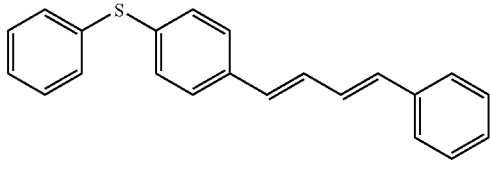
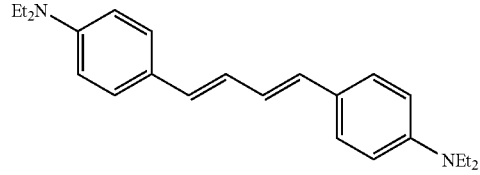
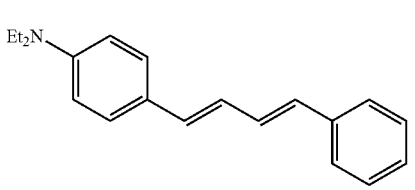
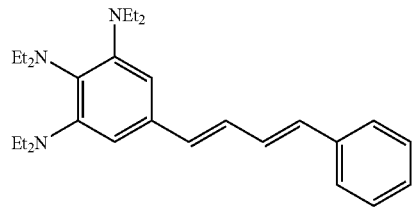

-continued
71
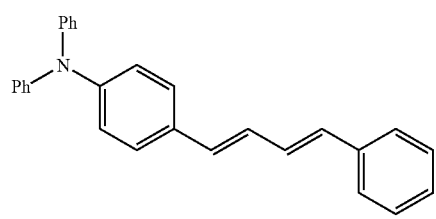
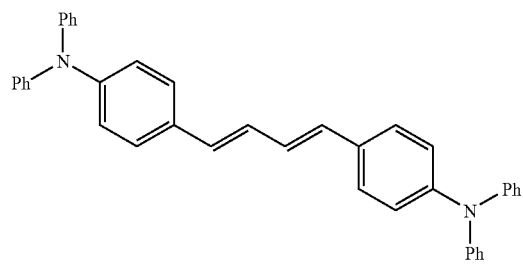
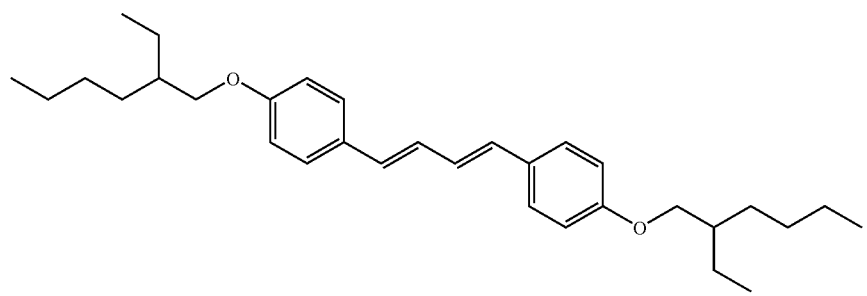
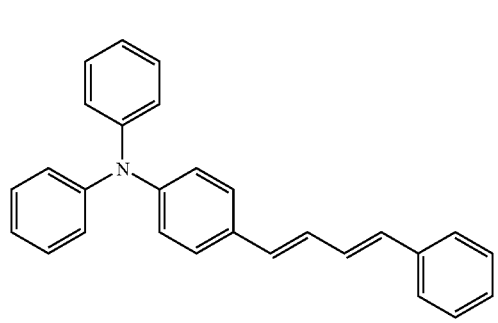
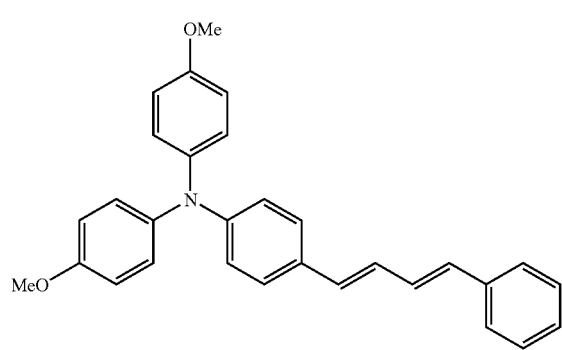
72
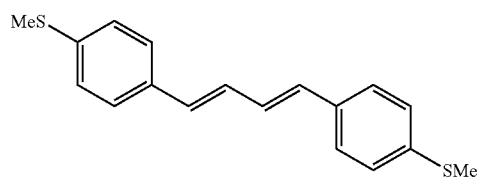
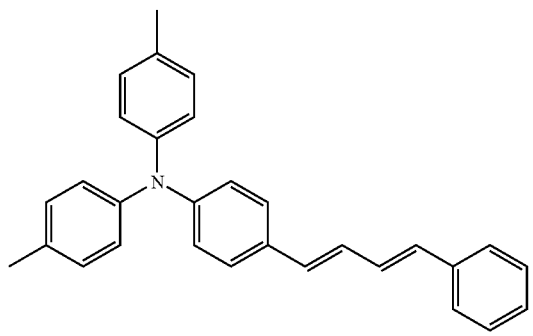

-continued
73
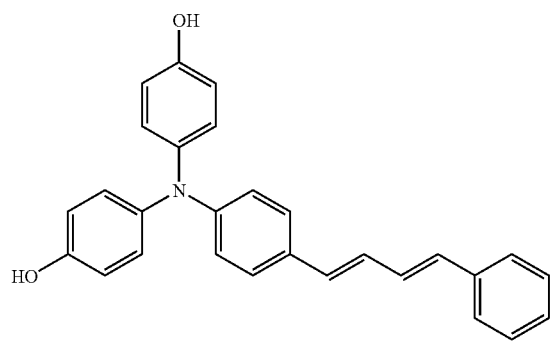
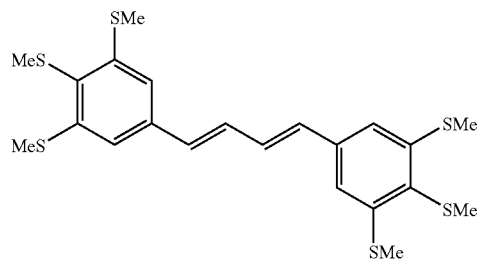
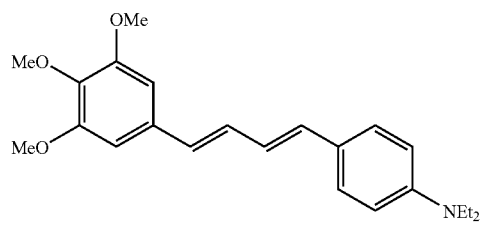
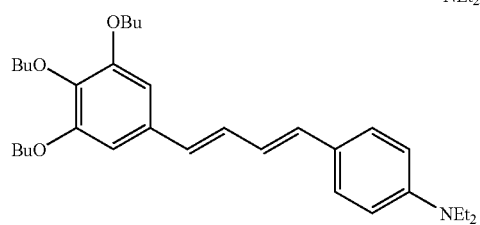
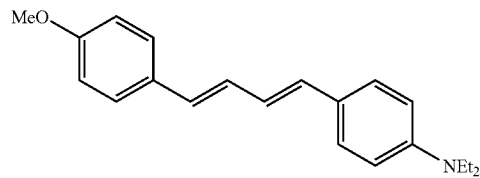
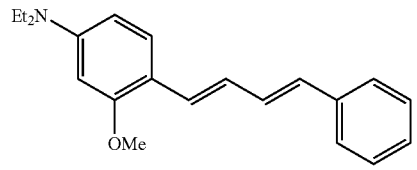
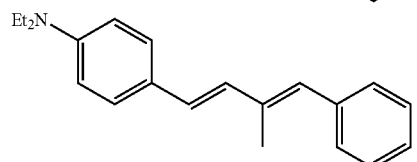
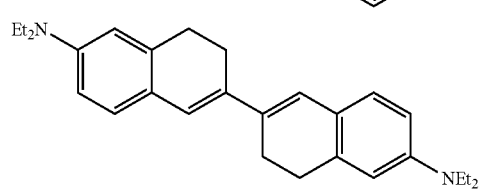
74
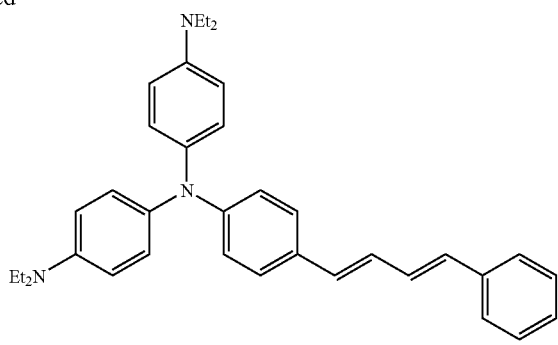
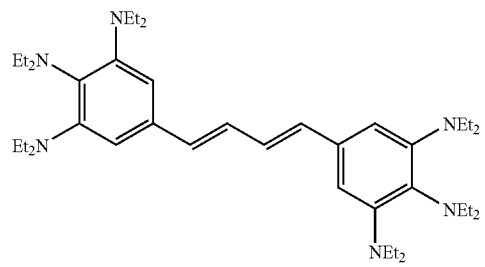
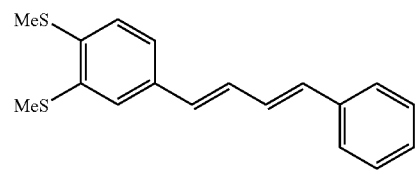
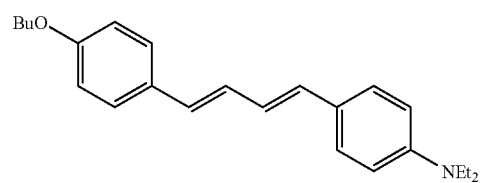
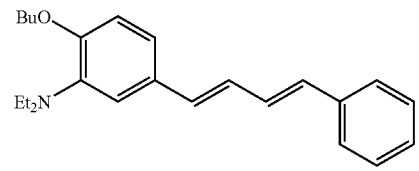
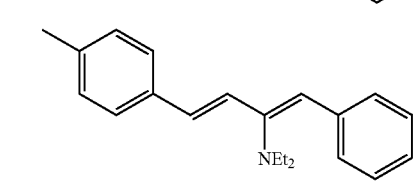
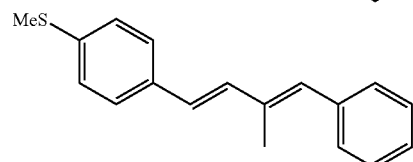
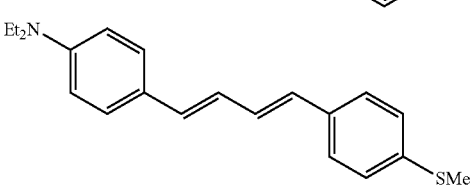

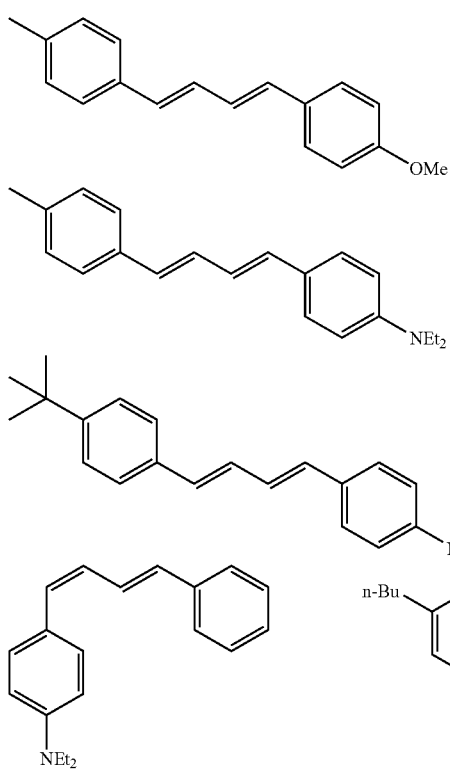
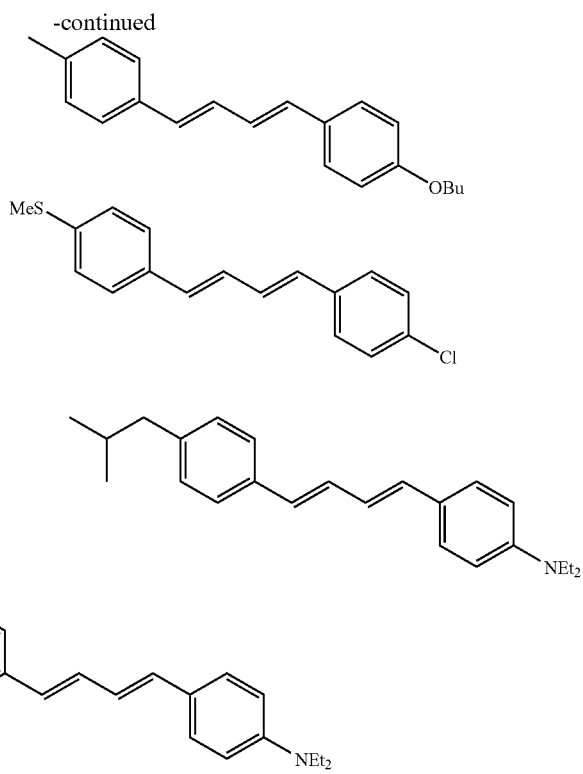

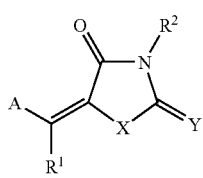
(VI)

In the formula (VI), A is an aromatic ring or a hetero ring, which may have a substituent, X is an oxygen atom, a sulfur atom or —N(R³)—, Y is an oxygen atom, a sulfur atom or —N(R³)—. R¹, R² and R³ are each independently a hydrogen atom or a monovaleic non metal atomic group. A, R¹, R2 and R³ may couple with each other for forming an aliphatic or aromatic ring.

In the formula (VI), in the case R¹, R2 and R³ are a monovaleic non metal atomic group, they are preferably a substituted or unsubstituted alkyl group, a substituted or unsubstituted aryl group, a substituted or unsubstituted alkenyl group, a substituted or unsubstituted aromatic heterocyclic residue, a substituted or unsubstituted alkoxy group, a substituted or no substituted alkyl thio group, a hydroxyl group or a halogen atom.

As the above-mentioned alkyl group, a linear, branched or cyclic alkyl group having 1 to 30 carbon atoms is preferable, one having 1 to 20 carbon atoms is more preferable, and one having 1 to 15 carbon atoms is particularly preferable. For example, a methyl group, an ethyl group, a propyl group, an isopropyl group, an n-butyl group, an iso-butyl group, a tert-butyl group, a n-octyl group, a n-dodecyl group, a cyclopentyl group, a cyclopentyl group, a benzyl group, a bicycle[2,2,1]-heptane-2-yl, or the like may be presented.

As the above-mentioned aryl group, an aryl group having 6 to 30 carbon atoms is preferable, one having 6 to 20 carbon atoms is more preferable, and one having 6 to 15 carbon atoms is particularly preferable. For example, a phenyl group, a naphthyl group, or the like may be presented.

As the above-mentioned alkenyl group, a linear, branched or cyclic alkenyl group having 1 to 30 carbon atoms is preferable, one having 1 to 20 carbon atoms is more preferable, and one having 1 to 15 carbon atoms is particularly preferable. For example, vinyl, allyl, cyclohexenyl, geranyl, or the like may be presented.

The above-mentioned aromatic heterocyclic residue is preferably a 5 to 7-membered substituted or unsubstituted, saturated or unsaturated, aromatic or nonaromatic, monocyclic or condensed ring aromatic heterocyclic residue. It is more preferably an aromatic heterocyclic residue with the ring constituent atom selected from the group consisting of a carbon atom, a nitrogen atom and a sulfur atom, having a hetero atom of at least either one of a nitrogen atom, an oxygen atom and a sulfur atom. It is further preferably a 5 or 6-membered aromatic heterocyclic residue having 3 to 30 carbon atoms. For example, 2-pyridyl, 4-pyridyl, 2-pyrimidinyl, 2-benzothiazolyl, imidazol-2-yl, or the like may be presented.

As the above-mentioned alkoxyl group, a linear, branched or cyclic alkoxyl group having 1 to 30 carbon atoms is preferable, one having 1 to 20 carbon atoms is more preferable, and one having 1 to 10 carbon atoms is particularly preferable. For example, methoxy, ethoxy, n-propoxy, isopropoxy, n-butoxy, isobutoxy, tert-butoxy, or the like may be presented.

As the above-mentioned alkyl thio group, a linear, branched or cyclic alkyl thio group having 1 to 30 carbon atoms is preferable, one having 1 to 20 carbon atoms is more preferable, and one having 1 to 10 carbon atoms is particularly preferable. For example, methio thio, ethyl thio, n-decyl thio group, or the like may be presented.

The above-mentioned monovaleic non metal atomic group may be substituted as mentioned above. As the substituent, an alkyl group, an alkenyl group, a fluorine atom, a chlorine atom, a bromine atom, an iodine atom, an alkoxy group, an alkoxy carbonyl group, an acyl group, a hydroxy group, an alkyl thio group, an aryl thio group, or the like may be presented. In the case these substutuents have carbon, the total number of the carbons is preferably 1 to 30, it is further preferably 1 to 20, and it is most preferably 1 to 10.

In the compounds represented by the formula (VI), from the viewpoint of improvement of the decomposition efficiency of the photopolymerization initiator, Y is preferably an oxygen atom or —N(R$^3$)—, and it is most preferably —N(R$^3$)—. R$^3$ each independently is a hydrogen atom or a monovaleic non metal atomic group.

Hereafter, the specific examples (VI1) to (VI124) of the preferable compounds represented by the formula (VI) will be shown; however, the invention is not limited thereto. Moreover, the isomers by the double bond linking the acidic nucleus and the basic nucleus are not obvious, and the invention is not limited to either one of the isomers.

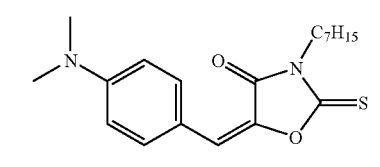
(VI1)

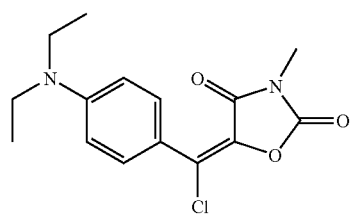
(VI2)

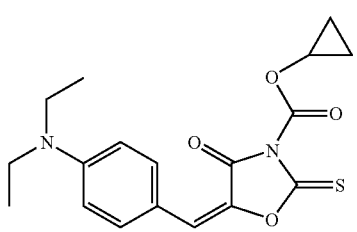
(VI3)

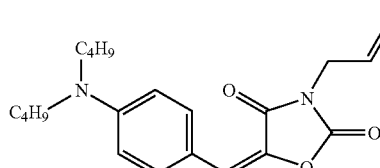
(VI4)

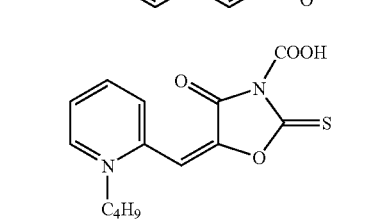
(VI5)

-continued

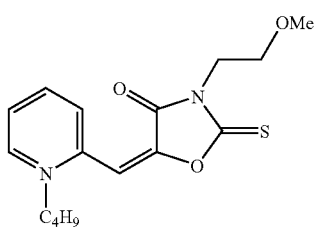
(VI6)

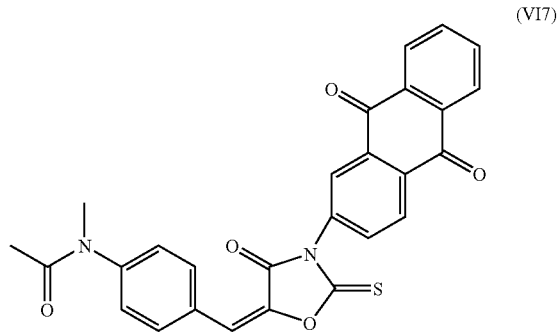
(VI7)

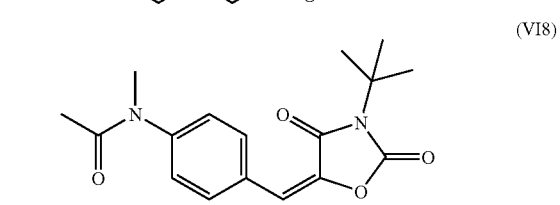
(VI8)

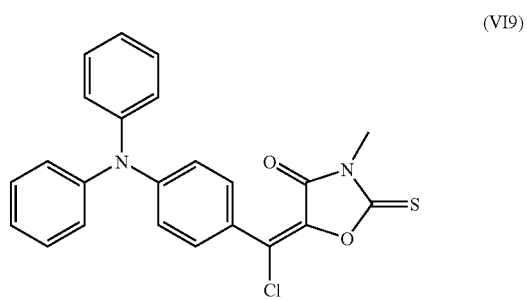
(VI9)

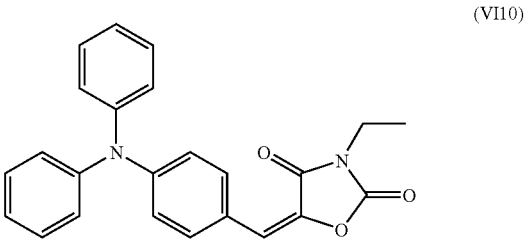
(VI10)

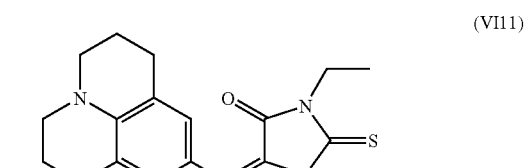
(VI11)

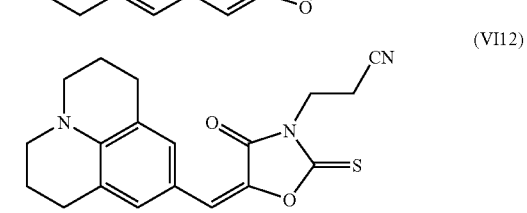
(VI12)

(VI13)
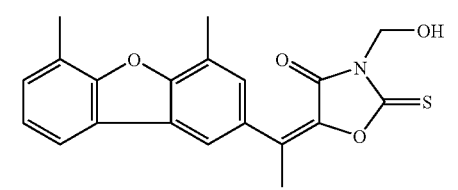
(VI14)
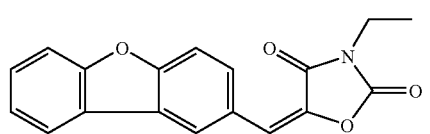
(VI15)
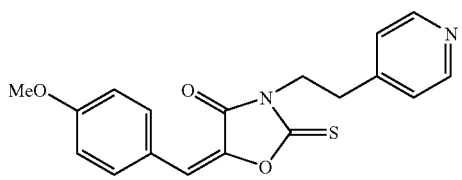
(VI16)
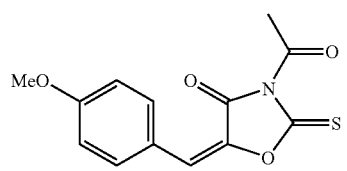
(VI17)
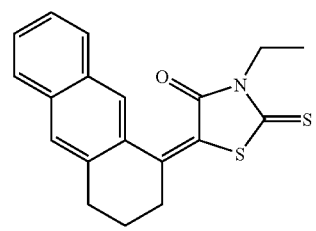
(VI18)
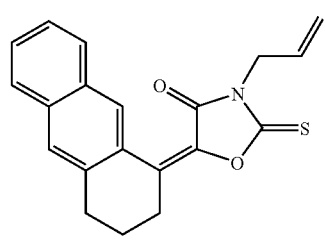
(VI19)
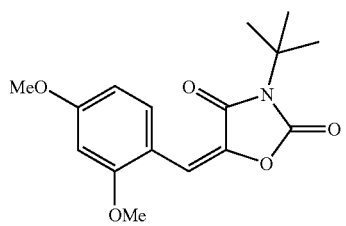
(VI20)
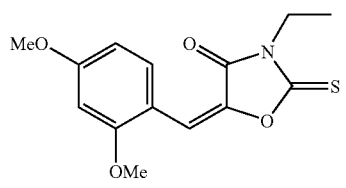
(VI21)
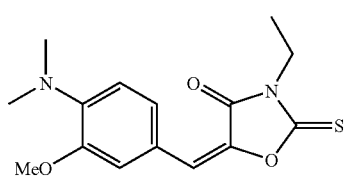
(VI22)
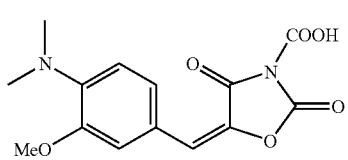
(VI23)
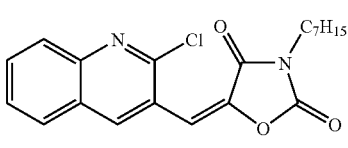
(VI24)
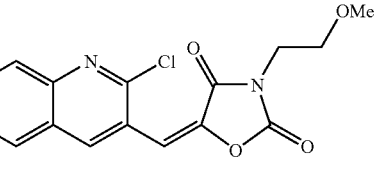
(VI25)
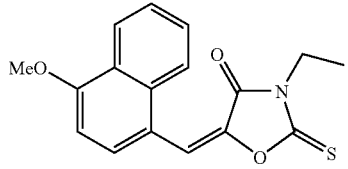
(VI26)
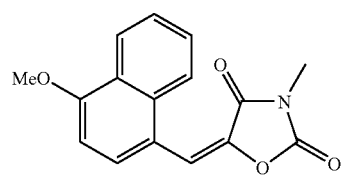
(VI27)
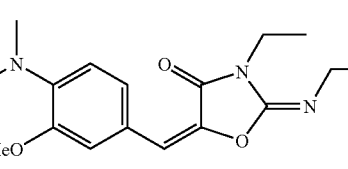
(VI28)
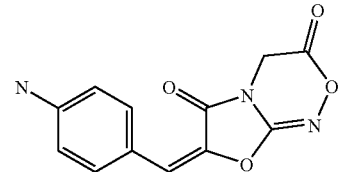
(VI29)
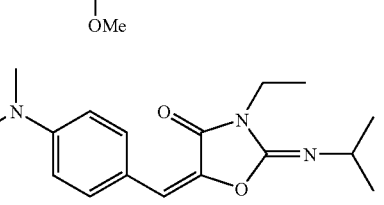

(VI30) 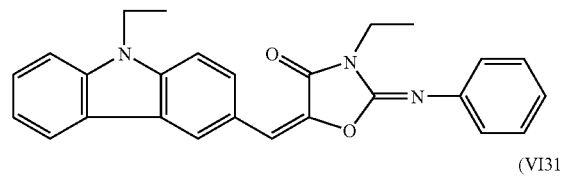
(VI31) 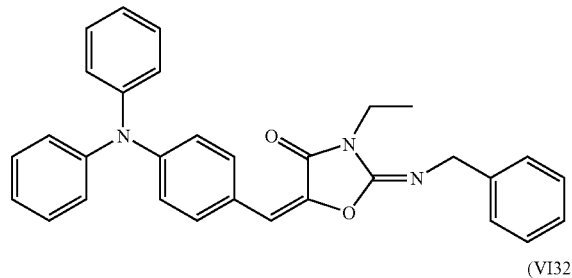
(VI32) 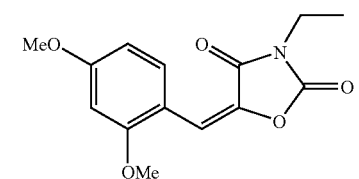
(VI33) 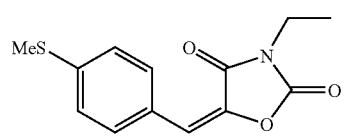
(VI34) 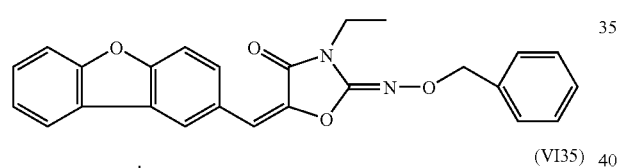
(VI35) 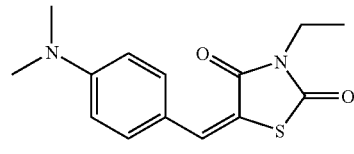
(VI36) 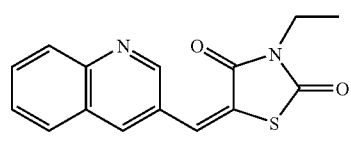
(VI37) 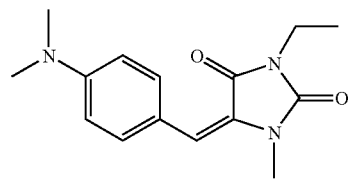
(VI38) 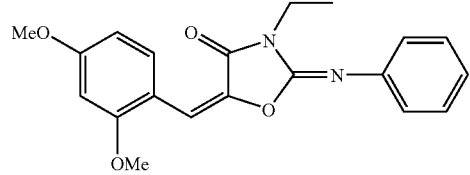
(VI39) 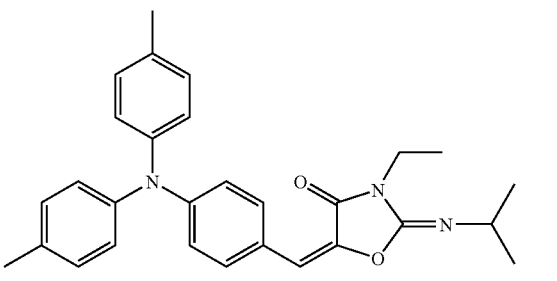
(VI40) 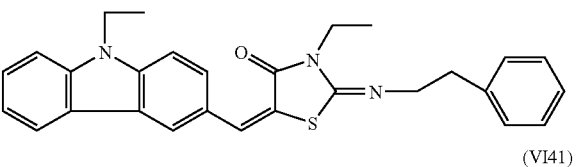
(VI41) 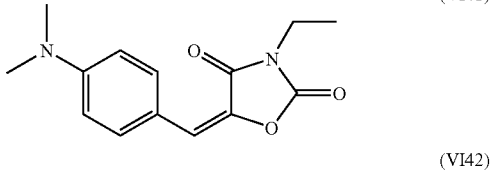
(VI42) 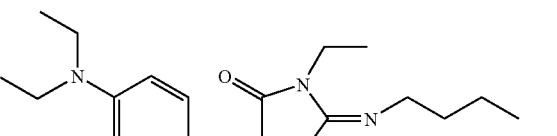
(VI43) 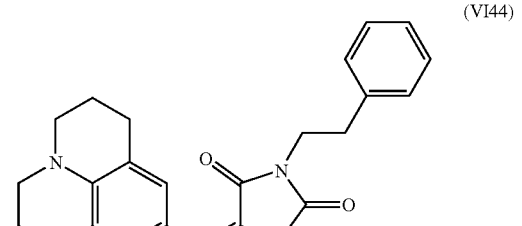
(VI44) 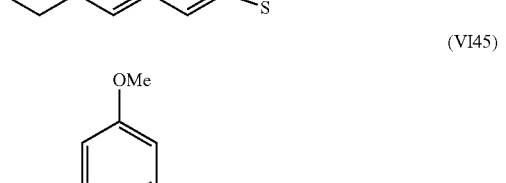
(VI45) 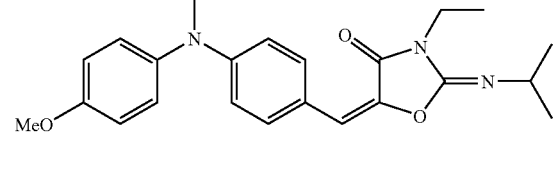

(VI46)
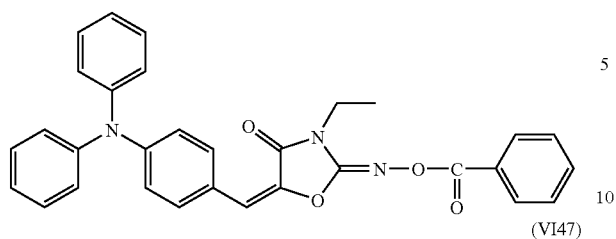
(VI47)
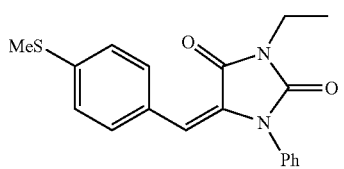
(VI48)
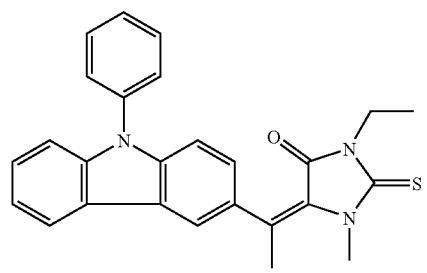
(VI49)
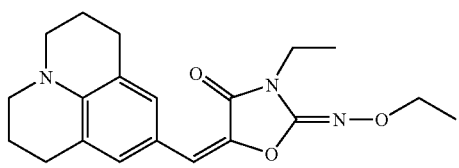
(VI50)
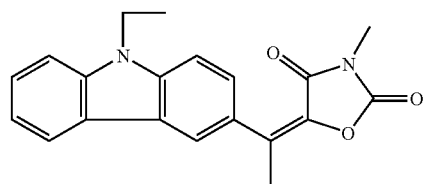
(VI51)
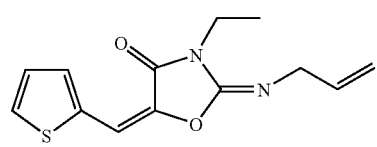
(VI52)
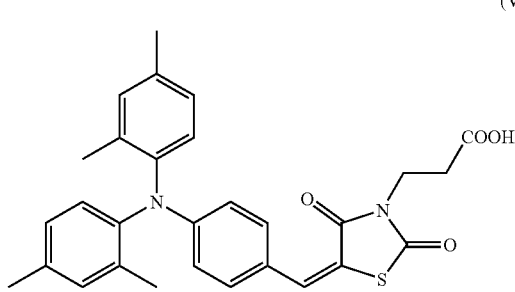
(VI53)
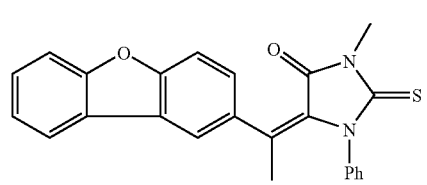
(VI54)
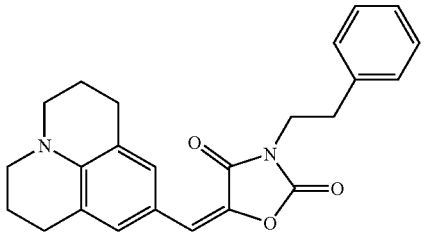
(VI55)
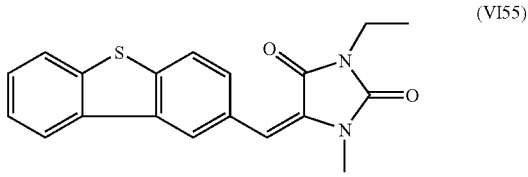
(VI56)
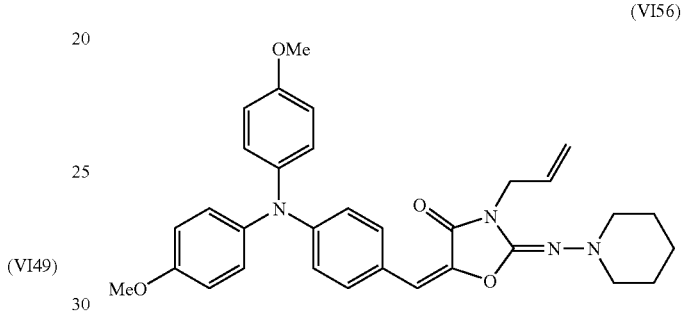
(VI57)
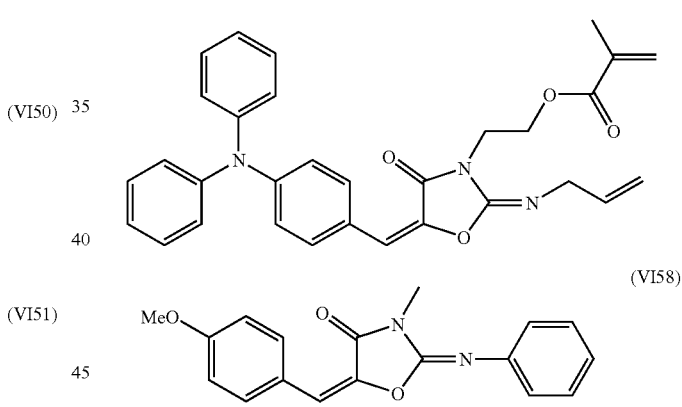
(VI58)
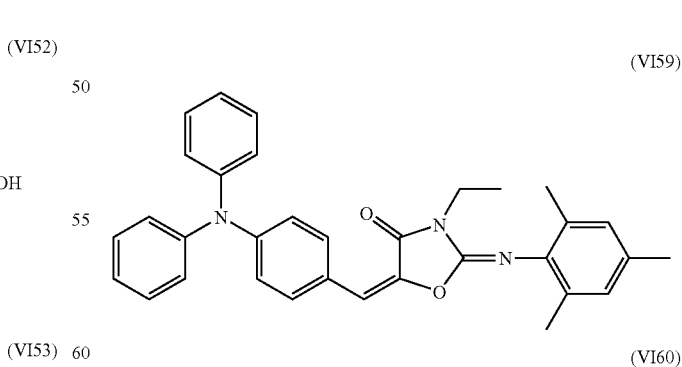
(VI59)
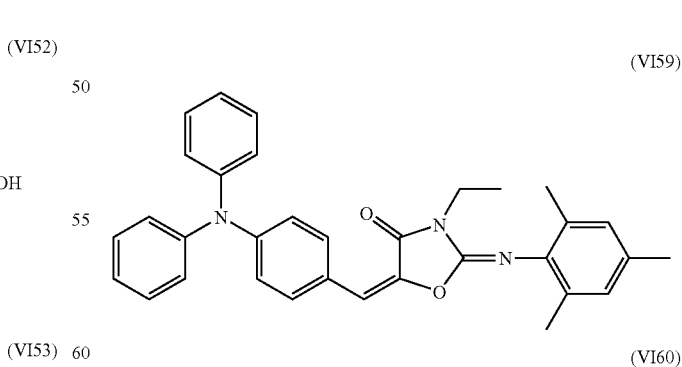
(VI60)
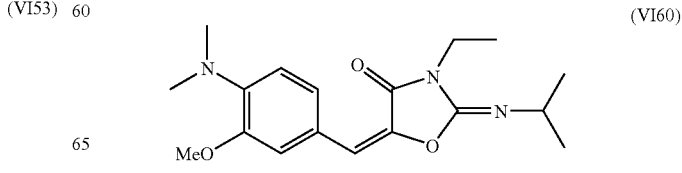

-continued
(VI61)
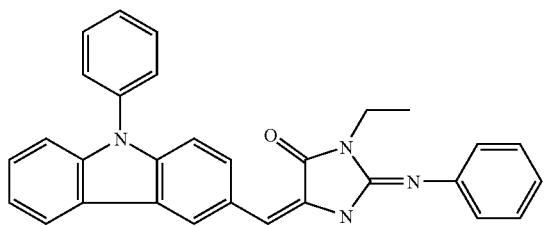
(VI62)
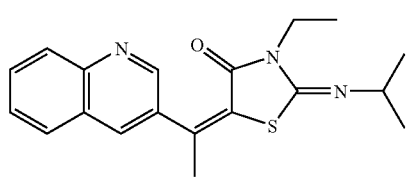
(VI63)
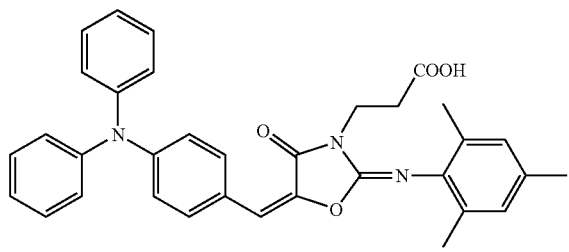
(VI64)
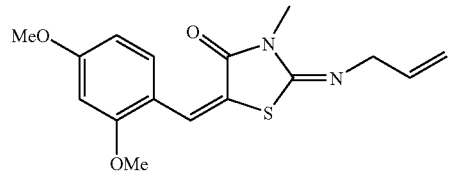
(VI65)
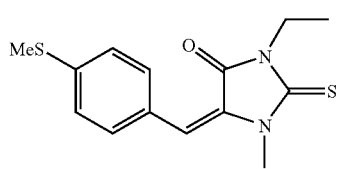
(VI66)
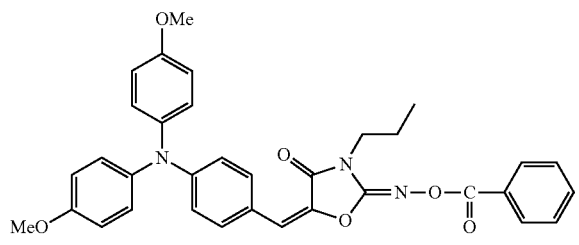
(VI67)
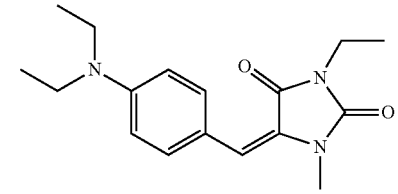
-continued
(VI68)
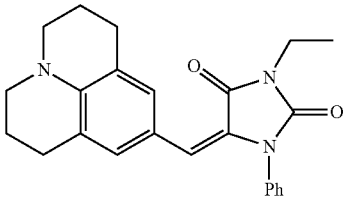
(VI69)
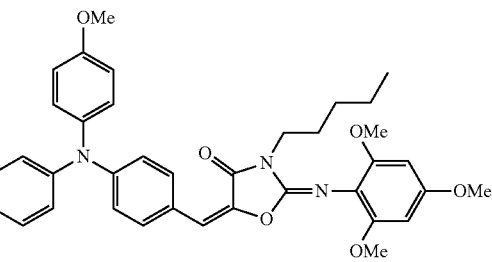
(VI70)
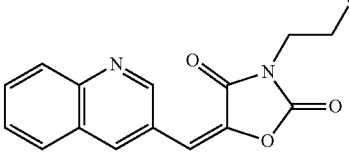
(VI71)
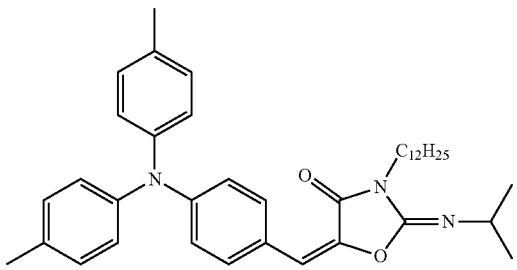
(VI72)
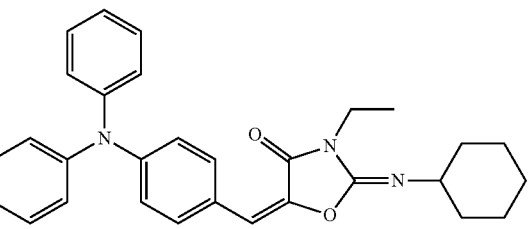
(VI73)
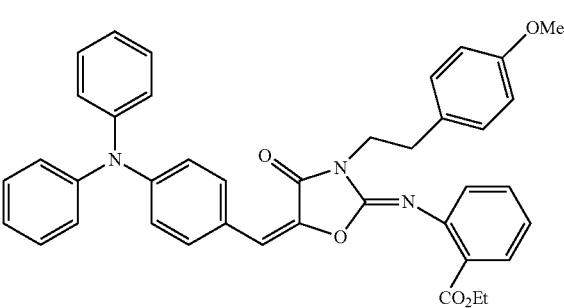

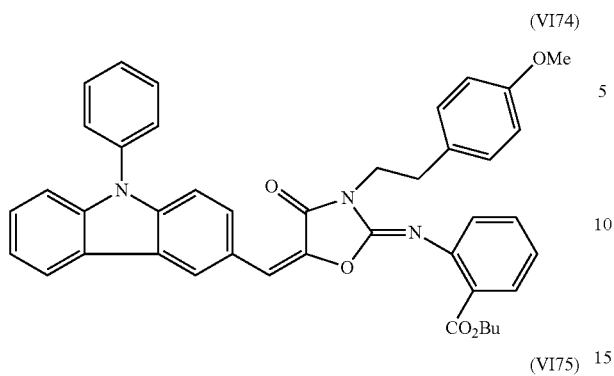
(VI74)
(VI75)
(VI76)
(VI77)
(VI78)
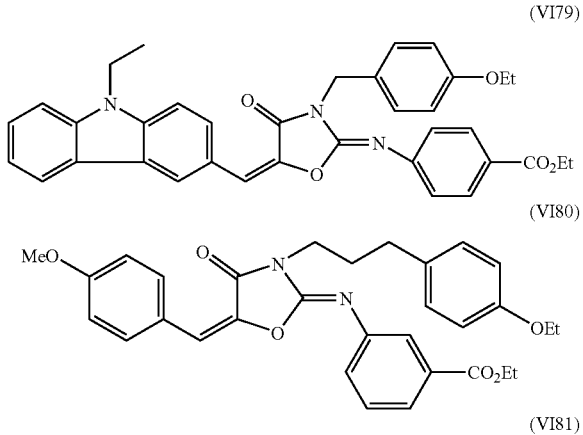
(VI79)
(VI80)
(VI81)
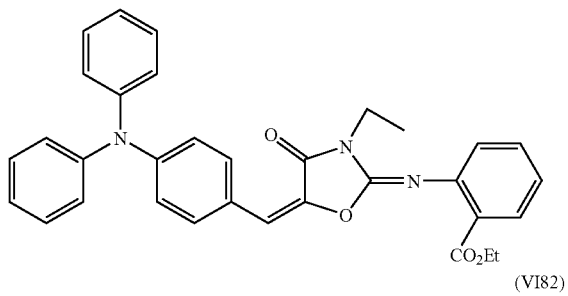
(VI82)
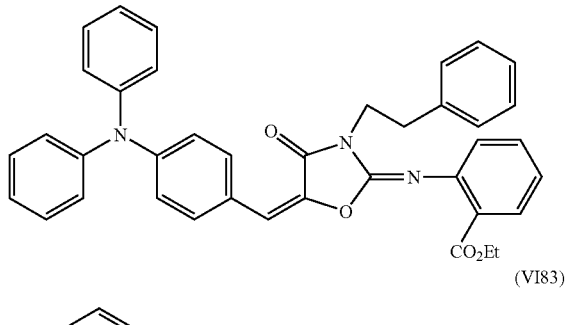
(VI83)
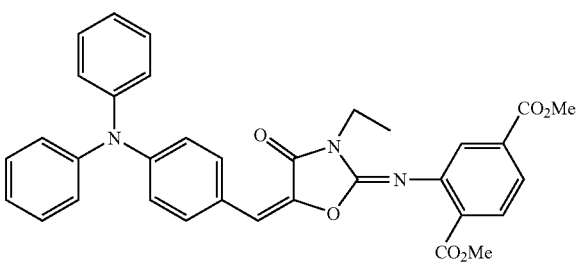
(VI84)

(VI85)
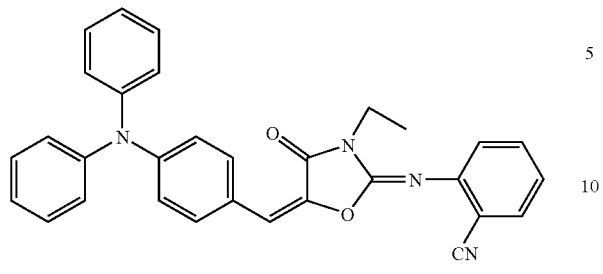
(VI86)
(VI87)
(VI88)
(VI89)
(VI90)
(VI91)
(VI92)
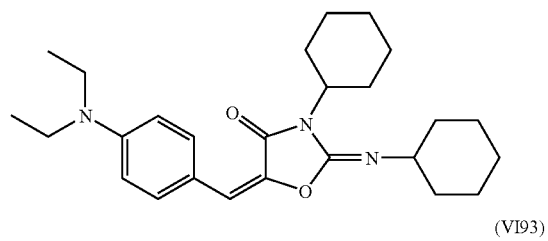
(VI93)
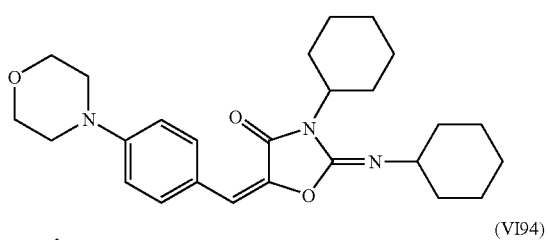
(VI94)
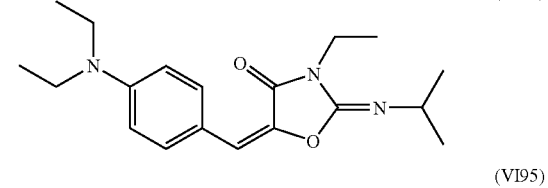
(VI95)
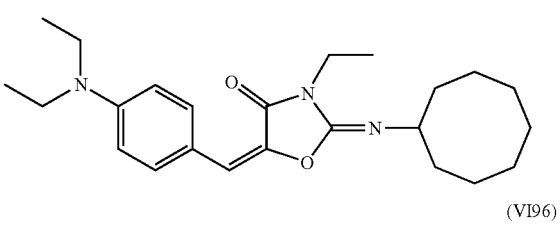
(VI96)
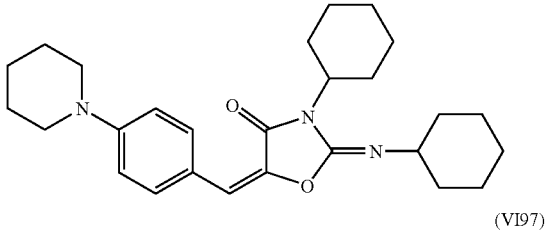
(VI97)
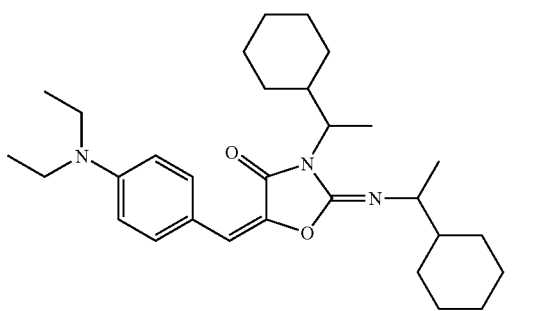
(VI98)
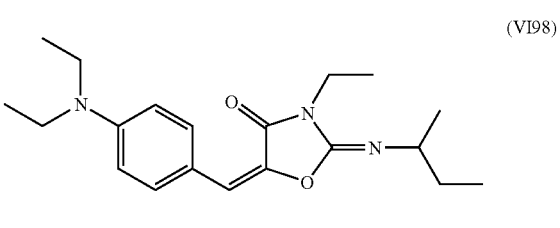

-continued
(VI99) 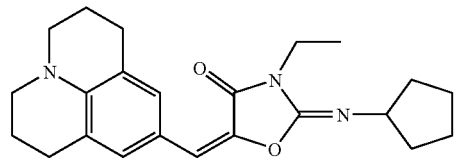
(VI100) 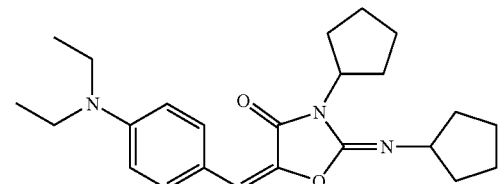
(VI101) 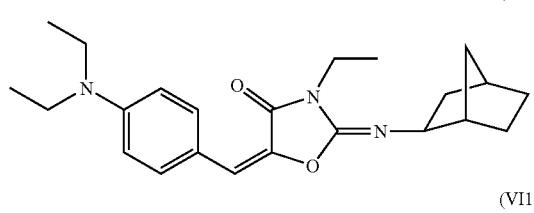
(VI102) 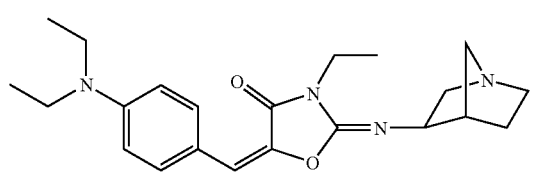
(VI103) 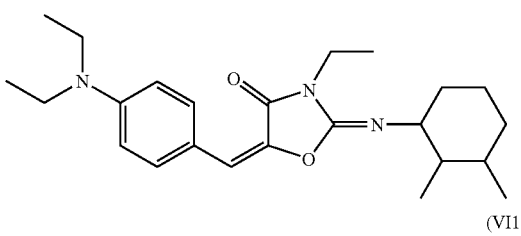
(VI104) 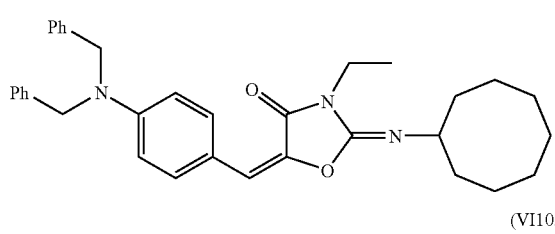
(VI105) 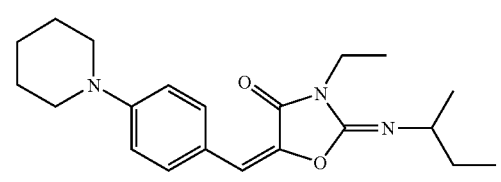
(VI106) 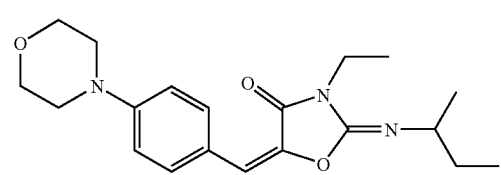
-continued
(VI107) 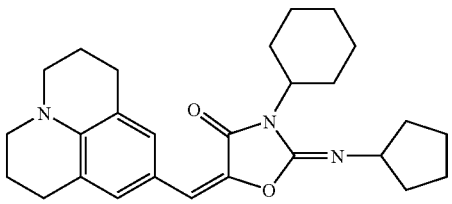
(VI108) 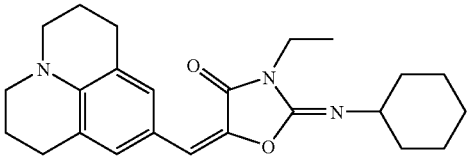
(VI109) 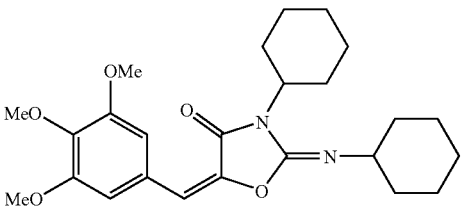
(VI110) 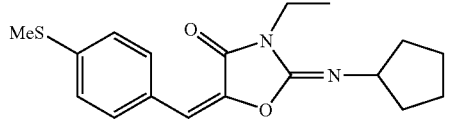
(VI111) 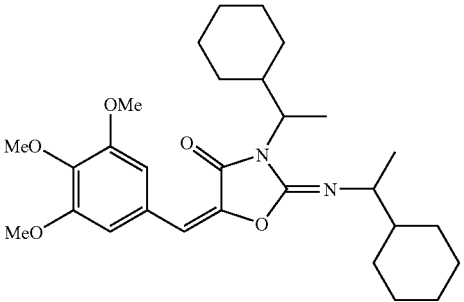
(VI112) 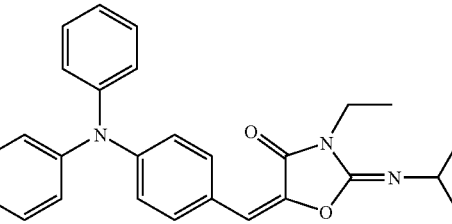
(VI113) 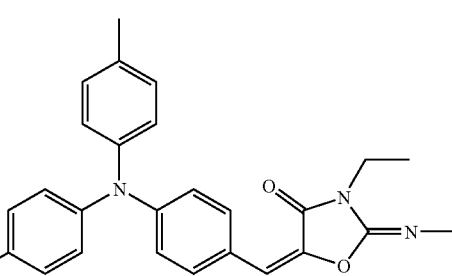

(VI114)
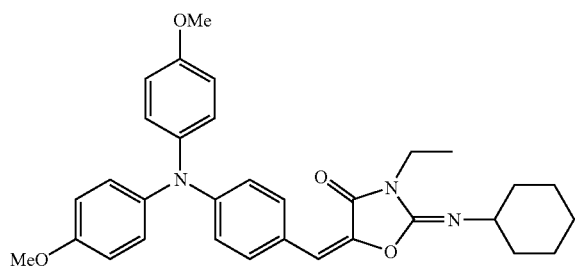

(VI115)
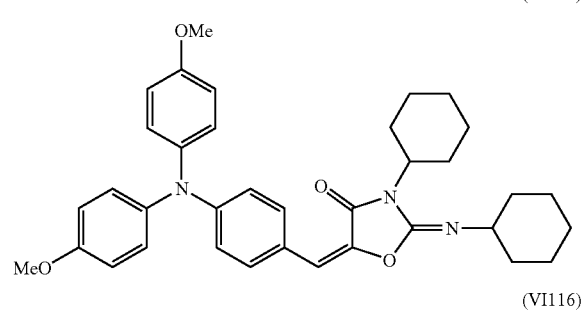

(VI116)
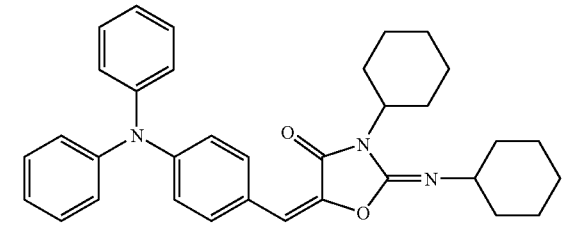

(VI117)
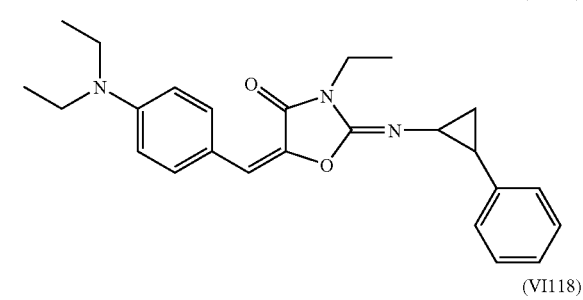

(VI118)
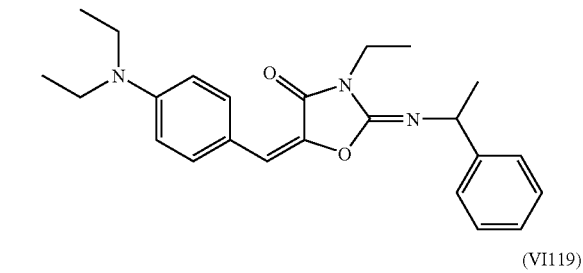

(VI119)
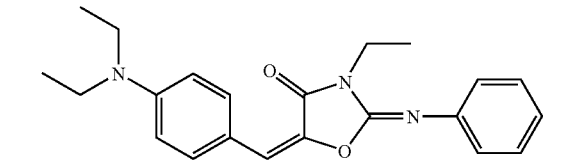

(VI120)
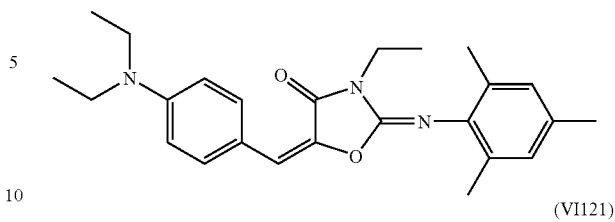

(VI121)
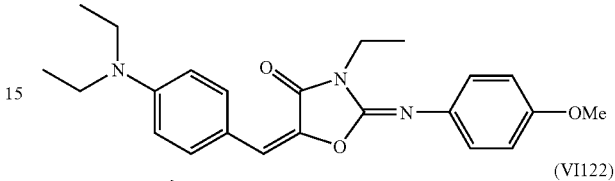

(VI122)
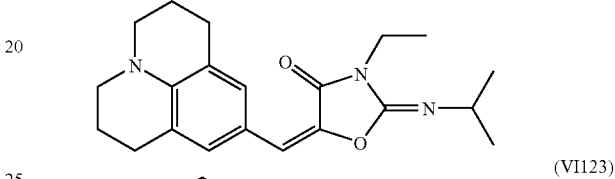

(VI123)

(VI124)
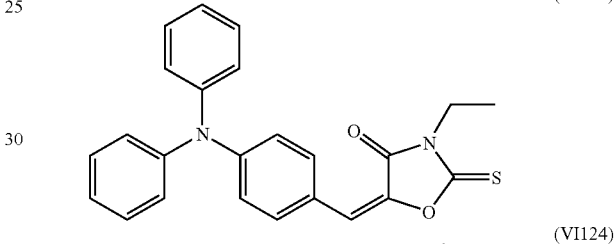

The compounds represented by the formula (VI) according to the invention may further have various chemical modifications applied for improving the characteristics of the curable composition.

For example, by bonding the sensitizing agent (hereafter, it is referred to as the "sensitizing dye") and an addition-polymerization compound structure (such as an acryloyl group and a methacryloyl group) by covalent bond, ion bond, hydrogen bond, or the like, high strength of the exposed film may be achieved and unnecessary precipitation of the sensitizing dye from the film after exposure may be restrained.

Moreover, bond of the sensitizing dye and a partial structure having the radical generating ability in the above-mentioned photopolymerization initiator (such as the reducing decomposing portion such as a halogenated alkyl, onium, peroxide and biimidazol and the oxidized cleavage portion such as borate, amine, trimethyl silyl methyl, carboxy methyl, carbonyl and imine) remarkably improves the photosensitive property particularly in a state with a low concentration of the initiating system.

In the curable composition of the invention, the compounds represented by the formulae (IV) to (VI) may be used alone by one kind or as a combination of two or more kinds.

In the case the concentration of the coloring agent (such as a pigment) in the curable composition is extremely high so that the light transmittance of the colored pattern (photosensitive layer) to be formed is extremely low, specifically, in the case the light transmittance of 365 nm of the photosensitive layer formed without addition of the sensitizing dye is 10% or less, by adding the compounds represented by the above-mentioned formulae (IV) to (VI), the effect of improving the photosensitive property may be performed remarkably. In particular, among the above-mentioned formulae (IV) to (VI), the compounds represented by the formula (VI) are most preferable. Specifically, the compounds of (VI56) to (VI122) are most preferable.

The sensitizing agent may be used singly or in combination of two or more kinds.

The content amount of the sensitizing agent in the curable composition of the invention with respect to the total solid component of the curable composition is preferably 0.1% by mass to 20% by mass, and is more preferably 0.5% by mass to 15% by mass in view of the light absorption efficiency at the deeper portion and the initial decomposition efficiency. The above-mentioned range is preferable because, as a result thereof, the light absorption efficiency at the deeper portion of the curable composition is increased and the initial decomposition efficiency is favorable.

<(H) Cosensitizing Agent>

The curable composition of the invention may contain a cosensitizing agent. In the invention, the cosensitizing agent has the effects of further improving the sensitivity with respect to the actinic radiation of the sensitizing dye or the photopolymerization initiator, or restraining the polymerization inhibition of the polymerizable compound by the oxygen, or the like.

Examples of such a cosensitizing agent include the amines such as the compounds described in for example "Journal of Polymer Society" vol. 10, page 3,173 (1972) written by M. R. Sander et al., JP-B No. 44-20189, JP-A Nos. 51-82102, 52-134692, 59-138205, 60-84305, 62-18537 and 64-33104, Research Disclosure No. 33825. Specifically, triethanol amine, p-dimethyl amino ethyl ester benzoate, p-formyl dimethyl aniline, p-methyl thio dimethyl aniline, or the like may be presented.

Other examples of the cosensitizing agent include thiols and sulfides, for example, thiol compounds described in JP-A No. 53-702, JP-B No. 55-500806, and JP-A No. 5-142772, and disulfide compounds described in JP-A No. 56-75643, specifically, 2-mercaptobenzothiazole, 2-mercaptobenzoxazole, 2-mercaptobenzimidazole, 2-mercapto-4(3H)-quinazoline, and β-mercaptonaphthalene.

In addition, other examples of the cosensitizing agent include amino acid compounds (e.g. N-phenylglycine, etc.), organic metal compounds (e.g. tributyltin acetate, etc.) described in JP-B No. 48-42965, hydrogen donating compounds described in JP-B No. 55-34414, and sulfur compounds (e.g. trithiane, etc.) described in JP-A No. 6-308727.

From the viewpoint of the improvement of the curing speed according to the balance of the polymerization growth speed and the chain transfer, the content amount of the cosensitizing agent with respect to the mass of the total solid component of the curable composition is preferably in a range of 0.1% by mass to 30% by mass, it is more preferably in a range of 0.5% by mass to 25% by mass, and it is further preferably in a range of 1.0% by mass to 20% by mass.

<(I) Polymerization Inhibitor>

In the invention, it is desirable to add a small amount of a thermal polymerization inhibitor for inhibiting the unnecessary thermal polymerization of the compound having a polymerizable ethylenically unsaturated double bond during the production or the storage of the curable composition.

As the thermal polymerization inhibitor to be used in the invention, hydroquinone, p-methoxy phenol, di-t-butyl-p-cresol, pyrogarol, t-butyl catecol, benzoquinone, 4,4'-thio bis (3-methyl-6-t-butyl phenol), 2,2'-methylene bis(4-methyl-6-t-butyl phenol), N-nitrosophenyl hydroxy amine cerium salt, or the like may be presented.

An addition amount of the heat polymerization inhibitor is preferably about 0.01% by mass to about 5% by mass relative to a mass of a total composition. If desired, in order to prevent polymerization inhibition with oxygen, a higher fatty acid derivative such as behenic acid and behenic acid amide may be added, to be unevenly distributed on a surface of a photosensitive layer during a drying process after coating. An addition amount of the higher fatty acid derivative is preferably about 0.5% by mass to about 10% by mass of a total composition.

<Other Additives>

Furthermore, in the invention, known additives such as an inorganic filler for improving the physical properties of the cured coating film, a plasticizing agent, and a sensitizing agent for improving the inking property of the photosensitive layer surface, and a substrate adhesion agent for improving the substrate adhesion property may be added.

As the plasticizing agent, for example, dioctyl phthalate, didodecyl phthalate, triethylene glycol dicaprylate, dimethyl glycol phthalate, tricresyl phosphate, dioctyl adipate, dibutyl sebacate, triacetyl glycerol, or the like may be presented. In the case a coupling agent is used, it may be added by 10% by mass or less with respect to the total mass of the compound having an ethylenically unsaturated double bond and the coupling agent.

In the case of using the curable composition of the invention for the hard material surface such as a substrate, an additive for improving the adhesion property to the hard material surface (hereafter, it will be referred to as the "substrate adhesion agent") may be added.

As the substrate adhesion agent, known materials may be used. In particular, it is preferable to use a silane-based coupling agent, a titanate-based coupling agent, or an aluminum-based coupling agent.

Examples of the silane-based coupling agent include γ-(2-amino ethyl) amino propyl trimethoxy silane, γ-(2-amino ethyl) amino propyl dimethoxy silane, β-(3,4-epoxy cyclohexyl) ethyl trimethoxy silane, γ-amino propyl trimethoxy silane, γ-amino propyl triethoxy silane, γ-methacryloxy propyl trimethoxy silane, γ-methacryloxy propyl triethoxy silane, γ-acryloxy propyl trimethoxy silane, γ-acryloxy propyl triethoxy silane, γ-isocyanate propyl trimethoxy silane, γ-isocyanate propyl triethoxy silane, N-β-(N-vinyl benzyl amino ethyl)-γ-amino propyl trimethoxy silane hydrochloric acid salt, γ-glycidoxy propyl trimethoxy silane, γ-glycidoxy propyl triethoxy silane, amino silane, γ-mercapto propyl trimethoxy silane, γ-mercapto propyl triethoxy silane, methyl trimethoxy silane, methyl triethoxy silane, vinyl triacetoxy silane, γ-chloro propyl trimethoxy silane, hexamethyl disilazane, γ-anilino propyl trimethoxy silane, vinyl trimethoxy silane, vinyl triethoxy silane, vinyl tris (β-methoxy ethoxy) silane, octadecyl dimethyl [3-(trimethoxy silyl) propyl] ammonium chloride, γ-chloro propyl methyl dimethoxy silane, γ-mercapto propyl methyl dimethoxy silane, methyl trichloro silane, dimethyl dichloro silane, trimethyl chloro silane, 2-(3,4-epoxy cyclohexyl) ethyl trimethoxy silane, bis-allyl trimethoxy silane, tetraethoxy silane, bis(trimethoxy silyl) hexane, phenyl trimethoxy silane, N-(3-acryloxy-2-hydroxy propyl)-3-amino propyl triethoxy silane, N-(3-methacryloxy-2-hydroxy propyl)-3-amino propyl triethoxy silane, (methacryloxy methyl) methyl diethoxy silane, and (acryloxy methyl) methyl dimethoxy silane.

In particular, γ-methacryloxy propyl trimethoxy silane, γ-methacryloxy propyl triethoxy silane, γ-acryloxy propyl trimethoxy silane, γ-acryloxy propyl triethoxy silane, γ-mercapto propyl trimethoxy silane, γ-amino propyl triethoxy silane, and phenyl trimethoxy silane are preferable, and γ-methacryloxy propyl trimethoxy silane is most preferable. Examples of the titanate-based coupling agent include isopropyl triisostearoyl titanate, isopropyl tridecyl benzene sulfonyl titanate, isopropyl tris (dioctyl pyrophosphate) titanate, tetraisopropyl bis(dioctyl phosphite) titanate, tetraoctyl bis (ditolydecyl phosphite) titanate, tetra(2,2-diallyloxymethyl) bis(di-tridecyl)phosphitetitanate, bis(dioctyl pyrophosphate) oxyacetate titanate, bis(dioctyl pyrophosphate) ethylene titanate, isopropyl trioctanoyl titanate, isopropyl dimethacryl isostearoyl titanate, isopropyl isostearoyl diacryl titanate, triisopropyl tri(dioctyl phosphate) titanate, isopropyl tricumyl phenyl titanate, isopropyl tri(N-amide ethyl amino ethyl) titanate, dicumyl phenyloxy acetate titanate, and diisostearoyl ethylene titanate.

Examples of the aluminum-based coupling agent include acetoalkoxy aluminum diisopropylate.

From the viewpoint of preventing residue remaining on the unexposed part in the case of exposing the curable composition, the content amount of the substrate adhesion agent with respect to the total solid component of the curable composition of the invention is preferably 0.1% by mass to 30% by mass, it is more preferably 0.5% by mass to 20% by mass, and it is particularly preferably from 1% by mass to 10% by mass.

According to the above-mentioned configuration, the curable composition of the invention may be cured with high sensitivity and preferable storage stability. Moreover, the curable composition of the invention shows the high adhesion property to the surface of the material (such as the hard material like a substrate) to be used. Therefore, the curable composition of the invention may be used preferable in the field of the image forming materials such as the three-dimensional light decoration, holography and color filter, or ink, paint, adhesive, coating agent, or the like.

[Color Filter and Manufacturing Method of the Same]

Then, the color filter of the invention, and a process for manufacturing the same will be explained.

The color filter of the invention is characterized in that it has a colored pattern using the curable composition of the invention on a support.

Then, the color filter of the invention will be described in detail by referring to a process for manufacturing the same (process for manufacturing the color filter of the invention).

The manufacturing method of a color filter of the invention include a colored layer forming step of forming a colored layer made of the curable composition by applying the curable composition of the invention on a supporting member, an exposing step of exposing the above-mentioned colored layer via a mask, and a developing step of forming a colored pattern by developing the colored layer after the exposure.

Hereafter, each step in the manufacturing method of the invention will be explained.

<Colored Layer Forming Step>

In the colored layer forming step, a colored layer made of the curable composition is formed by applying a curable composition of the invention on a supporting member.

Examples of the support which can be used in the present step include a soda glass, a Pyrex (registered trademark) glass, a quartz glass and those glasses with a transparent conduction film attached thereto which are used in a liquid crystal display element, a photoelectric conversion element substrate used in an image pickup element, for example, a silicon substrate, and a complementary metal oxide film semiconductor (CMOS). On these substrates, a black stripe, which isolates each pixel, is formed in some cases.

If necessary, on these supports, an undercoating layer may be set for improving adhesion with an upper layer, preventing diffusion of a substance, and flattening a substrate surface.

As the coating method for the curable composition of the invention onto the supporting member, various coating methods such as slit coating, ink jet coating, rotation coating, cast coating, roll coating, and screen coating may be used.

From the viewpoint of the coating film evenness of the coating film and the drying easiness of the coating solution, the film thickness of the curable composition immediately after coating is preferably 0.1 to 10 μm, it is more preferably 0.2 to 5 μm, and it is further preferably 0.2 to 3 μm.

The colored layer (curable composition layer) applied on the substrate may be dried (prebaked) with a hot plate, an oven, or the like at 50° C. to 140° C. for 10 to 300 seconds. The coating film thickness after drying of the curable composition (hereafter, also referred to as "dry film thickness") is preferably 0.1 μm or more and less than 2.0 μm, more preferably 0.2 μm or more and 1.8 μm or less, and particularly preferably 0.3 μm or more and 1.75 μm or less for use as a color filter for an LCD in view of compatibility to a thin LCD and ensuring the color density.

Moreover, for use as a color filter for IS, in view of ensuring the color density and reduction of problems such as a notable difference in the light collection ratio between the end part and the center part of a device, the thickness is preferably 0.05 μm or more and less than 1.0 μm, more preferably 0.1 μm or more and 0.8 μm or less, and particularly preferably 0.2 μm or more and 0.7 μm or less.

<Exposing Step>

In the exposing step, the colored layer (curable composition layer) formed in the above-mentioned colored layer forming step is exposed via a mask having a predetermined mask pattern.

According to the exposure in this step, the pattern exposure of the coating film may be carried out by the exposure via a predetermined mask pattern for curing only the coating film portion with the light irradiation. As the radiation to be used at the time of the exposure, ultraviolet rays such as g line and i line may preferably be used. The irradiation amount is preferably 5 to 1,500 mJ/cm2 is preferable, it is more preferably 10 to 1,000 mJ/cm$^2$, and it is most preferably 10 to 500 mJ/cm$^2$.

In the case the color filter of the invention is for a liquid crystal display device, among the above-mentioned range, it is preferably 5 to 200 mJ/cm$^2$, it is more preferably 10 to 150 mJ/cm$^2$, and it is most preferably 10 to 100 mJ/cm$^2$. Moreover, in the case the color filter of the invention is for a solid image pickup element, among the above-mentioned range, it is preferably 30 to 1,500 mJ/cm$^2$, it is more preferably 50 to 1,000 mJ/cm$^2$, and it is most preferably 80 to 500 mJ/cm$^2$.

<Developing Step>

Then, by carrying out the alkaline developing process (developing step), only the portion with the light unirradiated portion eluted to the alkaline aqueous solution for photo setting by the above-mentioned exposure remains. It may be carried out by forming a patterned coating film with each color (3 or 4 colors) by development with a developing solution. As the developing solution, an organic alkaline developing solution without the risk of damaging a base circuit is preferable. The developing temperature is in general 20° C. to 30° C., and the developing time is 20 to 90 seconds.

Examples of the alkaline agent to be used as the developing solution include organic alkaline compounds such as ammonium water, ethyl amine, diethyl amine, dimethyl ethanol amine, tetramethyl ammonium hydroxide, tetraethyl ammonium hydroxide, choline, pyrrole, pyperidine and 1,8-diazabicyclo-[5,4,0]-7-undecen, and inorganic compounds such as sodium hydroxide, potassium hydroxide, sodium hydrogen carbonate and potassium hydrogen carbonate. An alkaline aqueous solution obtained by diluting these alkaline agents in pure water so as to have the concentration of 0.001% by mass to 10% by mass, preferably 0.01% by mass to 1% by mass may preferably be used. In the case of using a developing solution made of such an alkaline aqueous solution, it is in general washed (rinsed) with pure water after the development.

Then, it is dried after washing for removing the excessive developing solution. The manufacturing method of the invention may if necessary include a curing step of curing the formed colored pattern by heating (post-baking) and/or exposure after carrying out the colored layer forming step, the exposing step and the developing step as mentioned above.

Post-baking is heat treatment after development for completing curing, and heat curing treatment at 100° C. to 240° C. is usually performed. When a substrate is a glass substrate or a silicon substrate, 200° C. to 240° C. is preferable in the above temperature range.

This post-baking treatment can be performed continuously or in a batch manner using a heating means such as a hot plate, a convection oven (hot air circulating dryer), and a high frequency heating machine so that the coated film after development is placed under the above condition.

By repeating the above-explained colored layer forming step, exposing step and developing step (furthermore, if necessary, curing step) for the desired number of the hues, a color filter having the desired hues may be manufactured.

As regards the application of the curable composition of the invention, this has principally been described with respect to application to the pixels of a color filter; however, it may obviously also be applied to the black matrix provided between the pixels of a color filter. The black matrix may be formed in the same manner as in the above-mentioned method for manufacturing the pixels by pattern exposure, alkaline development and, in addition thereafter, post-baking to promote curing of the film, except that a coloring agent with a black pigment such as carbon black or titanium black added thereto is used for the curable composition of the invention.

Since the color filter of the invention is manufactured using the curable composition of the invention with the excellent exposure sensitivity, the cured composition at the exposed portion has the excellent adhesion property to the substrate and development resistance, the formed colored pattern has the high adhesion property to the supporting member substrate, and furthermore, the pattern providing a desired cross-sectional shape has the high resolution.

Moreover, a solid image pickup element of the invention includes a color filter of the invention manufactured by the above-mentioned method for manufacturing a color filter of the invention.

Therefore, specifically, the color filter of the invention may be used preferably for a solid image pickup element such as a liquid crystal display device and a CCD, in particular, it may be used preferably for the high resolution CCD element or CMOS with more than 1,000,000 pixels. The color filter of the invention may be used as a color filter to be disposed between a light receiving part of each pixel including a CCD element and a micro lens for the light focus.

EXAMPLES

Hereafter, the invention will be explained further in detail with reference to the examples, however, the invention is not limited thereto.

Synthesis Example 1

<Synthesis of the Compound (i-1)>

58.6 g of 2-hydroxy ethyl methacrylate was placed in a 500 ml three-necked flask and 250 ml of acetone was added thereto so as to be agitated. After adding 39.2 g of pyridine and 0.1 g of p-methoxy phenol, it was cooled down in ice bath with icy water. After having the liquid mixture temperature of 5° C. or less, 114.9 g of 2-bromo isobutanic acid bromide was dropped thereto over 3 hours with a dropping funnel. After finishing the dropping operation, it was agitated further for 3 hours with the ice bath removed. After pouring the reaction mixture solution in 750 ml of water, it was agitated for 1 hour. The water mixture solution was extracted 3 times with 500 ml of ethyl acetate using a liquid separation funnel. The organic layer was washed with 500 ml of 1M hydrochrolic acid, 500 ml of saturated sodium hydrogen carbonate solution and 500 ml of saturated saline solution successively. After adding 100 g of magnesium sulfate to the organic layer, carrying out dehydration drying, it was filtrated. By the vacuum elimination of the solvent, 120.3 g of the residue was obtained.

The obtained residue was confirmed to be the compound (i-1) from the $^1$H-NMR, IR, and mass analysis spectrum. Moreover, its purity was 95% from the HPLC.

(1) Synthesis of the resin (I)

86 g of 1-methyl-2-pyrolidone placed in a 1,000 ml three-necked flask was heated to 90° C. in the nitrogen air flow. A solution of 55 g of the compound (i-1), 47 g of the example compound M-14MA, 13 g of methacrylic acid, 8.2 g of 2,2'-azobis(2-methyl propionate) (V-601, manufactured by Wako Pure Chemical Industries, Ltd.) and 86 g of 1-methyl-2-pyrolidone was dropped over 2 hours. After finishing the dropping operation, it was agitated for further 2 hours. After cooling down the reaction solution to the room temperature, it was poured into 7 L of water for precipitating the polymer compound. By filtrating the precipitated polymer compound, washing with water and drying the same, 110 g of the polymer compound was obtained.

The weight-average molecular weight of the obtained polymer compound was measured by the gel permeation chromatography method (GPC) with polystyrene used as the reference substance, and it was 13,100. Moreover, the acid value was measured by titration so that it was found to be 1.25 meq/g (calculation value 1.30 meq/g), and thus it was confirmed that polymerization was carried out normally.

110 g of the obtained polymer compound, 0.1 g of p-methoxy phenol and 470 g of 1-methyl-2-pyrolidone were placed in a 1,000 ml three-necked flask so as to be cooled down in ice bath with icy water. After having the liquid mixture temperature of 5° C. or less, 100 g of 1,8-diazabicyclo[5.4.0]-7-undecene (DBU) was dropped thereto over 1 hour using a dropping funnel. After finishing the dropping operation, it was agitated for further 8 hours with the ice bath removed. After adding concentrated hydrochloric acid to the reaction solution so as to have pH 7, it was poured into 7 L of water for precipitating the resin (I) of the polymer compound. By filtrating the precipitated polymer compound, washing with water and drying the same, 95 g of the polymer compound was obtained.

According to the $^1$H-NMR measurement of the obtained polymer compound, it was confirmed that 100% of the side chain group derived from the compound (i-1) was converted to the ethylene methacrylate group. Moreover, as a result of the measurement of the weight-average molecular weight by the gel permeation chromatography method (GPC) with polystyrene used as the reference substance, it was 12,100. Furthermore, the acid value was measured by titration so that it was found to be 1.45 meq/g (calculation value 1.51 meq/g).

Example 1

[A1. Preparation of a Curable Composition]

Here, an example of preparation of a curable composition containing a pigment for forming a color filter for the liquid crystal display device application will be explained.

A1-1. Preparation of a Pigment Dispersion

Preparation of a Pigment Dispersion

A pigment dispersion (P1) was prepared by mixing and dispersing a liquid mixture of 40 parts by mass (average particle size 61 nm) of a 30/70 (mass ratio) mixture of C. I. Pigment Green 36 and C. I. Pigment Yellow 219 as a pigment, 50 parts by mass (about 22.6 parts by mass based on the solid component) of BYK2001 manufactured by (Disperbyk: Bic Chemie (BYK) Corp., solid component concentration 45.1% by mass) as a dispersing agent, 5 parts by mass of the above-mentioned resin (I) in the invention and 110 parts by mass of 3-ethoxy ethyl propionate as a solvent for 15 hours with a bead mill.

The average particle size of the pigment was measured with the dynamic light scattering method for the pigment dispersion (P1) using Microtrac Nanotrac UPA=EX150 (manufactured by Nikkisou Co., Ltd.) without further diluting P1, and it was 32 nm.

A1-2. Preparation of a Curable Composition (Coating Solution)

A curable composition solution was prepared by agitating and mixing while using the above-mentioned pigment dispersion P1 with the dispersion process so as to have the following composition ratio.

| | |
|---|---|
| Coloring agent (D) (above-mentioned pigment dispersion (P1)) | 600 parts by mass |
| Photo polymerization initiator (B) (2,2'-bis(2-chlorophenyl)-4,4',5,5'-tetraphenyl-1,2'-biimidazol) | 30 parts by mass |
| (C) pentaerythritol tetraacrylate | 50 parts by mass |
| (E) Alkaline soluble resin (benzyl methacrylate/methacrylic acid/hydroxyl ethyl methacrylate copolymer, mol ratio: 80/10/10, Mw: 10,000) | 5 parts by weight |
| Solvent: PGMEA | 900 parts by mass |
| Substrate adhesion agent (3-methacryloxy propyl trimethoxy silane) | 1 part by weight |
| (F) Sensitizing agent (following compound α) | 15 parts by weight |
| (G) Cosensitizing agent (2-mercapto benzoimidazol) | 15 parts by mass |

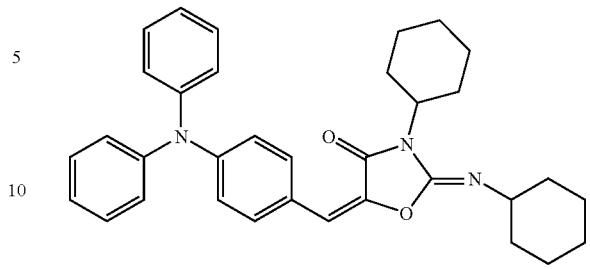

Formula α

[A2. Production of a Color Filter]

A2-1. Formation of a Curable Composition Layer

A curable composition coating film (curable composition layer) was formed by applying a curable composition containing the above-mentioned pigment as a resist solution by slit coating with the following conditions onto a 550 mm×650 mm glass substrate, leaving as it is for 10 minutes, and providing vacuum drying and prebaking (100° C. for 80 seconds).

(Slit Coating Conditions)

Gap of the opening part at the coating head top end: 50 μm

Coating speed: 100 mm/second

Clearance between the substrate and the coating head: 150 μm

Dry film thickness: 1.75 μm

Coating temperature: 23° C.

A2-2. Exposure, Development

Thereafter, the curable composition coating film was exposed in a pattern using a 20 μm line width photo mask for a test using a 2.5 kW ultra high pressure mercury lamp. After the exposure, the entire surface of the coating film was covered with 10% aqueous solution of an organic developing solution (trade name: CD, manufactured by Fuji Film Electronics Materials Corp.) and it was left still for 60 seconds.

A2-3. Heat Treatment

After leaving still, the developing solution was washed out by jetting pure water like a shower so that the coating film with the exposing (photo setting) process and the developing process applied was heated in a 220° C. oven for 1 hour (post-baking). Thereby, a color filter with a curable composition coating film (colored layer) formed on a glass substrate was obtained.

[A3. Performance Evaluation]

The storage stability of the coating solution made of the curable composition prepared above, and the exposure sensitivity, the substrate adhesion property, the developing property and the pattern cross-sectional shape of the curable composition coating film (colored layer) formed on a glass substrate using the curable composition were evaluated as follows. The results are shown in the table 1.

A3-1. Storage Stability of the Curable Composition

After storing the curable composition (coating solution) prepared as mentioned above for 1 month at the room temperature, the viscosity of the solution was measured so as to be evaluated according to the following criteria.

—Evaluation Criteria—

A: No viscosity rise

B: Viscosity rise of 5% or more and less than 10%

C: Viscosity rise of 10% or more

A3-2. Exposure Sensitivity of the Curable Composition Coating Film (Colored Layer)

The curable composition coating film was exposed with the exposing amount changed to various exposing amounts of 10 to 100 mJ/cm² for evaluating the exposing amount to have the pattern line width after the post-baking of 20 µm as the exposure sensitivity. A smaller exposure sensitivity value represents higher sensitivity.

A3-3. Developability, Pattern Cross-Sectional Shape, Substrate Adhesion Property By observing the substrate surface after post-baking and its cross-sectional shape with the optical microscope and the SEM photography observation, the developing property, pattern cross-sectional shape and substrate adhesion property were evaluated. Details of the evaluation method and the evaluation criteria were as follows.

<Developability>

Existence of the residue in the region without the light irradiation (unexposed part) in the exposing step was observed for evaluating the developability.

—Evaluation Criteria—

A: No residue was confirmed in the unexposed part

B: Residue was confirmed slightly in the unexposed part to the degree not to cause a problem in the practical use C: Residue was confirmed remarkably in the unexposed part.

<Pattern Cross-Sectional Shape>

The cross-sectional shape of the formed pattern was observed. The pattern cross-sectional shape is most preferably forward tapered, and next to that, rectangular is preferable. An inverse tapered shape is not preferable.

<Substrate Adhesion Property>

The substrate adhesion property was evaluated according to the observation of whether or not the pattern is lacked. The evaluation criteria were as follows.

—Evaluation Criteria—

A: Pattern lacking was not at all observed.

B: Pattern lacking was scarcely observed, however a partial lacking was observed.

C: Pattern lacking was remarkably observed.

Comparative Example 1

A color filter was produced in the same manner as in the example 1 except that the resin (I) was not used in the curable composition prepared in the example 1 for the same evaluation as in the example 1. The results are shown in the table 2.

Examples 2 to 10

Color filters were produced in the same manner as in the example 1 except that the resins shown in the table 2 were used instead of the resin (I) in the curable composition prepared in the example 1 for the same evaluation as in the example 1. The results are shown in the table 2.

Example 11, Comparative Example 2

Color filters were produced in the same manner as in the example 1 except that the following resins (II) and (III) synthesized in the same manner as in the resin (I) were used instead of the resin (I) in the curable composition prepared in the example 1 for the same evaluation as in the example 1. The dipole moment of the monomer a used for the resin (II) was calculated to be 2.48. Moreover, the dipole moment of the n-butyl acrylate used for the resin (III) was calculated to be 1.58. The results are shown in the table 2.

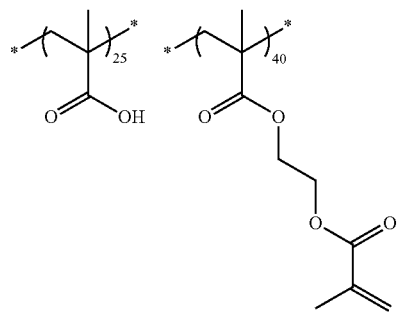

Resin (II)

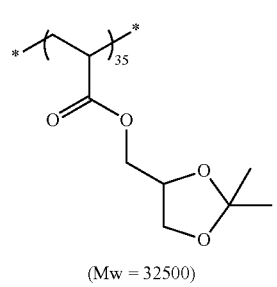

(Mw = 32500)

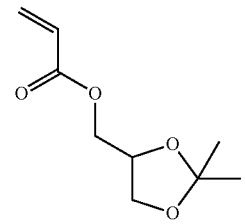

Monomer a

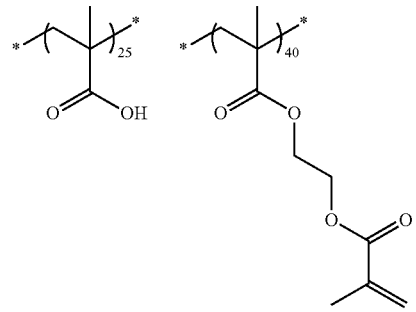

Resin (III)

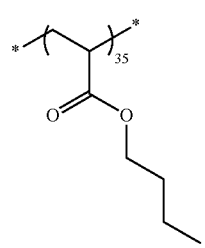

Mw 18,000

TABLE 2

| | Resin | Dipole moment of the specific monomer (Debye) | Storage stability | Exposure sensitivity (mJ/cm$^2$) | Developability | Substrate adhesion property | Pattern cross-sectional shape |
|---|---|---|---|---|---|---|---|
| Example 1 | Resin (I) | 6.5 | A | 35 | A | A | Forward tapered |
| Comparative example 1 | None | — | B | 75 | C | C | Inverse tapered |
| Example 2 | B-2 | 3.70 | A | 40 | A | A | Forward tapered |
| Example 3 | B-6 | 2.53 | A | 60 | A | A | Forward tapered |
| Example 4 | B-15 | 3.39 | A | 35 | A | B | Forward tapered |
| Example 5 | B-20 | 3.28 | A | 35 | A | A | Forward tapered |
| Example 6 | B-23 | 3.14 | A | 50 | A | A | Forward tapered |
| Example 7 | B-24 | 3.7 | A | 40 | A | A | Forward tapered |
| Example 8 | B-25 | 3.39 | A | 65 | A | A | Forward tapered |
| Example 9 | B-28 | 4.14 | A | 65 | A | A | Forward tapered |
| Example 10 | B-29 | 2.53 | A | 65 | A | A | Forward tapered |
| Example 11 | Resin (II) | 2.48 | B | 75 | A | B | Rectangular |
| Comparative example 2 | Resin (III) | 1.58 | C | 75 | C | C | Inverse tapered |

From the results in Table 2, it was learned that the curable compositions of the examples containing the resins of the invention have the excellent storage stability in the solution state. Moreover, it was learned that a color filter having higher exposure sensitivity and superior developability with respect to those of the comparative examples without use of the resins of the invention and the excellent substrate adhesion property and pattern cross-sectional shape was obtained in the case of forming a colored pattern on a supporting member using the curable compositions.

Example 12

Hereafter, examples of preparing a curable composition containing a coloring agent (pigment) for formation of a color filter for the application for the solid image pickup element will be explained.

[B 1. Preparation of a Resist Solution]

A resist solution was prepared by mixing and dissolving the components of the following composition.

<Composition of the Resist Solution>
Propylene glycol monomethyl ether acetate 19.20 parts by mass (PGMEA: solvent)
Ethyl lactate 36.67 parts by mass
(E) Resin (40% PGMEA solution of benzyl methacrylate/mathacrylic acid/methacrylic acid-2-hydroxy ethyl copolymer (mole ratio=60/22/18)) 30.51 parts by mass
(C) Ethylenically unsaturated double bond containing compound (dipentaerythritol hexaacrylate) 12.20 parts by mass
Polymerization inhibiting agent (p-methoxy phenol) 0.0061 part by mass
Fluorine-based surfactant (F-475, manufactured by Dainippon Ink Chemical Industry, Corp.) 0.83 part by mass
Photo polymerization initiator (B) (trihalomethyl triadine-based photopolymerization initiator) 0.586 part by mass (TAZ-107, manufactured by Midori Kagaku Co., Ltd.)

[B2. Production of a Silicon Substrate with a Base Coating Layer]

Heat treatment was applied to a 6 inch silicon wafer in an oven at 200° C. for 30 minutes. Then, the above-mentioned resist solution was applied onto the silicon wafer so as to have a dry film thickness of 1.5 µm, and furthermore, it was heated and dried in the 220° C. oven for 1 hour for forming a base coating layer so as to obtain a silicon wafer substrate with a base coating layer.

[B3. Preparation of a Pigment Dispersion]

A pigment dispersion (P2) was prepared by mixing and dispersing a liquid mixture of 40 parts by mass (average particle size 65 nm) of a 30/70 (mass ratio) mixture of C. I. Pigment Green 36 and C. I. Pigment Yellow 150 as a pigment, 50 parts by mass (about 22.6 parts by mass based on the solid component) of BYK2001 manufactured by (Disperbyk: BYK Chemie (BYK) Corp., solid component concentration 45.1% by mass) as a dispersing agent, 10 parts by mass of the resin (I) in the invention and 110 parts by mass of propylene glycol monomethyl ether as a solvent for 15 hours with a bead mill.

The average particle size of the pigment was measured with the dynamic light scattering method for the pigment dispersion (P2) in the same manner as in the example 1, and it was 32 nm.

[B4. Preparation of a Curable Composition (Coating Solution)]

A curable composition solution was prepared by agitating and mixing while using the above-mentioned pigment dispersion P2 with the dispersion process so as to have the following composition ratio.

Coloring agent (D) (pigment dispersion (P2)) 600 parts by mass
Photo polymerization initiator (B) (oxime-based photopolymerization initiator) 30 parts by mass (CGI-124, manufactured by Chiba Specialty Chemicals, Corp.)
(C-1) TO-1382 (manufactured by Toa Gosei Corp.) 25 parts by mass
(C-2) dipentaerythritol hexaacrylate 30 parts by mass
Solvent: (PGMEA) 900 parts by mass
Substrate adhesion agent (3-methacryloxy propyl trimethoxy silane) 1 part by mass

[B5. Production and Evaluation of a Color Filter by the Curable Composition]

<Pattern Formation and Sensitivity Evaluation>

A colored layer (coating film) was formed by applying the curable composition prepared as mentioned above onto the base coating layer of the silicon wafer with a base coating layer obtained in the above-mentioned process B2. Then, heat treatment (prebaking) was carried out using a 100° C. hot plate for 120 seconds so as to have the dry film thickness of the coating film of 0.7 µm.

Then, using a i line stepper exposing device FPA-3000i5+ (manufactured by Canon Inc.), it was exposed with various exposing amounts of 50 to 1,200 mJ/cm² through an Island pattern mask having a 2 gm square pattern by a 365 nm wavelength.

Thereafter, with the silicon wafer substrate with the irradiated coating film formed placed on a horizontal rotatable table of a spin-shower developer (DW-30 type, manufactured by Chemitronics Corp.), paddle development was carried out at 23° C. for 60 seconds using CD-2000 (manufactured by Fuji Film Electronics Materials, Corp.) for forming a colored pattern on the silicon wafer substrate.

While rotating the silicon wafer substrate by the 50 rpm rotational frequency by a rotating device with the silicon wafer with the colored pattern formed fixed on the above-mentioned horizontal rotatable table by a vacuum chuck system, pure water was supplied from a jet nozzle above the rotational center like a shower for carrying out the rinsing process, and then spray drying was carried out.

Thereafter, the size of the colored pattern was measured using a length measuring SEM "S-9260A" (manufactured by Hitachi High Technologies Corp.). The exposing amount to have the 2 μm pattern line width was evaluated as the exposure sensitivity. A smaller exposure sensitivity value represents higher sensitivity. The measurement results are shown in the following table 2.

<Developability>

Existence of the residue in the region without the light irradiation (unexposed part) in the exposing step was observed for evaluating the developability.

—Evaluation Criteria—
A: No residue was confirmed in the unexposed part
B: Residue was confirmed slightly in the unexposed part to the degree not to cause a problem in the practical use
C: Residue was confirmed remarkably in the unexposed part.

<Pattern Forming Property>

The cross-sectional shape of the formed pattern was observed. The pattern cross-sectional shape is preferably rectangular, and an inverse tapered shape is not preferable.

<Substrate Adhesion Property>

For the substrate adhesion property, whether or not the pattern is lacked was observed. These evaluation items were evaluated according to the following evaluation criteria.

—Evaluation Criteria—
A: Pattern lacking was not at all observed.
B: Pattern lacking was scarcely observed, however a partial lacking was observed.
C: Pattern lacking was remarkably observed.

<Storage Stability of the Curable Composition>

After storing the curable composition (coating solution) prepared in the above-mentioned step B4 for 1 month at the room temperature, the viscosity of the solution was measured so as to be evaluated according to the following criteria.

—Evaluation Criteria—
A: No viscosity rise
B: Viscosity rise of 5% or more and less than 10%
C: Viscosity rise of 10% or more <Color Irregularity>

The color irregularity was evaluated by analyzing the luminance distribution by the following method for finding out the ratio of the pixels with the deviation from the average within ±5% occupying in the total number of the pixels. The evaluation criteria are as follows.

The method for measuring the luminance distribution will be explained. First, the curable composition was applied onto the base coating layer of the glass plate with a base coating layer obtained in the same method as the above-mentioned step B2 for forming a colored layer (coating film). Heat treatment (prebaking) was carried out using 100° C. hot plate for 120 seconds so as to have the dry film thickness of the coating film of 0.7μ. The image photographed with a microscope MX-50 (manufactured by Olympus Corp.) was analyzed for the luminance distribution of the applied glass plate.

—Evaluation Criteria—
A: Pixels with the deviation from the average within ±5% accounting for 99% or more of the total number of the pixels
B: Pixels with the deviation from the average within ±5% accounting for 95% or more and less than 99% of the total number of the pixels
C: Pixels with the deviation from the average within ±5% accounting for less than 95% of the total number of the pixels Comparative Example 3

A color filter with a colored pattern formed was produced in the same manner as in the example 12 except that the resin (I) was not used in the curable composition prepared in the example 12 for the same evaluation as in the example 12. The results are shown in the table 3.

Examples 13 to 22, Comparative Example 4

Color filters were produced in the same manner as in the example 12 except that the resins shown in the table 3 were used instead of the resin (I) in the curable composition prepared in the example 12 for the same evaluation as in the example 12. The results are shown in the table 3.

TABLE 3

| | Resin | Dipole moment of the specific monomer (Debye) | Storage stability | Exposure sensitivity (mJ/cm²) | Developability | Substrate adhesion property | Pattern cross-sectional shape | Color irregularity |
|---|---|---|---|---|---|---|---|---|
| Example 12 | Resin (I) | 6.50 | A | 150 | A | A | Rectangular | A |
| Comparative example 3 | None | — | B | 450 | C | C | Inverse tapered | C |
| Example 13 | B-4 | 4.32 | A | 200 | A | A | Rectangular | A |
| Example 14 | B-9 | 6.50 | A | 200 | A | A | Rectangular | A |
| Example 15 | B-14 | 4.14 | A | 300 | A | B | Rectangular | A |
| Example 16 | B-20 | 3.28 | A | 200 | A | A | Rectangular | A |
| Example 17 | B-23 | 3.14 | A | 300 | A | A | Rectangular | A |
| Example 18 | B-24 | 3.70 | A | 250 | A | A | Rectangular | A |
| Example 19 | B-25 | 3.39 | A | 300 | A | A | Rectangular | A |
| Example 20 | B-28 | 4.14 | A | 300 | A | A | Rectangular | A |
| Example 21 | B-29 | 2.53 | A | 300 | A | A | Rectangular | A |
| Example 22 | Resin (II) | 2.48 | B | 450 | A | B | Inverse tapered | C |

TABLE 3-continued

|  | Resin | Dipole moment of the specific monomer (Debye) | Storage stability | Exposure sensitivity (mJ/cm$^2$) | Developability | Substrate adhesion property | Pattern cross-sectional shape | Color irregularity |
|---|---|---|---|---|---|---|---|---|
| Comparative example 4 | Resin (III) | 1.58 | C | 450 | C | C | Inverse tapered | C |

From the results in Table 3, it is evident that the curable compositions (pigment based) of the examples containing the resins of the invention used for formation of a color filter for a solid image pickup element application, have excellent storage stability in a solution state. Moreover, it is evident that when forming a colored pattern on a supporting member using the curable composition, a color filter having higher exposure sensitivity and superior developability as compared to those of the comparative examples that do not use the resins of the invention, and also having excellent substrate adhesiveness, pattern cross-sectional shape, and color irregularity, was obtained.

From these results, it is evident that the curable compositions of the Examples achieve an excellent pattern forming property both when producing a color filter for a solid image pickup element application and when producing a color filter for a liquid crystal display device application.

Example 23

Hereafter, examples of preparing a curable composition containing a coloring agent (dye) for formation of a color filter for the application for the solid image pickup element will be explained.

[C1. Preparation of a Resist Solution and Production of a Silicon Substrate with a Base Coating Layer]

A silicon substrate with a base coating layer was produced in the same manner as in [B1. Preparation of a resist solution] and [B2. Production of a silicon substrate with a base coating layer] in the example 12.

[C2. Preparation of a Curable Composition (Coating Solution)]

A colored photosensitive resin composition as prepared by mixing and dissolving a compound of the following composition Cyclohexanone (solvent) 80 parts by mass
(D) Valifast Yellow 1101 (dye) 6.0 parts by mass
(D) Acid Red 57 (dye) 6.0 parts by mass
(C) Dipentaerythritol hexaacrylate 2.5 parts by mass
(B) Oxime-based photopolymerization initiator 2.0 parts by mass
(CGI-124, manufactured by Ciba Specialty Chemicals Corp.)
Resin (I) in the invention 1.5 parts by mass

[C3. Production and Evaluation of a Color Filter by the Curable Composition]

A color filter was produced and evaluated in the same manner as in [B5. Production and evaluation of a color filter by the curable composition] mentioned above. The results are shown in the table 4.

Comparative Example 5

A color filter with a colored pattern formed was produced in the same manner as in the example 23 except that the resin (I) was changed to pentaerythritol triacrylate in the curable composition prepared in the example 23 for the same evaluation as in the example 23. The results are shown in the table 4.

Examples 24 to 33, Comparative Example 6

Color filters were produced in the same manner as in the example 23 except that the resins shown in the table 4 were used instead of the resin (I) in the curable composition prepared in the example 23 for the same evaluation as in the example 23. The results are shown in the table 4.

TABLE 4

|  | Resin | Dipole moment of the specific monomer (Debye) | Storage stability | Exposure sensitivity (mJ/cm$^2$) | Developability | Substrate adhesion property | Pattern cross-sectional shape | Color irregularity |
|---|---|---|---|---|---|---|---|---|
| Example 23 | Resin (I) | 6.50 | A | 550 | A | A | Rectangular | A |
| Comparative example 5 | None | — | A | 900 | C | C | Inverse tapered | C |
| Example 24 | B-6 | 2.53 | A | 650 | A | A | Rectangular | A |
| Example 25 | B-16 | 3.70 | A | 550 | B | A | Rectangular | A |
| Example 26 | B-20 | 3.28 | B | 500 | A | B | Rectangular | A |
| Example 27 | B-22 | 3.14 | A | 550 | A | A | Rectangular | A |
| Example 28 | B-23 | 3.14 | A | 600 | A | A | Rectangular | A |
| Example 29 | B-24 | 3.70 | A | 550 | A | A | Rectangular | A |
| Example 30 | B-25 | 3.39 | A | 700 | A | A | Rectangular | A |
| Example 31 | B-28 | 4.14 | A | 700 | A | A | Rectangular | A |
| Example 32 | B-29 | 2.53 | A | 700 | A | A | Rectangular | A |
| Example 33 | Resin (II) | 2.48 | B | 800 | B | B | Inverse tapered | C |
| Comparative example 6 | Resin (III) | 1.58 | C | 900 | C | C | Inverse tapered | C |

From the results in Table 4, it was learned that the curable compositions (dye based) of the examples containing the resins of an aspect of the invention used for formation of a color filter for the solid image pickup element application have the excellent storage stability in the solution state.

Moreover, it was learned that the a color filter having high exposure sensitivity and superior developability, and the excellent substrate adhesion property, and pattern cross-sectional shape was obtained in the examples compared with the comprataive examples from the results of examples of forming a colored pattern on a supporting member using the curable compositions.

Furthermore, from these results, it was learned that the curable compositions of the examples realize the excellent pattern formation also in the case of producing a color filter for the solid image pickup element application as in the case of producing a color filter for the liquid crystal display device application.

Some embodiments of the present invention will be shown hereafter.

<1> A curable composition containing a resin, a compound containing an ethylenically unsaturated double bond and a photopolymerization initiator, wherein the resin is one manufactured by polymerizing at least a monomer of 2.0 or more dipole moment as the copolymerization component.

<2> The curable composition of <1>, wherein the above-mentioned monomer is a monomer having at least 2.5 or more dipole moment.

<3> The curable composition of <1>, wherein the above-mentioned resin has an ethylenically unsaturated double bond in the side chain, obtained by polymerizing at least a monomer of 2.5 or more dipole moment as the copolymerization component.

<4> The curable composition of any of <1> to <3>, wherein the above-mentioned monomer of 2.0 or more dipole moment has at least one group selected from the group consisting of an ether group, a cyano group, an ester phosphate group, a lactone group, a urethane group, an ester carbonate group and an acetal group.

<5> The curable composition of any of <1> to <4> further containing a coloring agent.

<6> The curable composition of any of <1> to <5> further containing a sensitizing agent.

<7> A color filter having a colored pattern formed with the curable composition of <5> or <6>.

<8> A manufacturing method for a color filter comprising a colored layer forming a colored layer made of the curable composition by applying the curable composition of <5> or <6>, exposing the above-mentioned colored layer via a mask, of exposing the colored layer after the exposure via a mask, and forming a colored pattern by developing the colored layer after the exposure.

<9> A solid image pickup element comprising a color filter manufactured by the manufacturing method for a color filter of <8>.

What is claimed is:

1. A curable composition containing a resin, a compound containing an ethylenically unsaturated double bond and a photopolymerization initiator, wherein the resin is manufactured by polymerizing at least:
   a first monomer having a dipole moment of 2.0 or more and having at least one group selected from the group consisting of a cyano group, an ester phosphate group, a lactone group, a urethane group, an ester carbonate group and an acetal group as a copolymerization component, and
   a second monomer containing an alkaline soluble group as a copolymerization component, the alkaline soluble group being selected from the group consisting of a carboxyl group, a sulfo group, a sulfone amide group, a phosphoric acid group and a phenol-type hydroxyl group.

2. The curable composition of claim 1, wherein the first monomer has a dipole moment of 2.5 or more.

3. The curable composition of claim 1, wherein the resin has an ethylenically unsaturated double bond in the side chain, and the first monomer has a dipole moment of 2.5 or more.

4. The curable composition of claim 1, further containing a coloring agent.

5. A color filter having a colored pattern formed with the curable composition of claim 4.

6. A manufacturing method for a color filter comprising: forming a colored layer made of the curable composition by applying the curable composition of claim 4 on a support; exposing the colored layer via a mask, and forming a colored pattern by developing the colored layer after the exposing.

7. A solid image pickup element comprising a color filter manufactured by the manufacturing method for a color filter of claim 6.

8. The curable composition of claim 1, further containing a sensitizing agent.

9. The curable composition of claim 1, wherein the resin has a group represented by the following formulae (1) to (3) in a side chain:

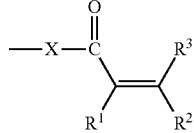

Formula (1)

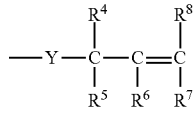

Formula (2)

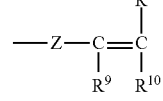

Formula (3)

wherein in the formulae, $R^1$ to $R^{11}$ each independently represents a hydrogen atom or a monovaleic organic group; X and Y each independently represents an oxygen atom, a sulfur atom or —N—$R^{12}$; Z represents an oxygen atom, a sulfur atom, —N—$R^{12}$ or a phenylene group, and $R^{12}$ represents a hydrogen atom or a monovaleic organic group.

10. The curable composition of claim 1, wherein the group selected from the group consisting of a cyano group, an ester phosphate group, a lactone group, a urethane group, an ester carbonate group and an acetal group is a lactone group.

11. The curable composition of claim 1, wherein the alkaline soluble group is a carboxyl group.

12. The curable composition of claim 1, wherein the monomer containing an alkaline soluble group is acrylic acid or a methacrylic acid.

13. The curable composition of claim 1, wherein the photopolymerization initiator is an oxime ester compound.

14. A curable composition containing a resin, a compound containing an ethylenically unsaturated double bond and a photopolymerization initiator, wherein the resin is manufactured by polymerizing at least:
   a first monomer having a dipole moment of 2.0 or more as a copolymerization component, and a second monomer containing an alkaline soluble group as a copolymerization component, the alkaline soluble group being selected from the group consisting of a carboxyl group, a sulfo group, a sulfone amide group, a phosphoric acid group and a phenol-type hydroxyl group, and the first monomer being at least one monomer selected from the group consisting of the following monomers M-1A, M-7A to M-15A, M-1MA, and M-7MA to M-16MA:

M-1A 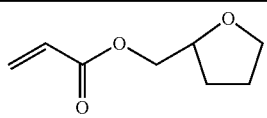

M-7A 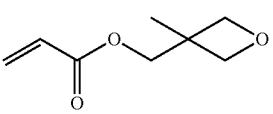

M-8A 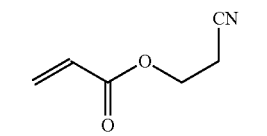

M-9A 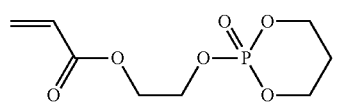

M-10A 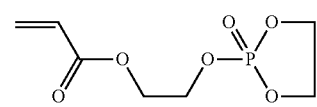

M-11A 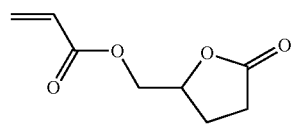

M-12A 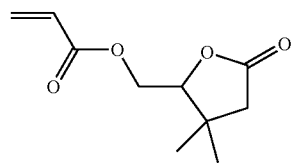

M-13A 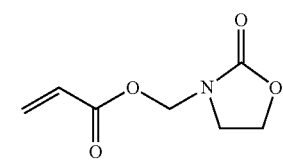

-continued

M-1MA 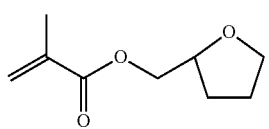

M-7MA 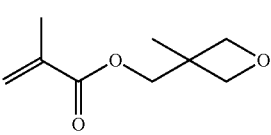

M-8MA 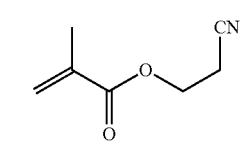

M-9MA 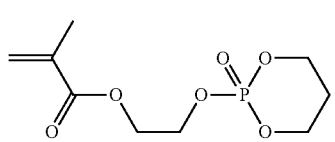 [SMILES: C=C(C)C(=O)OCCOP1(=O)OCCCO1]

M-10MA 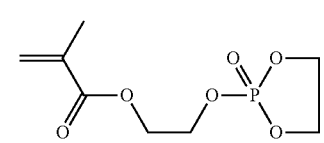

M-11MA 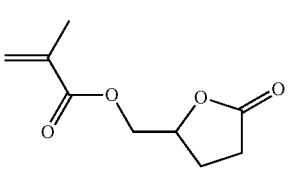

M-12MA 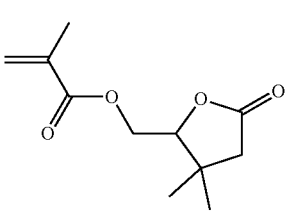

M-13MA 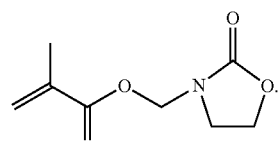

* * * * *